(12) United States Patent
Koshimizu et al.

(10) Patent No.: US 11,114,527 B2
(45) Date of Patent: Sep. 7, 2021

(54) SEMICONDUCTOR DEVICE AND METHOD FOR MANUFACTURING SAME

(71) Applicant: RENESAS ELECTRONICS CORPORATION, Kanagawa (JP)

(72) Inventors: Makoto Koshimizu, Tokyo (JP); Hideki Niwayama, Tokyo (JP); Kazuyuki Umezu, Tokyo (JP); Hiroki Soeda, Tokyo (JP); Atsushi Tachigami, Tokyo (JP); Takeshi Iijima, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 16/815,636

(22) Filed: Mar. 11, 2020

(65) Prior Publication Data

US 2020/0212176 A1    Jul. 2, 2020

Related U.S. Application Data

(63) Continuation of application No. 16/275,469, filed on Feb. 14, 2019, now abandoned, which is a
(Continued)

(51) Int. Cl.
*H01L 29/06* (2006.01)
*H01L 21/762* (2006.01)
(Continued)

(52) U.S. Cl.
CPC .... *H01L 29/0649* (2013.01); *H01L 21/76205* (2013.01); *H01L 21/76224* (2013.01);
(Continued)

(58) Field of Classification Search
CPC ............ H01L 29/7816; H01L 29/7835; H01L 29/66659; H01L 29/4238; H01L 29/41758;
(Continued)

(56) References Cited

U.S. PATENT DOCUMENTS 6,727,547 B1    4/2004  Brisbin et al.
6,914,298 B1 *  7/2005  Hamazawa ......... H01L 29/0878
                                                      257/343
(Continued)

FOREIGN PATENT DOCUMENTS

CN    101740626 A    6/2010
JP    2003-218348 A  7/2003
(Continued)

*Primary Examiner* — David C Spalla
(74) *Attorney, Agent, or Firm* — Foley & Lardner LLP

(57) ABSTRACT

A terrace insulating film (SL) to be overridden by a gate electrode (G) of an nLDMOS device is configured by LOCOS, and a device isolation portion (SS) is configured by STI. Furthermore, on an outermost periphery of an active region where a plurality of nLDMOS devices are formed, a guard ring having the same potential as that of a drain region (D) is provided. And, via this guard ring, the device isolation portion (SS) is formed in a periphery of the active region, thereby not connecting but isolating the terrace insulating film (SL) and the device isolation portion (SS) from each other.

27 Claims, 50 Drawing Sheets

Related U.S. Application Data continuation of application No. 13/805,252, filed as application No. PCT/JP2010/060451 on Jun. 21, 2010, now abandoned.

(51) Int. Cl.

| | | |
|---|---|---|
| *H01L 21/8238* | (2006.01) | |
| *H01L 27/092* | (2006.01) | |
| *H01L 29/423* | (2006.01) | |
| *H01L 29/66* | (2006.01) | |
| *H01L 29/78* | (2006.01) | |
| *H01L 29/08* | (2006.01) | |
| *H01L 29/10* | (2006.01) | |
| *H01L 29/417* | (2006.01) | |
| *H01L 29/45* | (2006.01) | |
| *H01L 29/49* | (2006.01) | |

(52) U.S. Cl.
CPC .......... *H01L 21/82385* (2013.01); *H01L 21/823857* (2013.01); *H01L 21/823878* (2013.01); *H01L 27/0922* (2013.01); *H01L 29/0661* (2013.01); *H01L 29/42368* (2013.01); *H01L 29/66659* (2013.01); *H01L 29/66689* (2013.01); *H01L 29/7816* (2013.01); *H01L 29/7835* (2013.01); *H01L 29/0638* (2013.01); *H01L 29/0653* (2013.01); *H01L 29/0696* (2013.01); *H01L 29/086* (2013.01); *H01L 29/0878* (2013.01); *H01L 29/1083* (2013.01); *H01L 29/41758* (2013.01); *H01L 29/4238* (2013.01); *H01L 29/456* (2013.01); *H01L 29/4933* (2013.01); *H01L 29/665* (2013.01)

(58) Field of Classification Search
CPC ............ H01L 29/0696; H01L 29/0661; H01L 29/0638; H01L 27/0922; H01L 21/76205; H01L 21/76224; H01L 21/82385; H01L 21/823857; H01L 21/823878; H01L 29/0649; H01L 29/42368

See application file for complete search history.

(56) References Cited

U.S. PATENT DOCUMENTS

| | | | |
|---|---|---|---|
| 7,521,747 B2 | 4/2009 | Sakuragi et al. | |
| 7,960,222 B1* | 6/2011 | Kwon | H01L 27/0921 |
| | | | 438/197 |
| 2003/0094708 A1 | 5/2003 | Itou | |
| 2005/0199962 A1 | 9/2005 | Suzuki et al. | |
| 2006/0199344 A1 | 9/2006 | Tanaka | |
| 2007/0278594 A1 | 12/2007 | Takahashi et al. | |
| 2010/0102386 A1* | 4/2010 | You | H01L 29/7816 |
| | | | 257/336 |
| 2010/0102388 A1 | 4/2010 | Levin et al. | |
| 2010/0123196 A1 | 5/2010 | Cho | |
| 2011/0081760 A1 | 4/2011 | Huang | |
| 2011/0127602 A1 | 6/2011 | Mallikarjunaswamy | |
| 2011/0233673 A1 | 9/2011 | Liu et al. | |
| 2013/0234249 A1 | 9/2013 | Zuniga et al. | |
| 2014/0070315 A1* | 3/2014 | Levy | H01L 27/0617 |
| | | | 257/343 |

FOREIGN PATENT DOCUMENTS

| | | |
|---|---|---|
| JP | 2008-182118 A | 8/2008 |
| JP | 2009-164460 A | 7/2009 |
| JP | 2009-239096 A | 10/2009 |
| JP | 2009-302548 A | 12/2009 |
| JP | 2010-118419 A | 5/2010 |

\* cited by examiner

FIG. 1
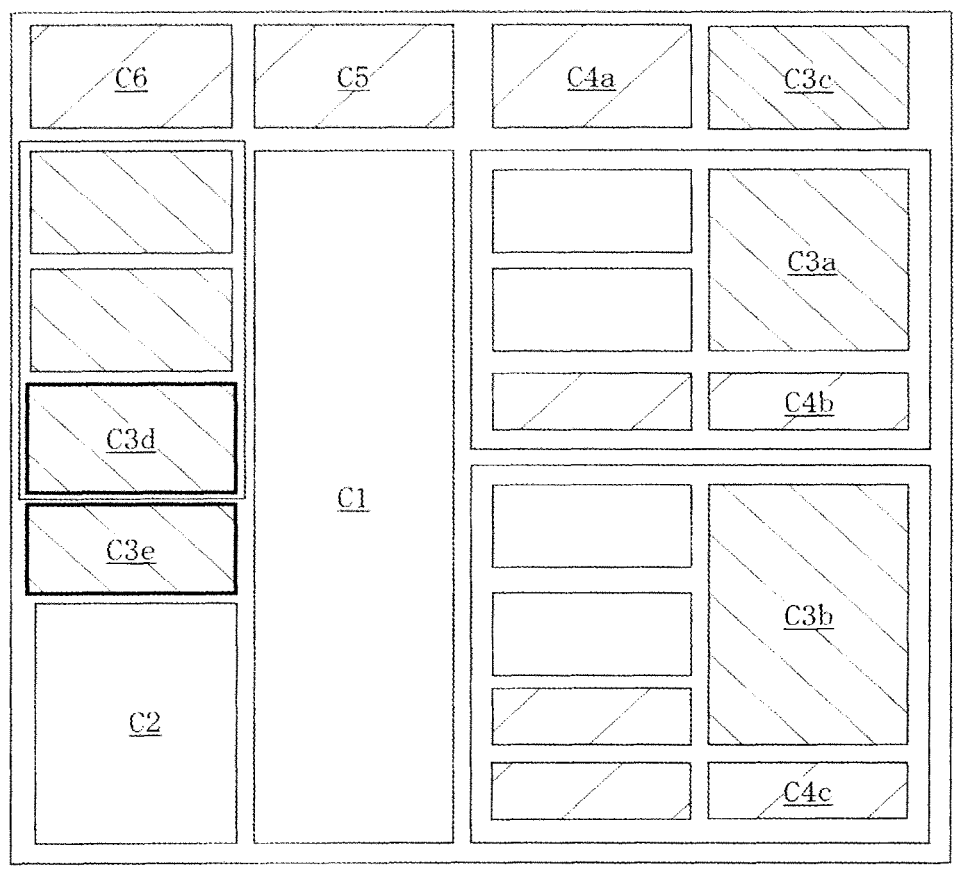
 LOGIC CONTROL CIRCUIT BLOCK
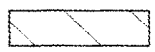 POWER CIRCUIT BLOCK
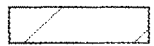 ANALOG CIRCUIT BLOCK

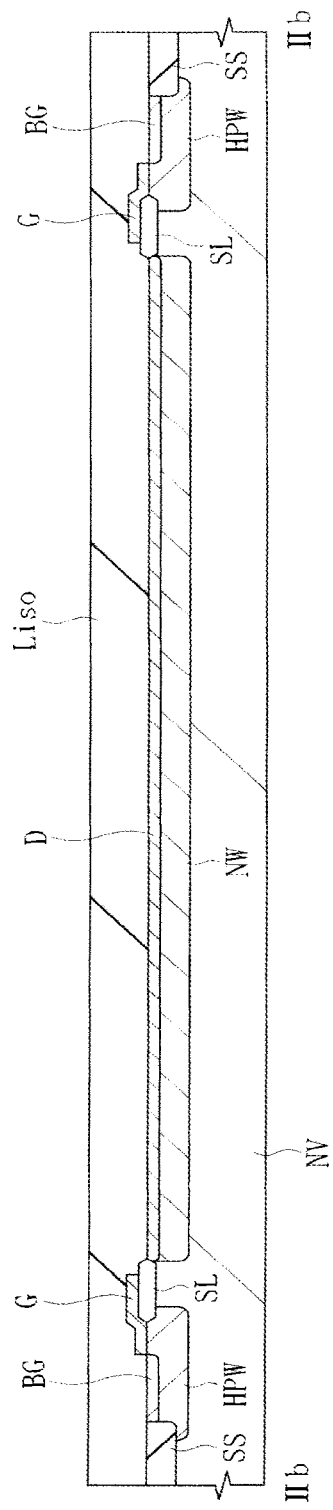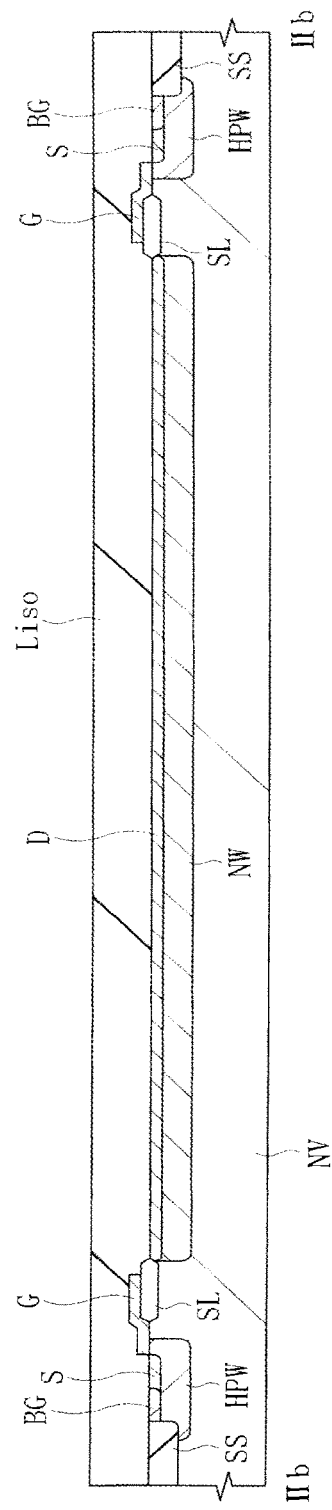

FIG. 51A
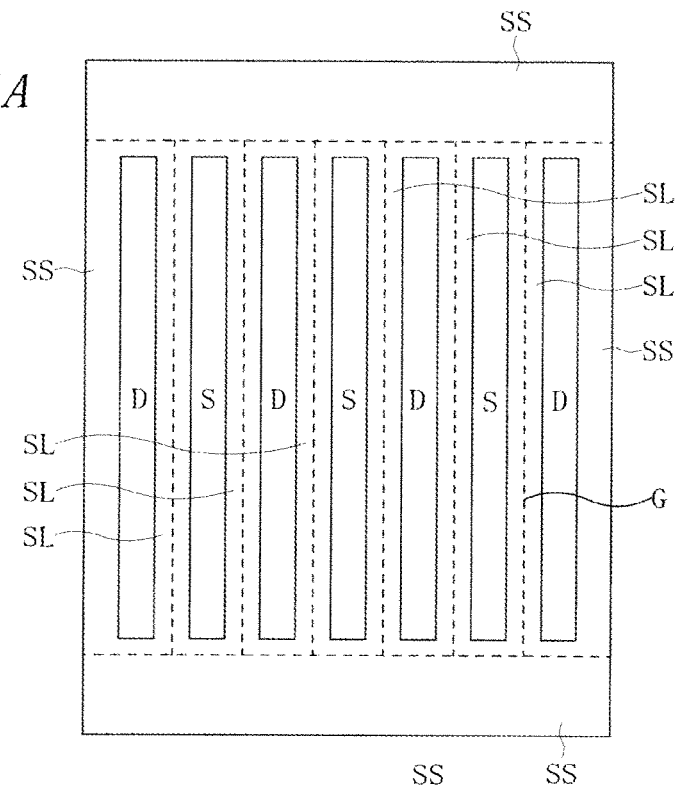
FIG. 51B
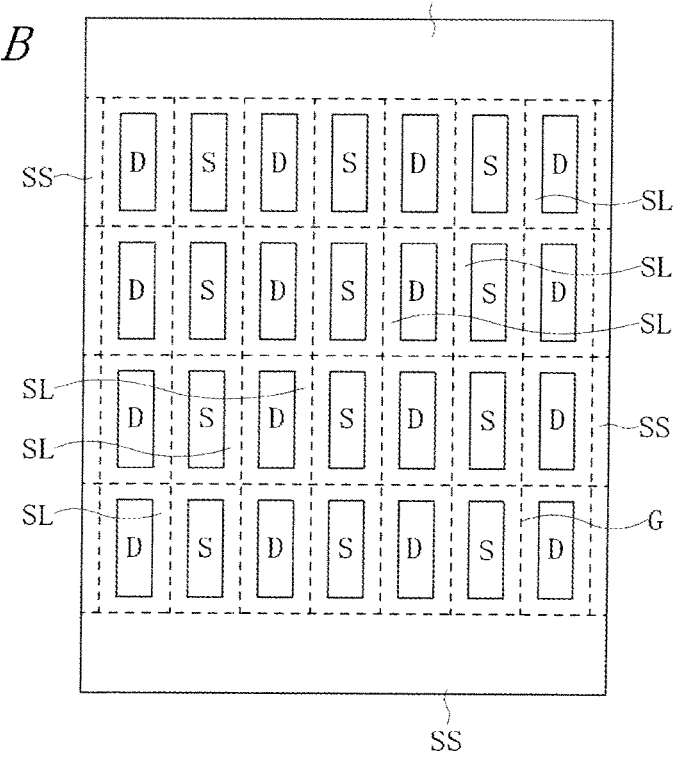
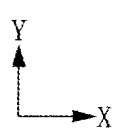

SEMICONDUCTOR DEVICE AND METHOD FOR MANUFACTURING SAME

CROSS REFERENCE TO RELATED APPLICATIONS

This application is a continuation application of U.S. application Ser. No. 16/275,469, filed on Feb. 14, 2019, which is a continuation of application Ser. No. 13/805,252, filed on Dec. 18, 2012, which is the National Stage of Application No. PCT/JP2010/060451 filed on Jun. 21, 2010, the entire contents of all of which are incorporated herein by reference.

TECHNICAL FIELD

The present invention relates to a semiconductor device and technology of manufacturing the semiconductor device. In particular, the present invention relates to technology effectively applied to a semiconductor device having a field effect transistor (a field effect transistor of a lateral structure (a lateral diffused structure, lateral double-diffused structure) (Laterally Diffused Metal Oxide Semiconductor Transistor: hereinafter referred to as an LDMOS device)), capacitive element, diode, or the like, and manufacture of the semiconductor device.

BACKGROUND ART

In an LDMOS device requiring a high-withstand voltage larger than or equal to 20 V, as a means for ensuring a high-withstand voltage between the source and drain, a gate field plate structure is adopted. The gate field plate structure is a structure in which an end of the gate electrode of the LDMOS device overrides a field insulating film. By adopting this structure, an electric field at the time of gate-off can be dispersed to ensure a high-withstand voltage.

For example, Japanese Patent Application Laid-Open Publication No. 2009-302548 (Patent Document 1) discloses a semiconductor device in which a field oxide film for use in device isolation and a field oxide film to be overridden by the gate electrode of an LDMOS device are formed by LOCOS (Local Oxidation of Silicon) and the field oxide film to be overridden by the gate electrode of the LDMOS device has a thickness smaller than the thickness of the field oxide film for use in element isolation.

Also, Japanese Patent Application Laid-Open Publication No. 2008-182118 (Patent Document 2) discloses a semiconductor device in which a recessed LOCOS oxide film is adopted for insulation between adjacent elements in a logic circuit and a LOCOS oxide film is adopted for insulation between the gate electrode and the drain region configuring a MOS transistor element of a lateral type in a power circuit.

PRIOR ART DOCUMENTS

Patent Documents

Patent Document 1: Japanese Patent Application Laid-Open Publication No. 2009-302548
Patent Document 2: Japanese Patent Application Laid-Open Publication No. 2008-182118

DISCLOSURE OF THE INVENTION

Problems to be Solved by the Invention

In a design rule for 0.18 μm or smaller, STI (Shallow Trench Isolation) is adopted for the device isolation portion, where a surface with a height substantially equal to the main surface of the substrate and processing finer than LOCOS can be made. STI is formed by forming a groove (trench) in a main surface of the substrate, and then embedding an insulating film inside the groove.

Thus, the inventors have studied that a field insulating film to be overridden by the gate electrode of the LDMOS device (hereinafter, referred to as a terrace insulating film) is also configured by STI for high integration of a semiconductor device. However, as to semiconductor devices manufactured with the design rules for 0.18 or smaller and having STI applied to both of the device isolation portion and the terrace insulating film, various technical problems are present as described below.

<Problem 1: Increase in On-Resistance>

FIG. 48 illustrates an example of simulation result of an electron current distribution in a linear operation region of an LDMOS device where STI studied by the inventors is adopted to a terrace insulating film prior to the invention of the present application. In the drawing, a reference numeral 100 denotes a silicon (Si) substrate, a reference numeral 101 denotes a terrace insulating film formed by STI, a reference numeral 102 denotes a gate electrode, a reference numeral 103 denotes a gate insulating film, a reference numeral 104 denotes a drain region, and a reference numeral 105 denotes a source region. A cell pitch (a distance between a center part of the source region and a center part of the drain region) is 3.1 μm.

In the LDMOS device in which LOCOS is used for the terrace insulating film, an on-resistance of 14 mΩ·mm$^2$ was obtained. By contrast, in the LDMOS device in which STI is used for the terrace insulating film, an on-resistance was 18 mΩ·mm$^2$, which means that the on-resistance is increased by substantially 30% more than that of the LDMOS device using LOCOS in the terrace insulating film. The reason for this can be considered such that, as illustrated in FIG. 48, the terrace insulating film 101 formed by STI crushes a region where a current flows to narrow a current route. That is, since electrons select a path with low resistance despite the narrowed current route, the current flows in a concentrated manner to an interface between the substrate 100 and the terrace insulating film 101 formed by STI. That is why the on-resistance increases.

<Problem 2: Lowering of On-State Breakdown Voltage>

FIG. 49 illustrates an example of a simulation result of static characteristic waveforms (drain current (Ids)-drain voltage (Vds) characteristics) of LDMOS devices where STI studied by the inventors is adopted to a terrace insulating film prior to the invention of the present application. A solid line represents a static characteristic waveform of an LDMOS device having a cell pitch (a distance between a center part of the source region and a center part of the drain region) of 3.1 μm, and a dotted line represents a static characteristic waveform of an LDMOS device having a cell pitch (a distance between a center part of the source region and a center part of the drain region) of 5 μm. Also, FIG. 50 illustrates another example of a simulation result of a current distribution in a saturated operating region (with a maximum rated voltage of a drain region being 20 V and an actual operating voltage of a gate electrode being 5 V) of the LDMOS device where STI studied by the inventors is applied to a terrace insulating film prior to the invention of the present application. The cell pitch (the distance between a center part of the source region and a center part of the drain region) is 3.1 μm.

As indicated by the solid line in FIG. 49, in the LDMOS device with a cell pitch of 3.1 μm, a so-called quasi-saturation characteristic is observed, in which the gradient of a linear region is relatively small and a transition from the linear region to a saturated region is unclear. The gradient of the linear region corresponds to a channel conductance (g), and the inverse of this (1/g) corresponds to an on-resistance of the LDMOS device. That is, in this LDMOS device having a small channel conductance (g) (a high on-resistance), switching performance is degraded, and therefore conduction losses are increased in a power circuit. Also, in the LDMOS device exhibiting the quasi-saturation characteristic described above, bias degradation tends to occur. These phenomena are thought to be all caused by current concentration onto the interface between the substrate 100 and the terrace insulating film 101 formed by STI described above.

Furthermore, in a region having a high drain voltage, a phenomenon of lifting the drain current occurs. The reason for this is considered to be a gradual increase in impact ionization (an avalanche phenomenon) occurring in a region where the current concentrates (a region surrounded by an oval in FIG. 50) as the drain voltage increases, as illustrated in FIG. 50. That is, electrons occurring due to impact ionization are loaded on the drain current to lift the drain current. On the other hand, while holes are generated by impact ionization, these holes pass through a p-type diffusion region (a pinch resistance region) straight below the source region 105 to be eventually absorbed to a back-gate electrode. However, as the current due to these holes increases, a voltage drop occurs in the pinch resistance region, thereby biasing a pn junction between the source region 105 and the p-type diffusion region in a forward direction. Eventually, a parasitic npn transistor inside the LDMOS device operates to abruptly increase the drain current and, due to heat at this time, the LDMOS device is destroyed.

This lowering of on-state breakdown voltage can be suppressed by widening the cell pitch to mitigate current concentration onto the interface between the substrate 100 and the terrace insulating film 101 formed by STI. As indicated by the dotted line in FIG. 49 described above, in the LDMOS device having a cell pitch of 5 μm, as compared with the LDMOS device with a cell pitch of 3.1 μm, current concentration and impact ionization are mitigated, and therefore the lifting of the drain current is solved and the on-state breakdown voltage is increased. However, in the LDMOS device having a cell pitch of 5 μm, as compared with the LDMOS device having a cell pitch of 3.1 μm, not only the cell size is increased but also the distance between the source region and the drain region is increased, and therefore the gradient of the linear region (channel conductance (g)) is further decreased. That is, the on-resistance, which is a main capability of the LDMOS device, is increased to an unallowable degree for a product.

<Problem 3: Decrease in Degree of Reliability of nLDMOS Devices>

FIGS. 51 to 54 illustrate structures of nLDMOS (n-channel type LDMOSs) devices studied by the inventors prior to the invention of the present application. FIGS. 51A and 51B are schematic plan views of main parts for describing basic structures of first and second nLDMOS devices, respectively, FIG. 52 is a plan view of main parts of the first nLDMOS device, FIG. 53 is a cross-sectional view of main parts taken along an A-A line of FIG. 52, and FIG. 54 is a cross-sectional view of main parts taken along a B-B line of FIG. 52.

The first nLDMOS device illustrated in FIG. 51A is configured of source regions S formed along a first direction (a Y direction in the drawing: a channel width direction), terrace insulating films SL formed along the first direction with a predetermined distance (a channel length) away from the source regions S, drain regions D each formed along the first direction on an opposite side (a second direction orthogonal to the first direction (an X direction in the drawing: a channel length direction)) of the source region S interposing the terrace insulating film SL, and gate electrodes G each partially overriding the terrace insulating film SL and formed between the source region S and the drain region D (indicated by dotted lines in FIG. 51A).

Also, in a periphery (margin, surround) of an active region where a plurality of the first nLDMOS devices are formed, a device isolation portion SS is formed. The terrace insulating film SL are formed by STI, the device isolation portion SS is also formed by STI, and the terrace insulating films SL and the device isolation portion SS are connected to each other.

Also, the second nLDMOS device illustrated in FIG. 51B is similar to the first nLDMOS device illustrated in FIG. 51A described above, but separators are inserted along the second direction at a plurality of positions in the source regions S and the drain regions D extending in the first direction. At the plurality of positions where these separators are inserted, terrace insulating films SL and gate electrodes G are formed by STI, and the terrace insulating films SL and the device isolation portions SS are connected to each other.

FIGS. 52 to 54 illustrate a detailed structure of the first nLDMOS device illustrated in FIG. 51A.

The first nLDMOS device is formed on an n-type epitaxial layer NEpi formed on a main surface of a substrate SUB via an n-type buried layer NBL. The first nLDMOS device is formed in an active region surrounded by a device isolation portion SS formed by STI, and n-type wells NV are formed on the n-type epitaxial layer NEpi in that active region.

On a main surface of the n-type epitaxial layer NEpi, gate electrodes G are formed via a gate insulating film (illustration omitted). On a drain region D side of each gate electrode G, a terrace insulating film SL is formed by STI, with an end on the drain region D side overriding the terrace insulating film SL. On a source region S side of the gate electrode G, the terrace insulating film SL described above is not formed.

The source region S formed of an n-type semiconductor region formed on the n-type epitaxial layer NEpi is surrounded by a p-type well HPW. This p-type well HPW is diffused also under the gate electrode G, and is also formed on part of the n-type epitaxial layer NEpi under the gate electrode G. Furthermore, a p-type back-gate layer BG is formed at a center part of the source region S. Still further, the drain region D formed of the n-type semiconductor region formed on the n-type epitaxial layer NEpi is surrounded by an n-type well NW.

Furthermore, the nLDMOS device is covered with an interlayer insulating film Liso. In this interlayer insulating film Liso, a plurality of contact holes CT are formed. Via plugs PL buried in the plurality of contact holes CT, a wiring layer ML is electrically connected to the gate electrode G, the source regions S, the drain region D, the p-type back-gate layer BG, and others.

However, in the first and second nLDMOS devices where STI is applied to the terrace insulating film SL described using FIG. 51 to FIG. 54, the terrace insulating films SL formed by STI are also formed inside the active region where the first and second nLDMOS devices are formed. Therefore, in addition to Problem 1 (increase in on-resistance) and Problem 2 (lowering of on-state breakdown voltage) described above, a decrease in degree of reliability of the first and second nLDMOS devices due to a crystal defect caused by the structure of STI may occur.

A preferred aim of the present invention is to provide a technology capable of improving the reliability of a semiconductor device without degrading operation characteristics of the semiconductor device.

Also, another preferred aim of the present invention is to provide technology capable of achieving high integration of the semiconductor devices.

The above and other preferred aims and novel characteristics of the present invention will be apparent from the description of the present specification and the accompanying drawings.

Means for Solving the Problems

The typical ones of the inventions disclosed in the present application will be briefly described as follows.

The present invention is a semiconductor device including, in an active region surrounded by device isolation portions formed on a main surface of a semiconductor layer on a substrate, an LDMOS device including: a source region formed along a first direction; a terrace insulating film formed in a periphery of the source region with a predetermined distance away from the source region;

a drain region formed along the first direction at each side of the source region in a second direction orthogonal to the first direction via the terrace insulating film; and a gate electrode formed on the main surface of the semiconductor layer between the source region and the drain region via a gate insulating film so as to partially override the terrace insulating film; in the semiconductor device, semiconductor regions are formed in an outermost periphery of the active region in the semiconductor layer between the terrace insulating film and the device isolation portion in the first direction and between the terrace insulating film and the device isolation portion in the second direction, and the device isolation portion and the terrace insulating film are isolated from each other.

Effects of the Invention

The effects obtained by typical aspects of the present invention will be briefly described below.

The reliability of a semiconductor device can be improved without degradation of operation characteristics of the semiconductor device.

Also, high integration of the semiconductor device can be achieved.

BRIEF DESCRIPTIONS OF THE DRAWINGS

FIG. 1 is a functional block diagram of a semiconductor device according to a first embodiment of the present invention;

Figure 5:
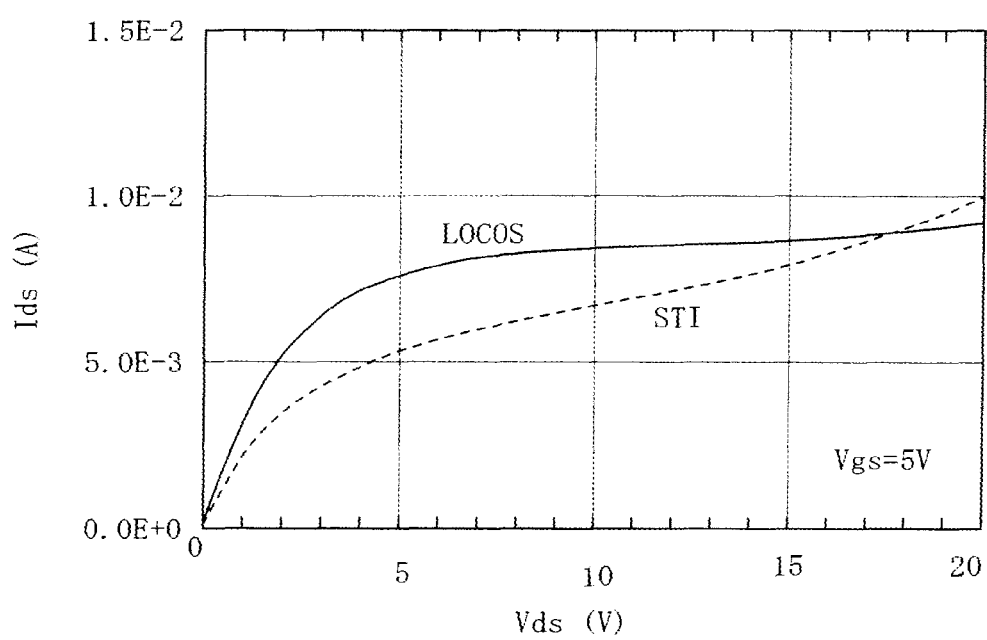
Figure 6A:
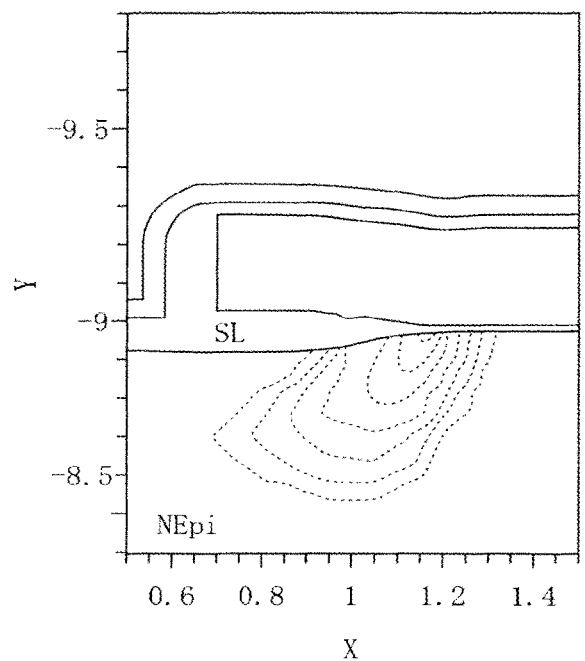
Figure 6B:
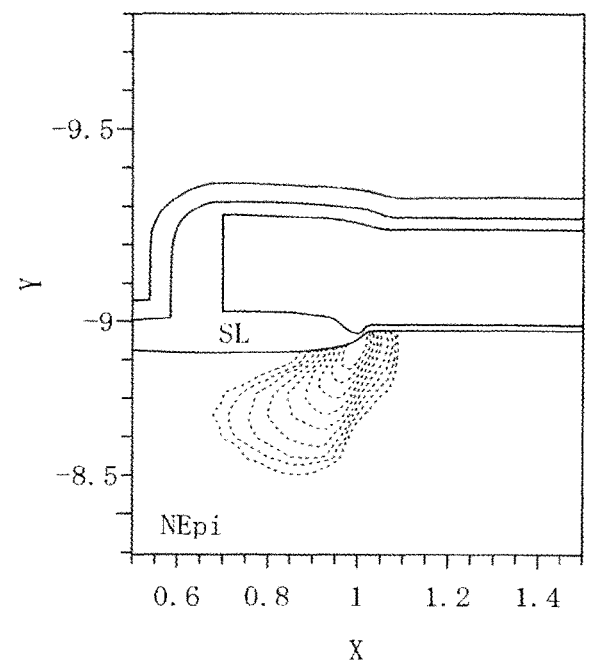
Figure 7:
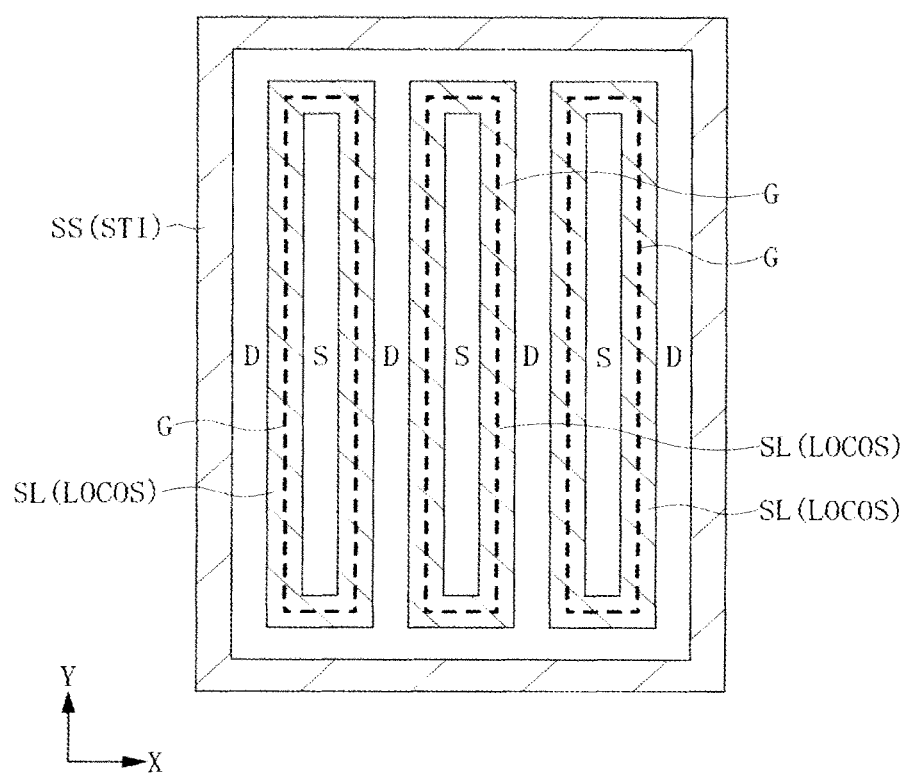
Figure 8:
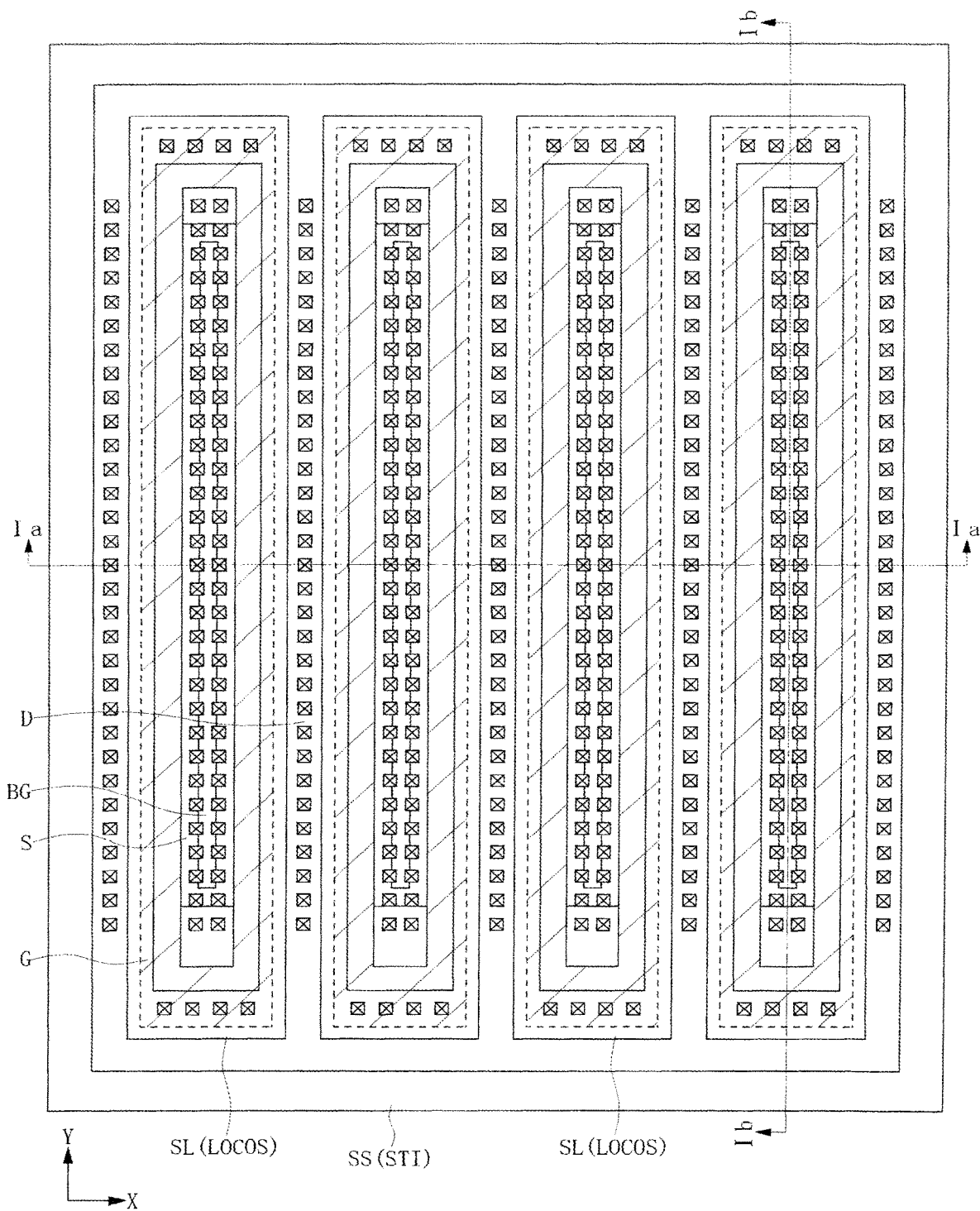
Figure 9:
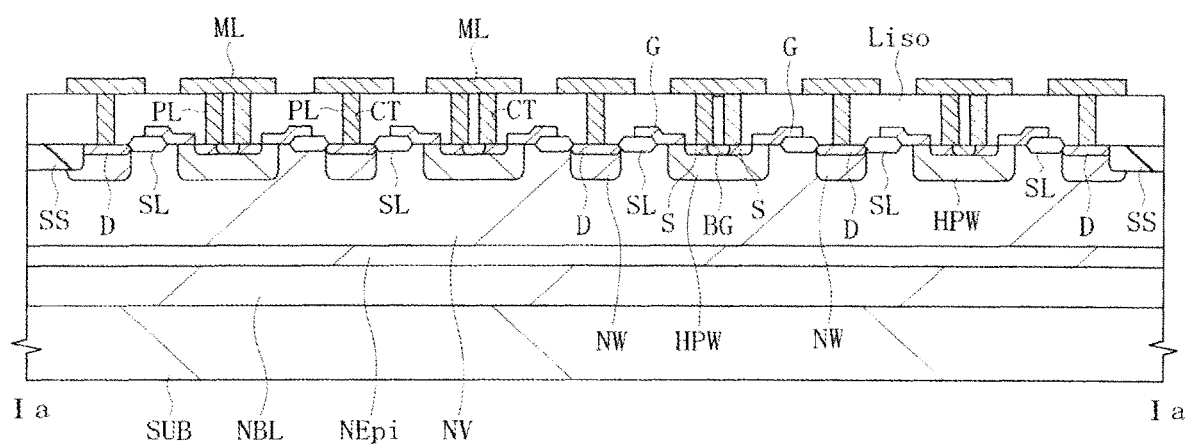
Figure 10A:
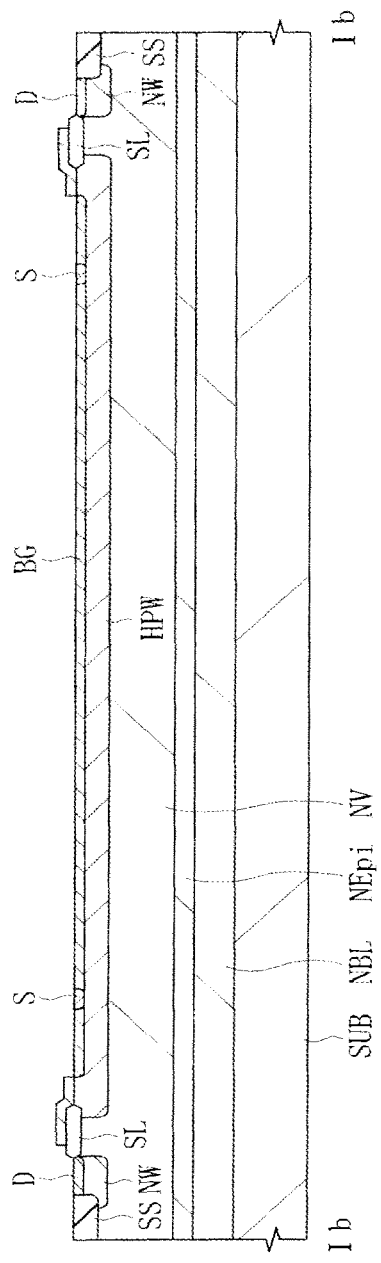
Figure 10B:
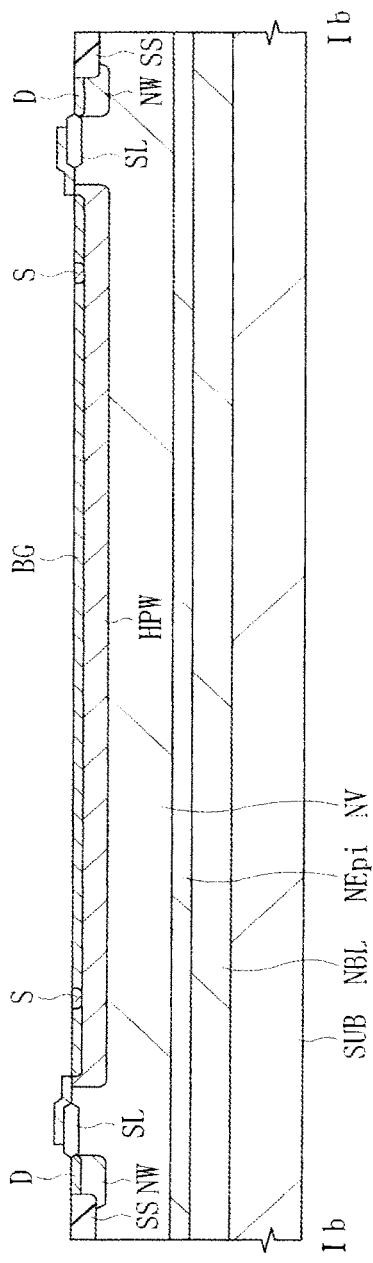
Figure 10C:
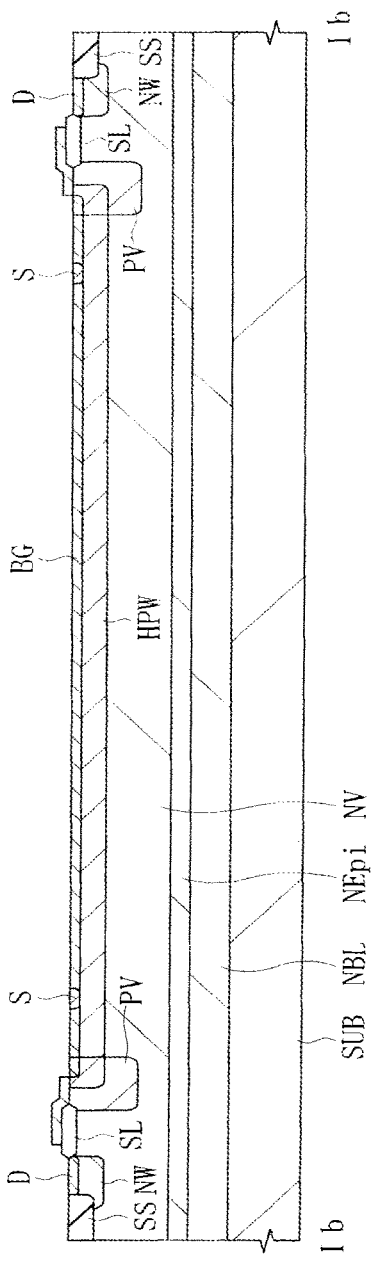
Figure 11:
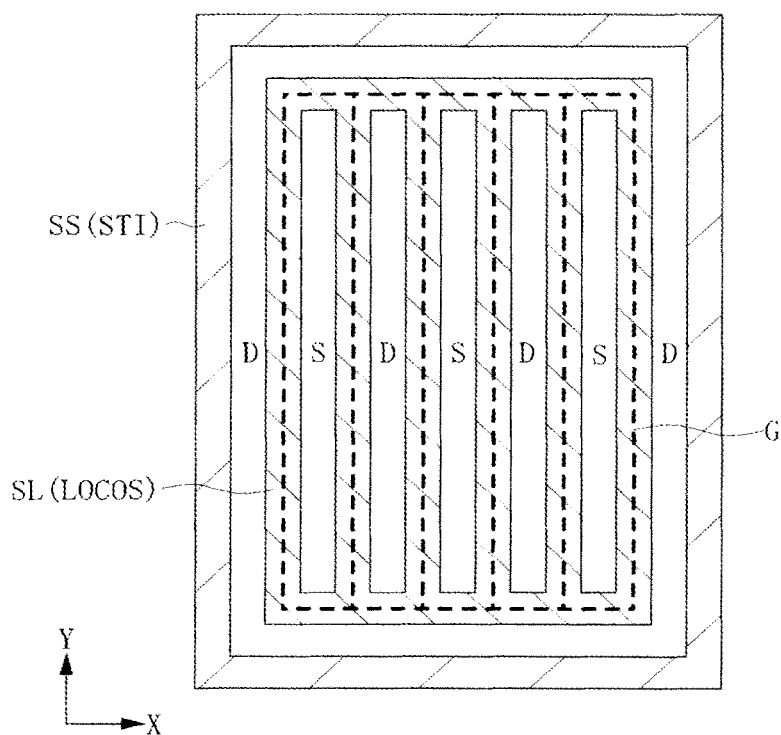
Figure 12:
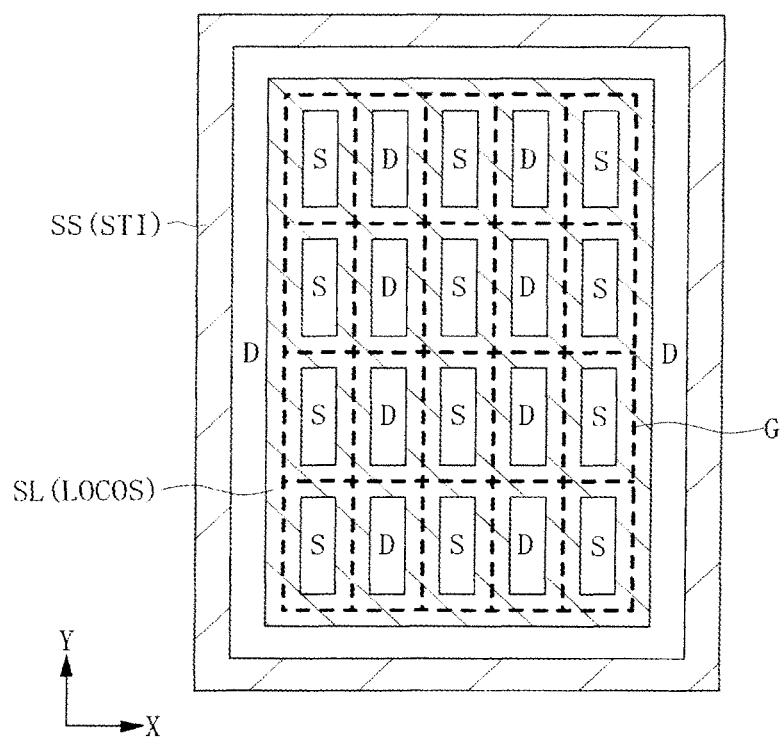
Figure 13:
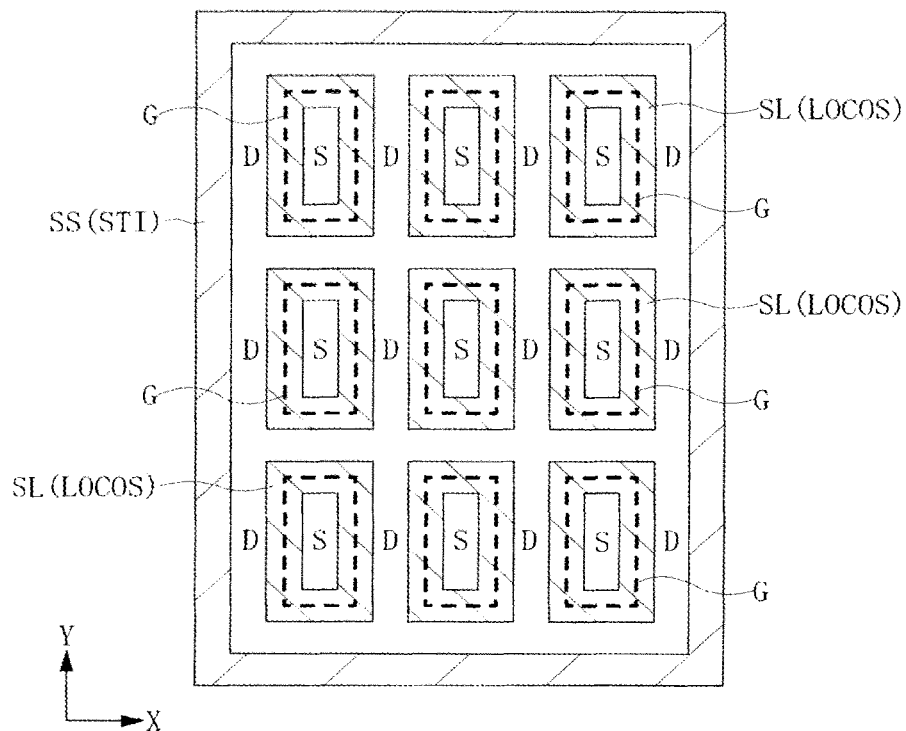
Figure 14A:
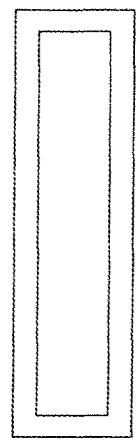
Figure 14B:
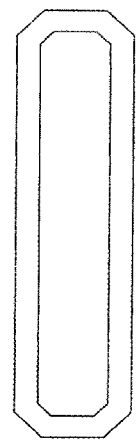
Figure 14C:
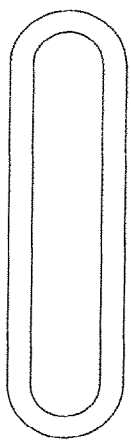
Figure 15:
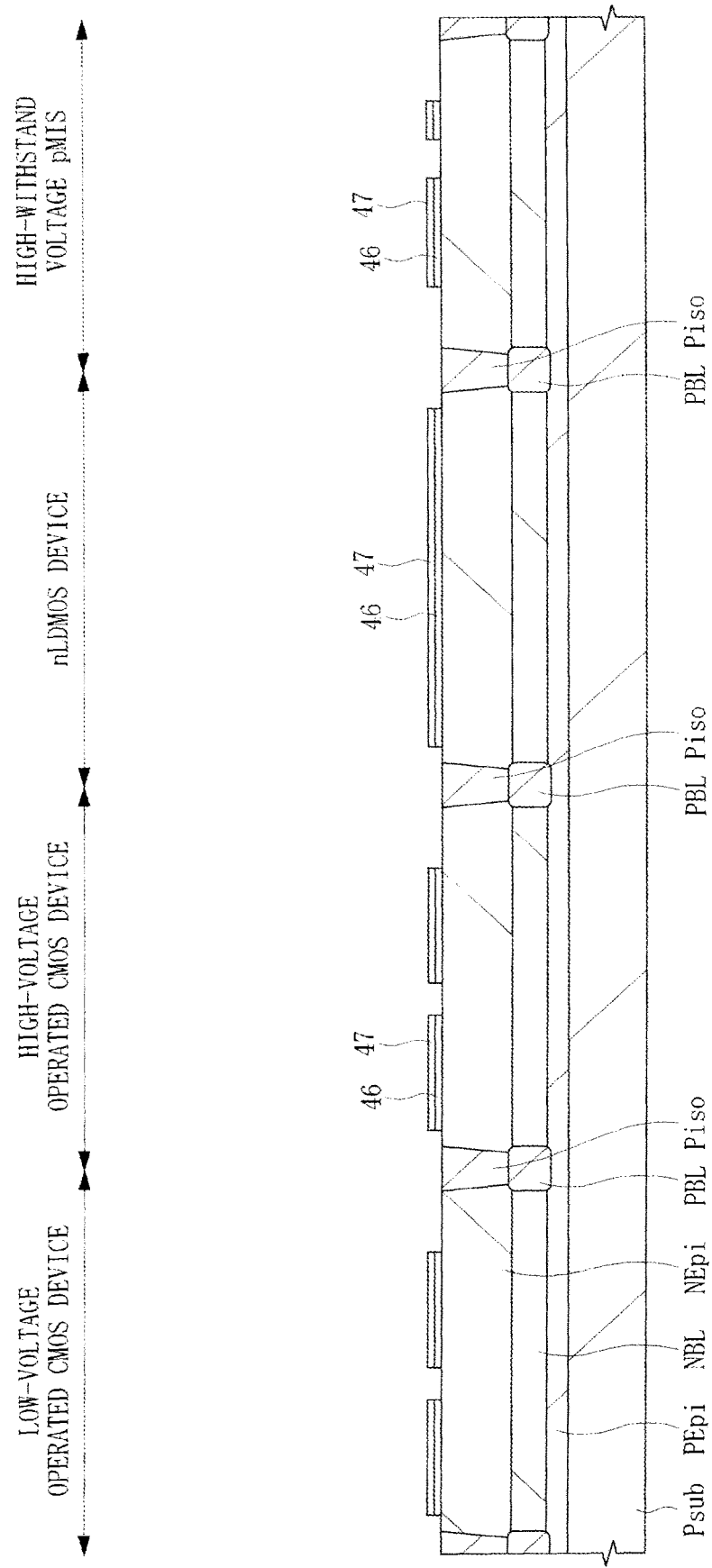
Figure 16:
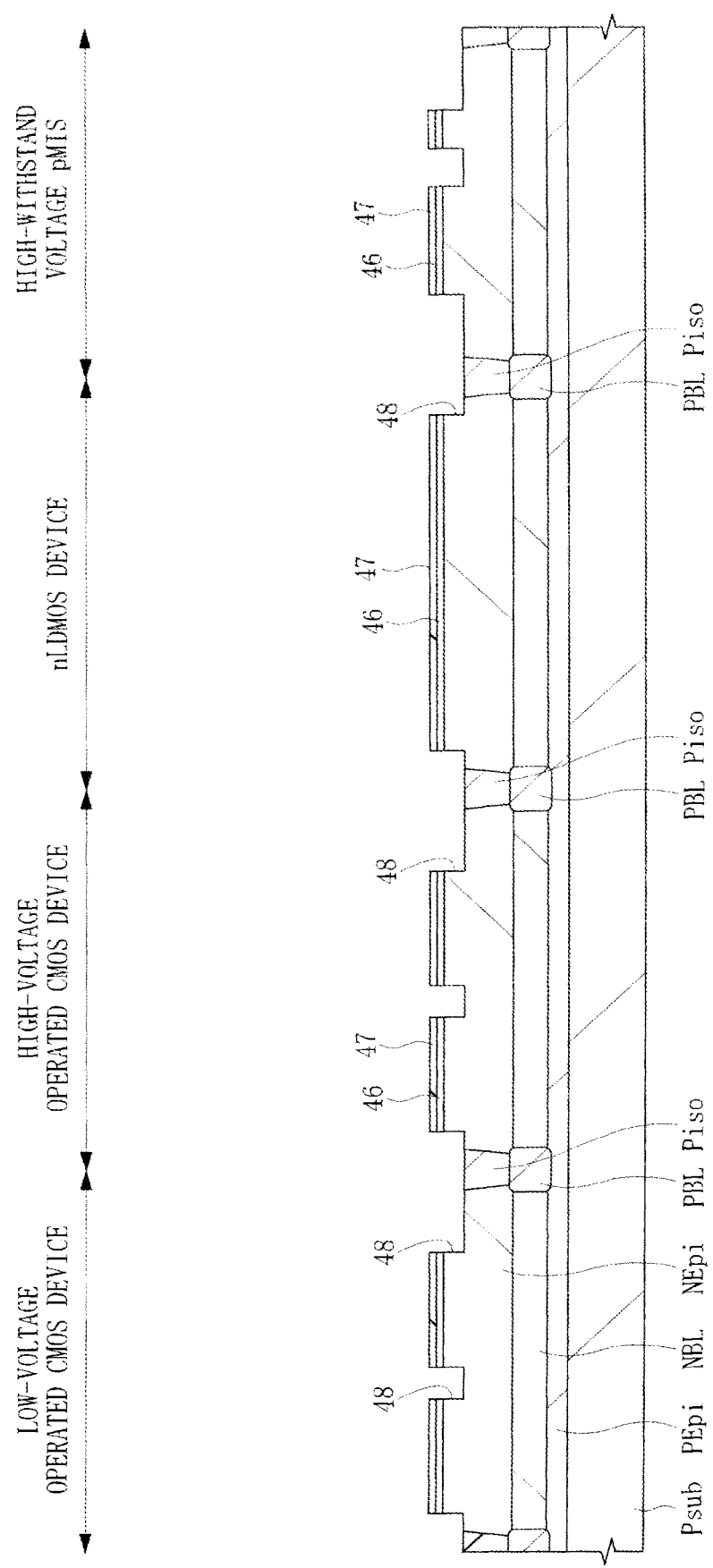
Figure 17:
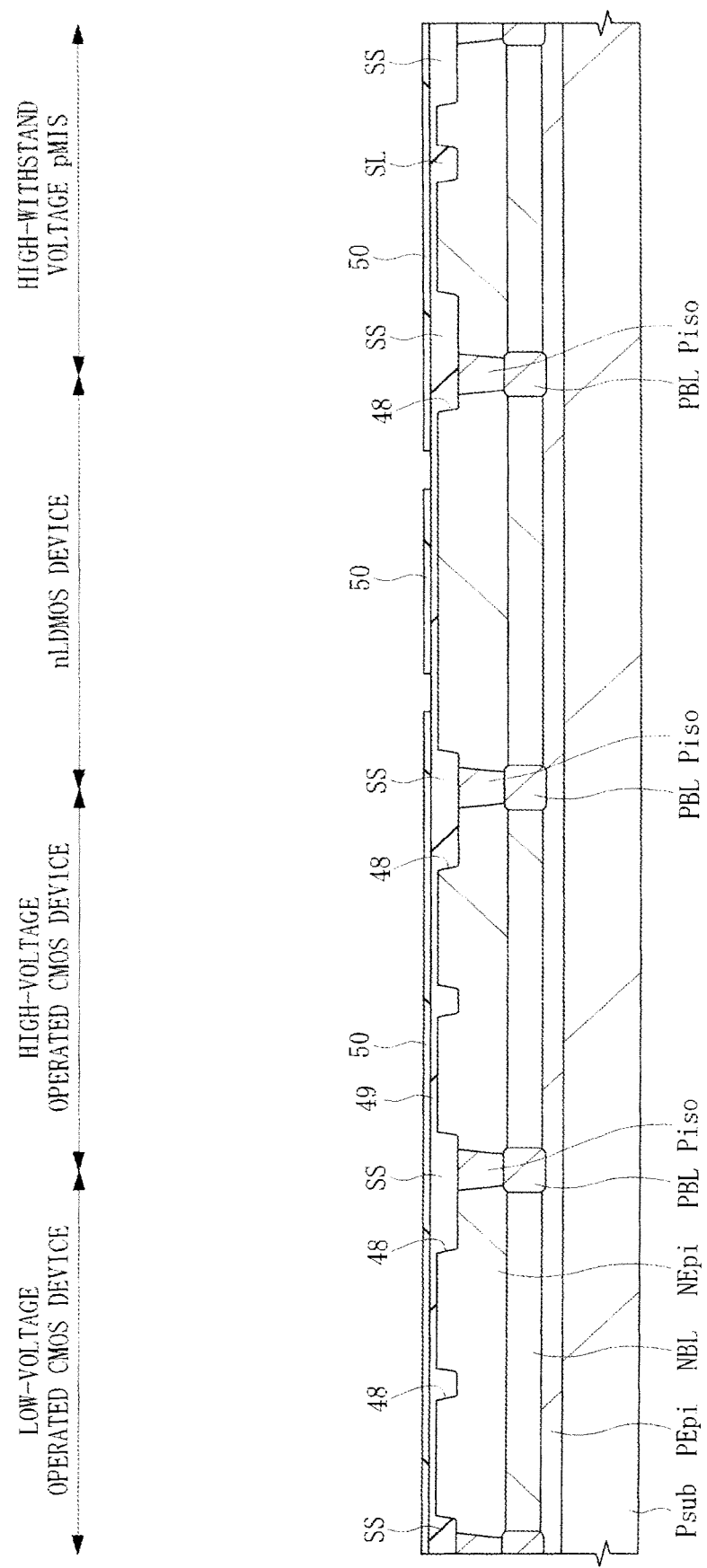
Figure 18:
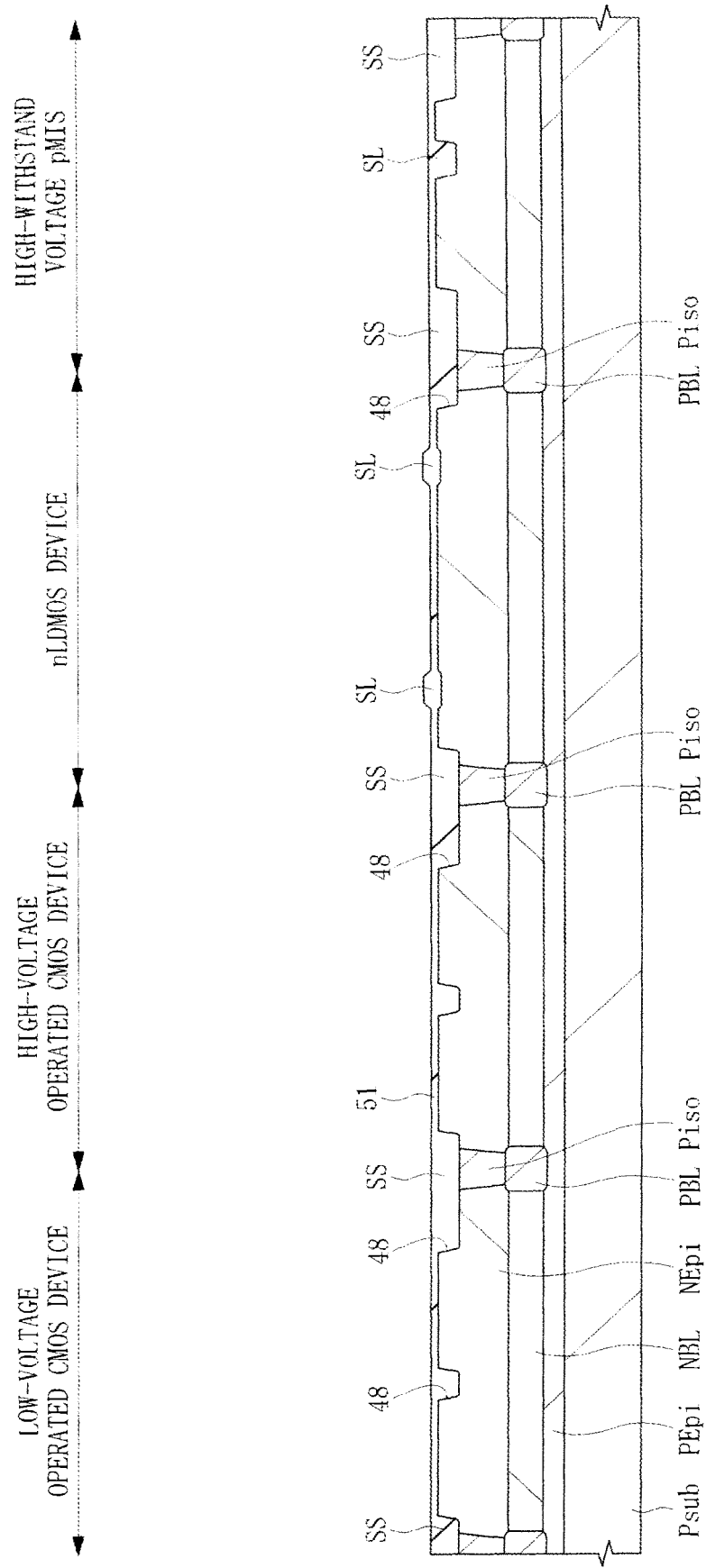
Figure 19:
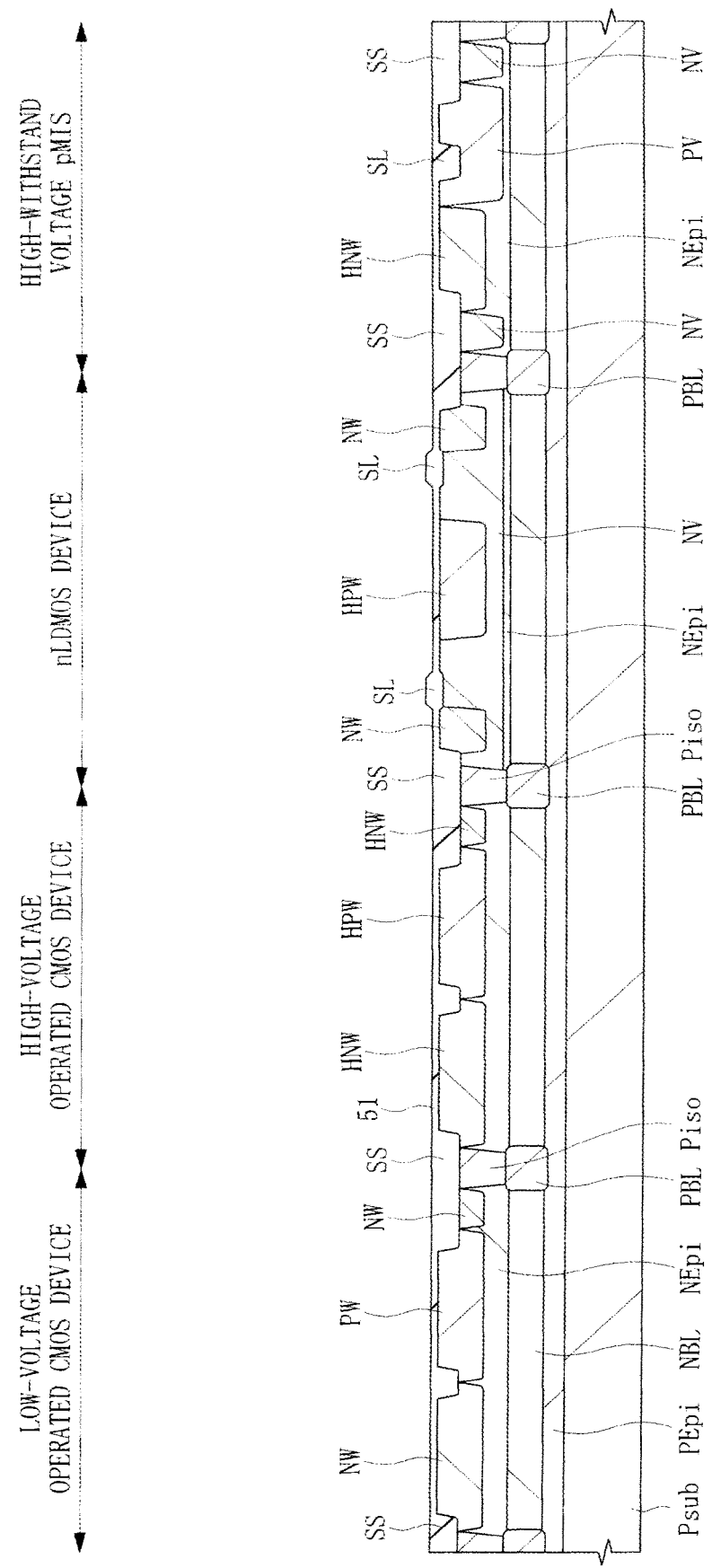
Figure 20:
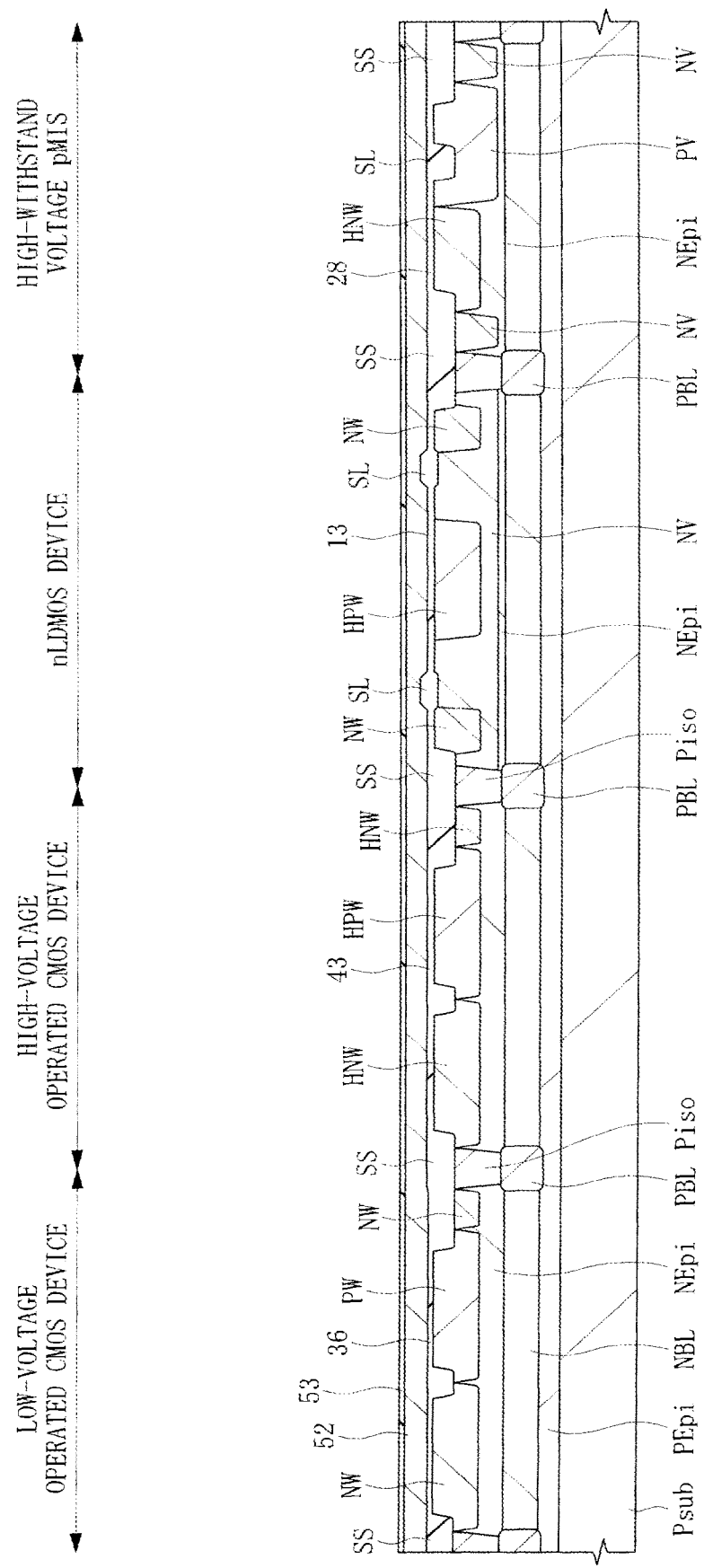
Figure 21:
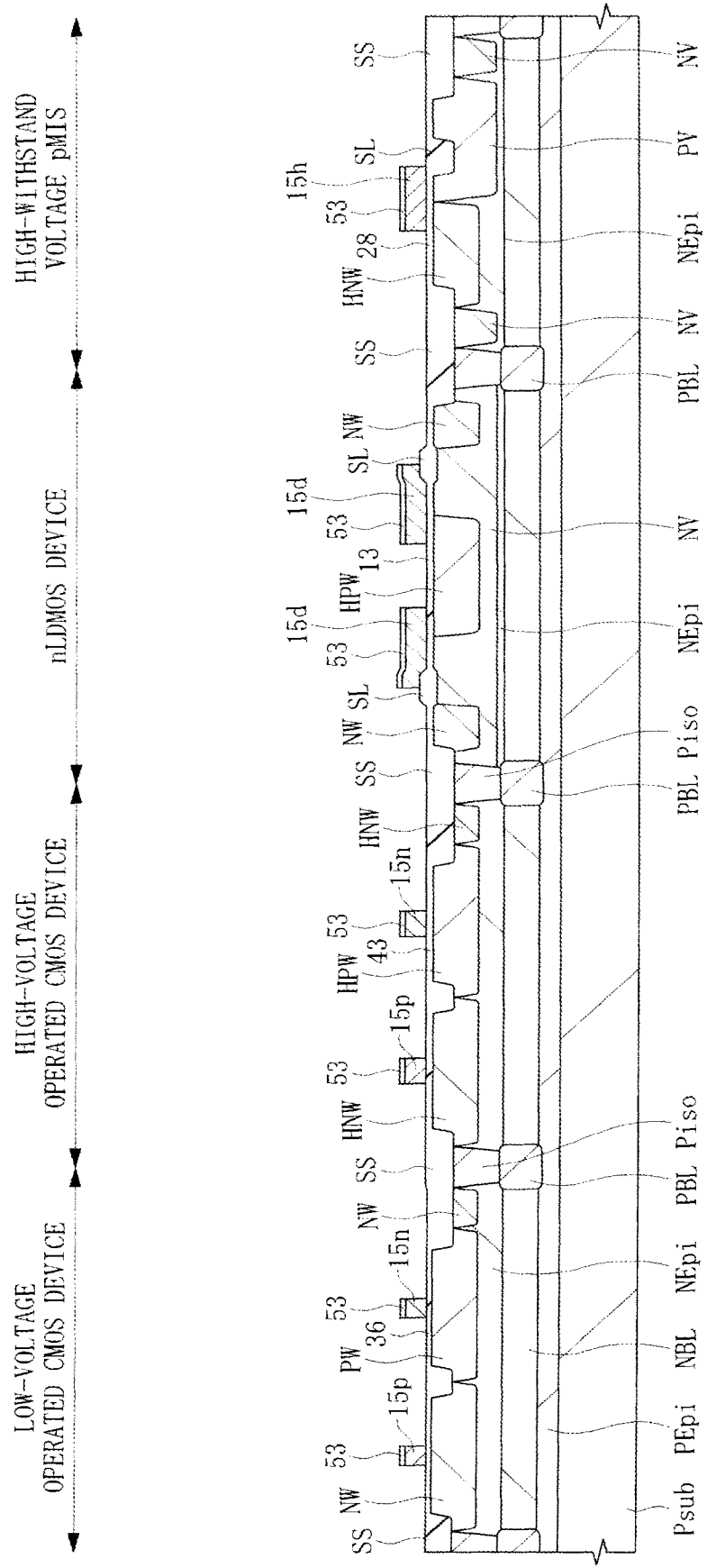
Figure 22:
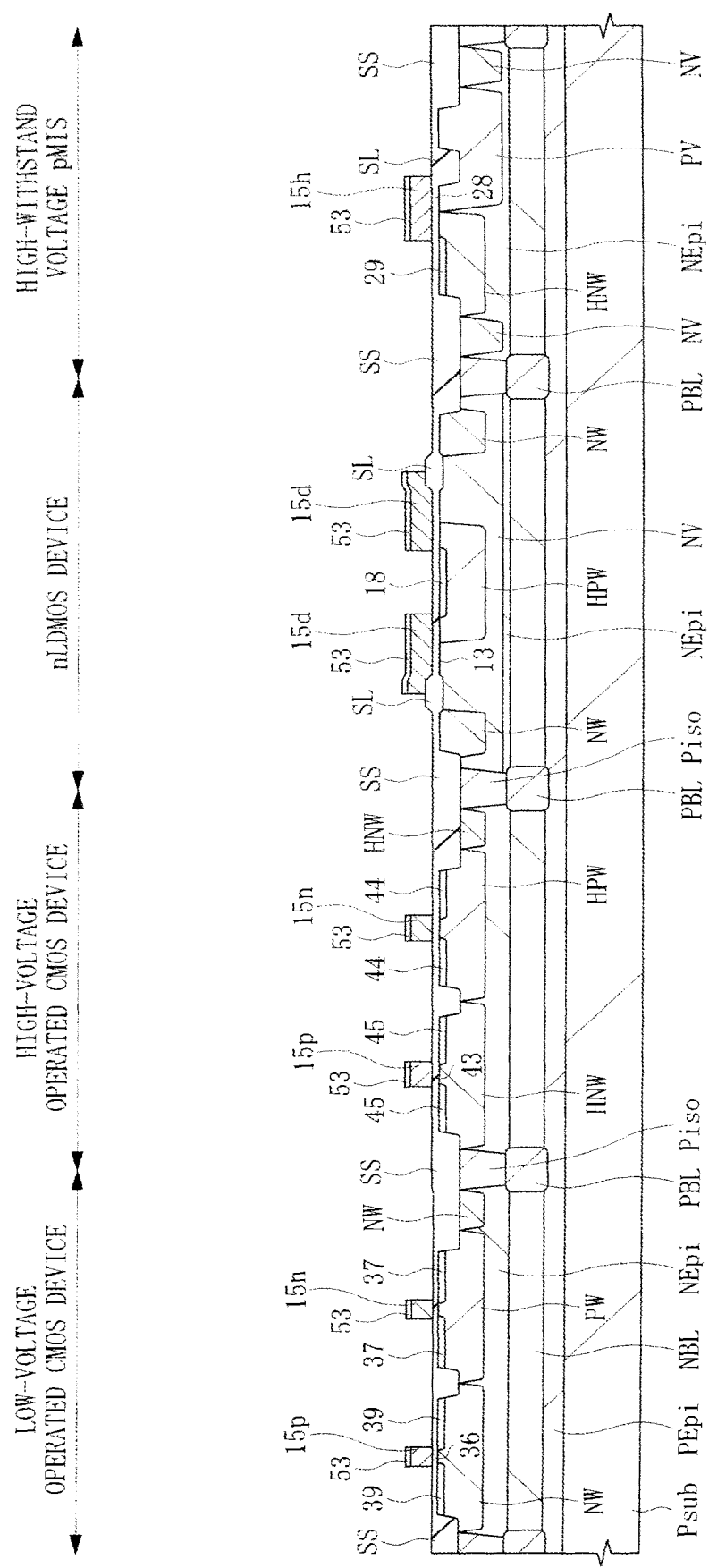
Figure 23:
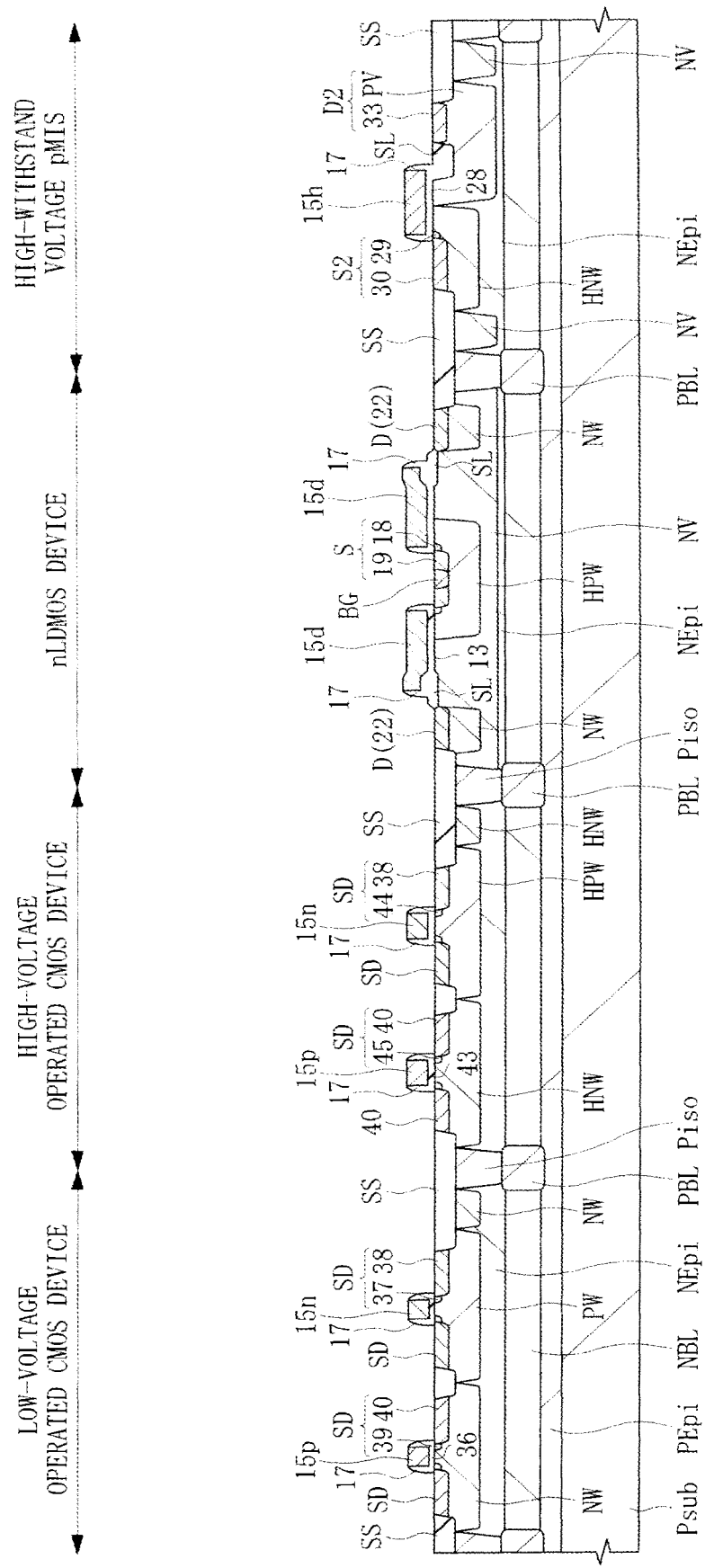
Figure 24:
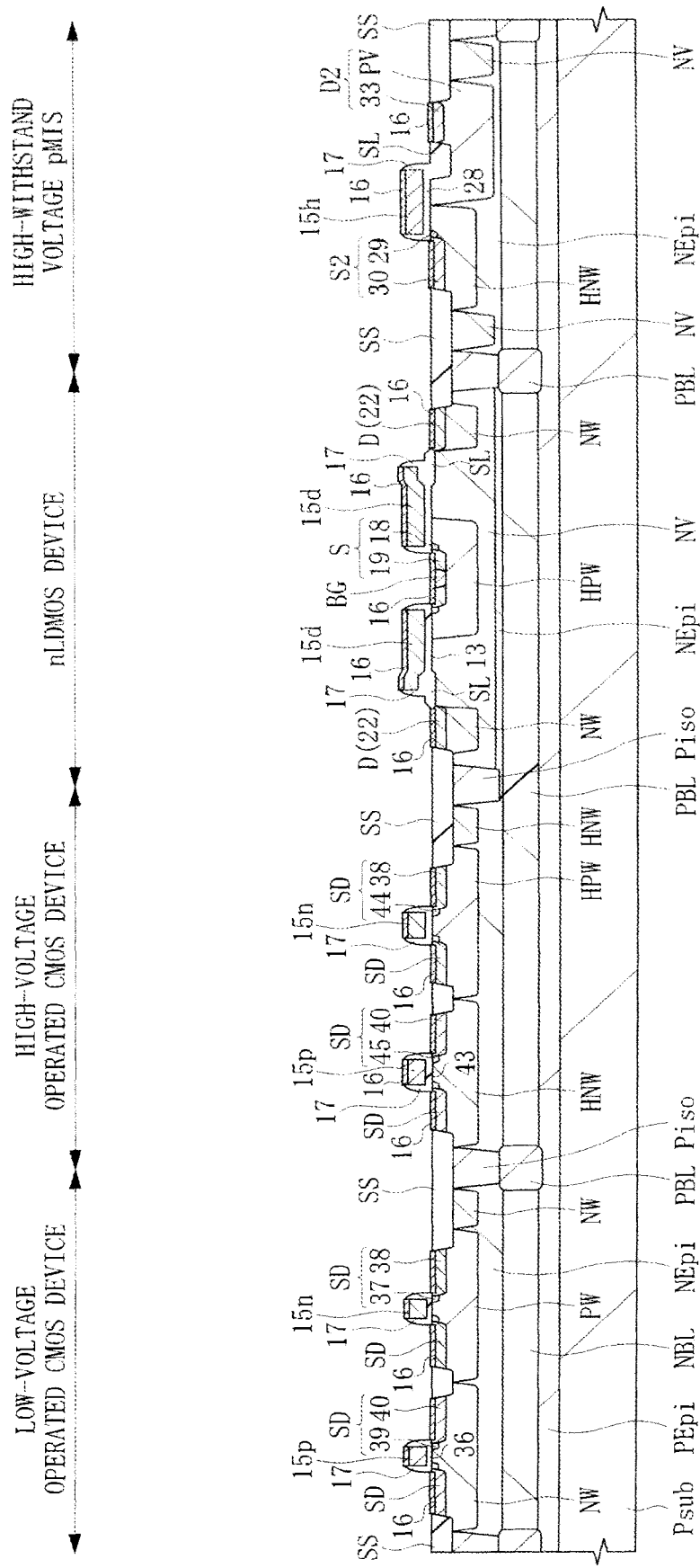
Figure 25:
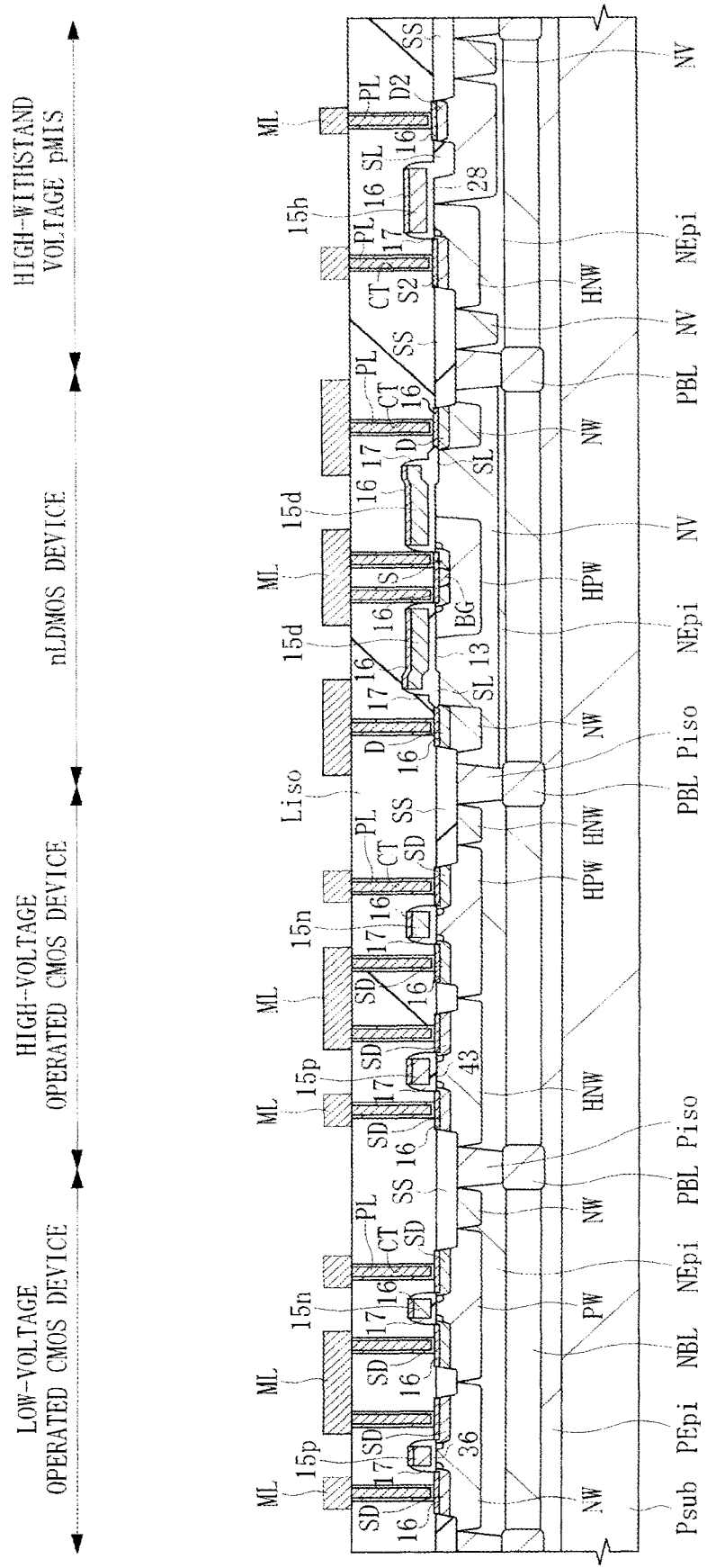
Figure 26:
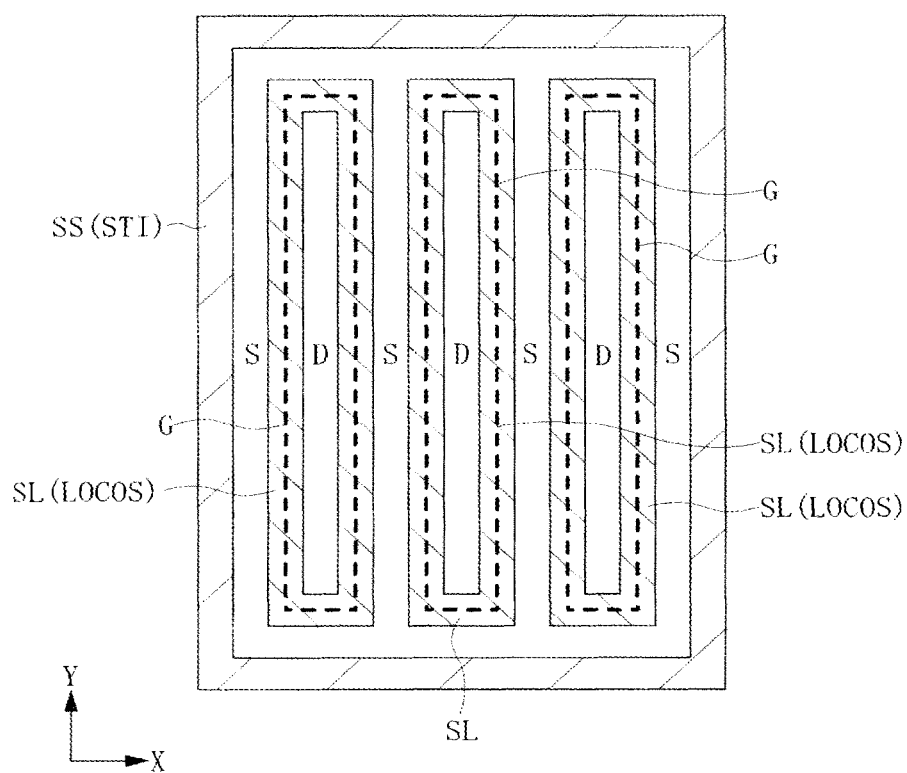
Figure 27:
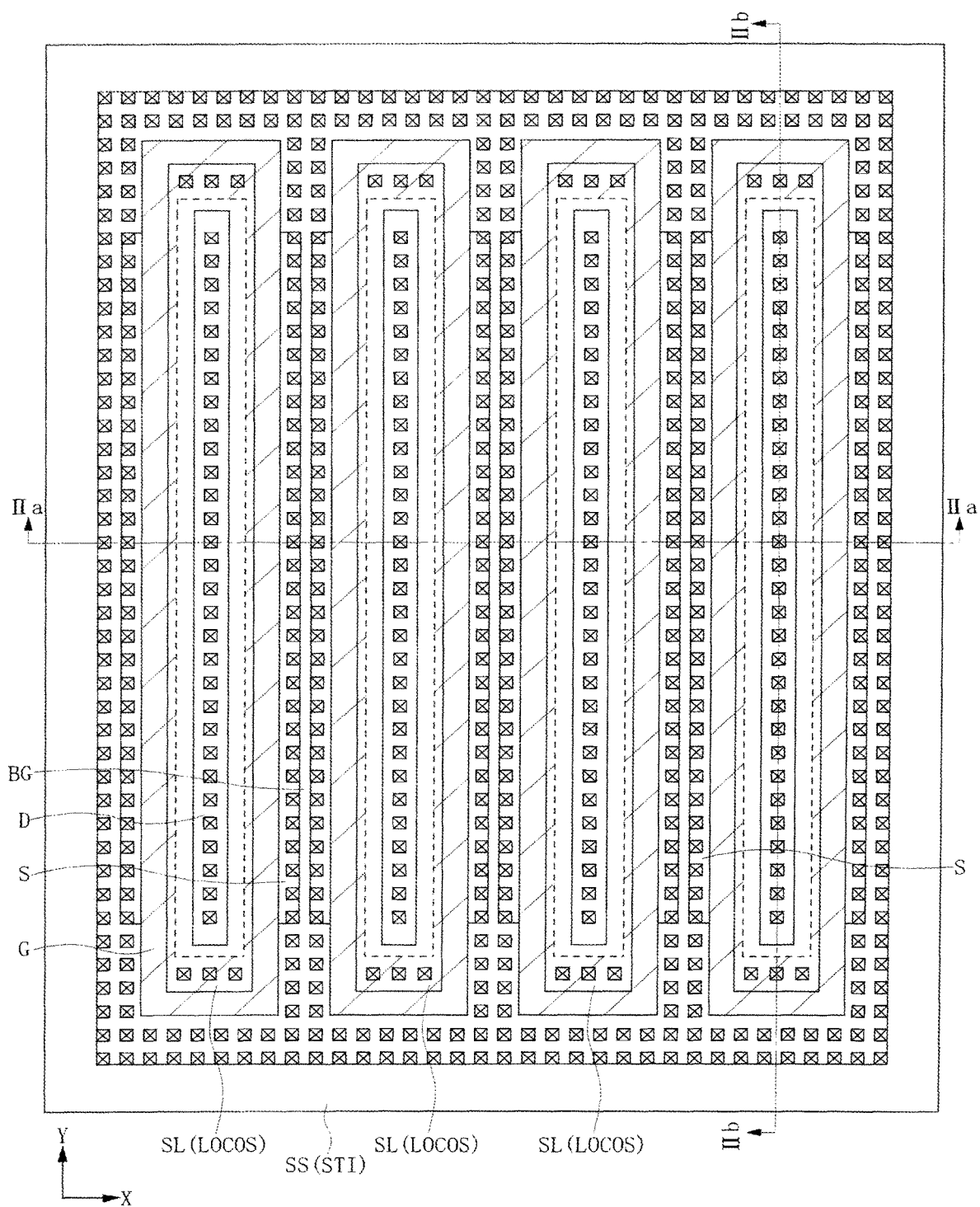
Figure 28:
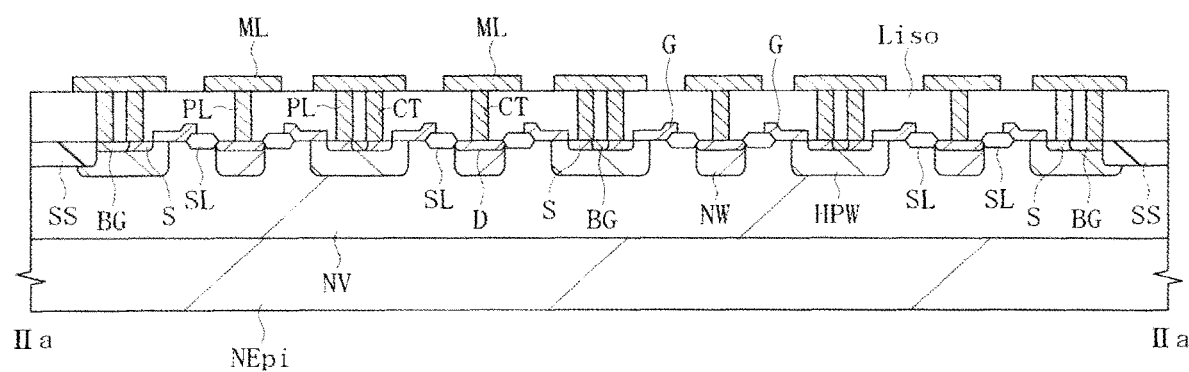
Figure 30:
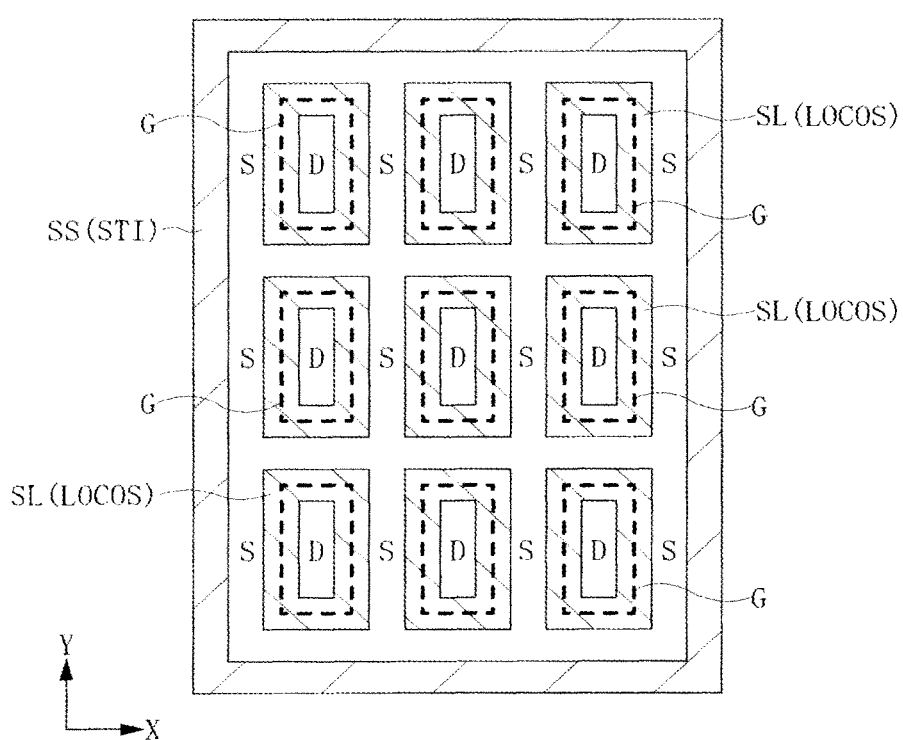
Figure 31:
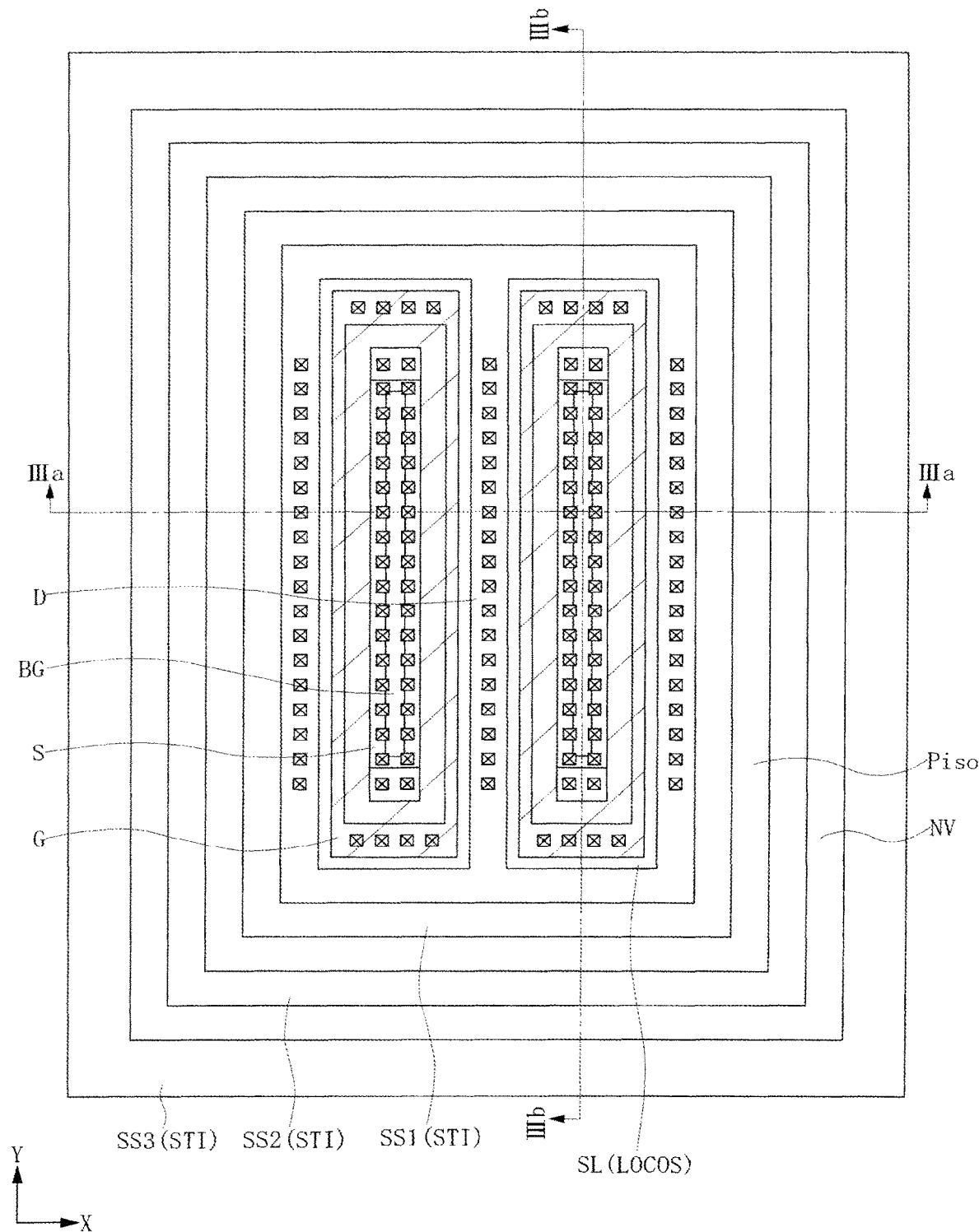
Figure 32:
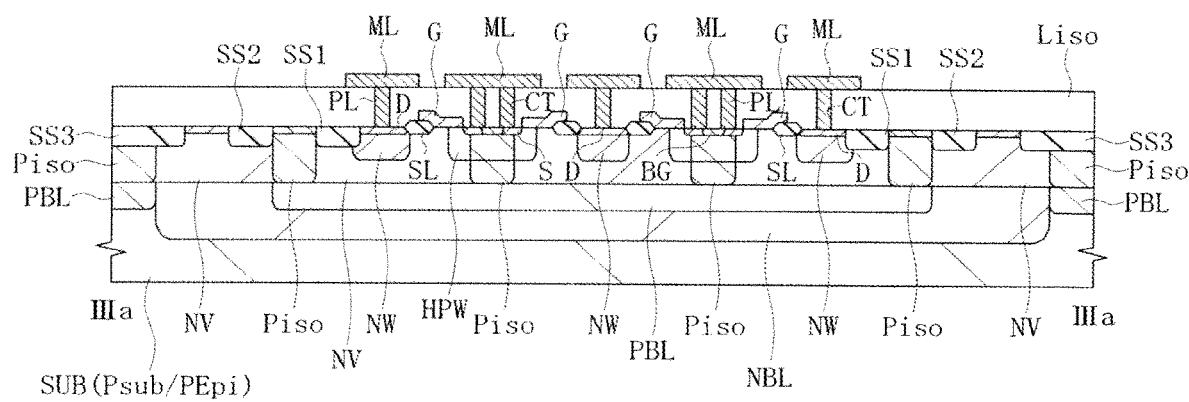
Figure 33:
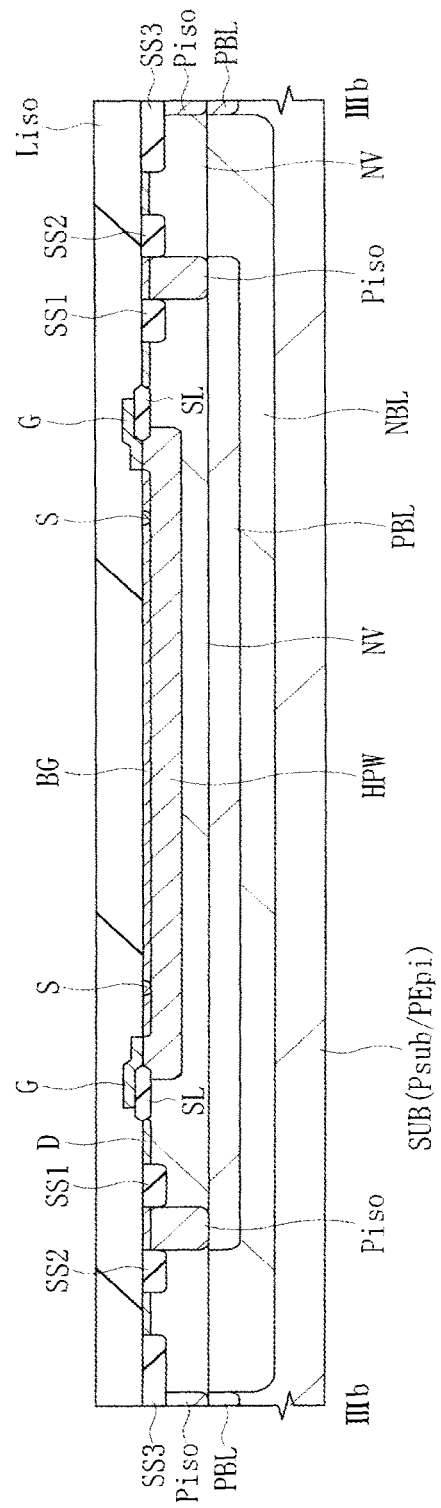
Figure 34:
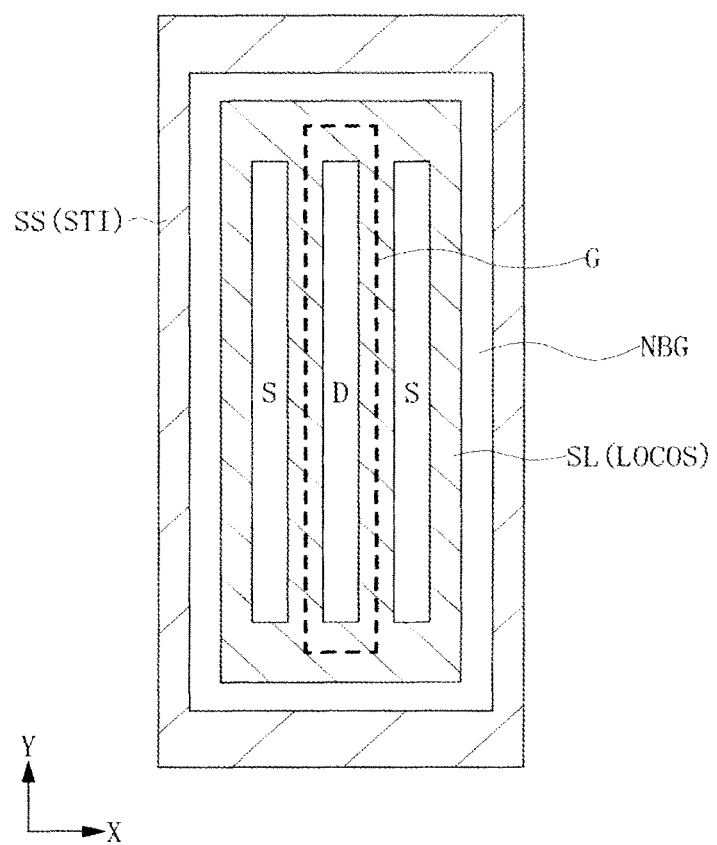
Figure 35:
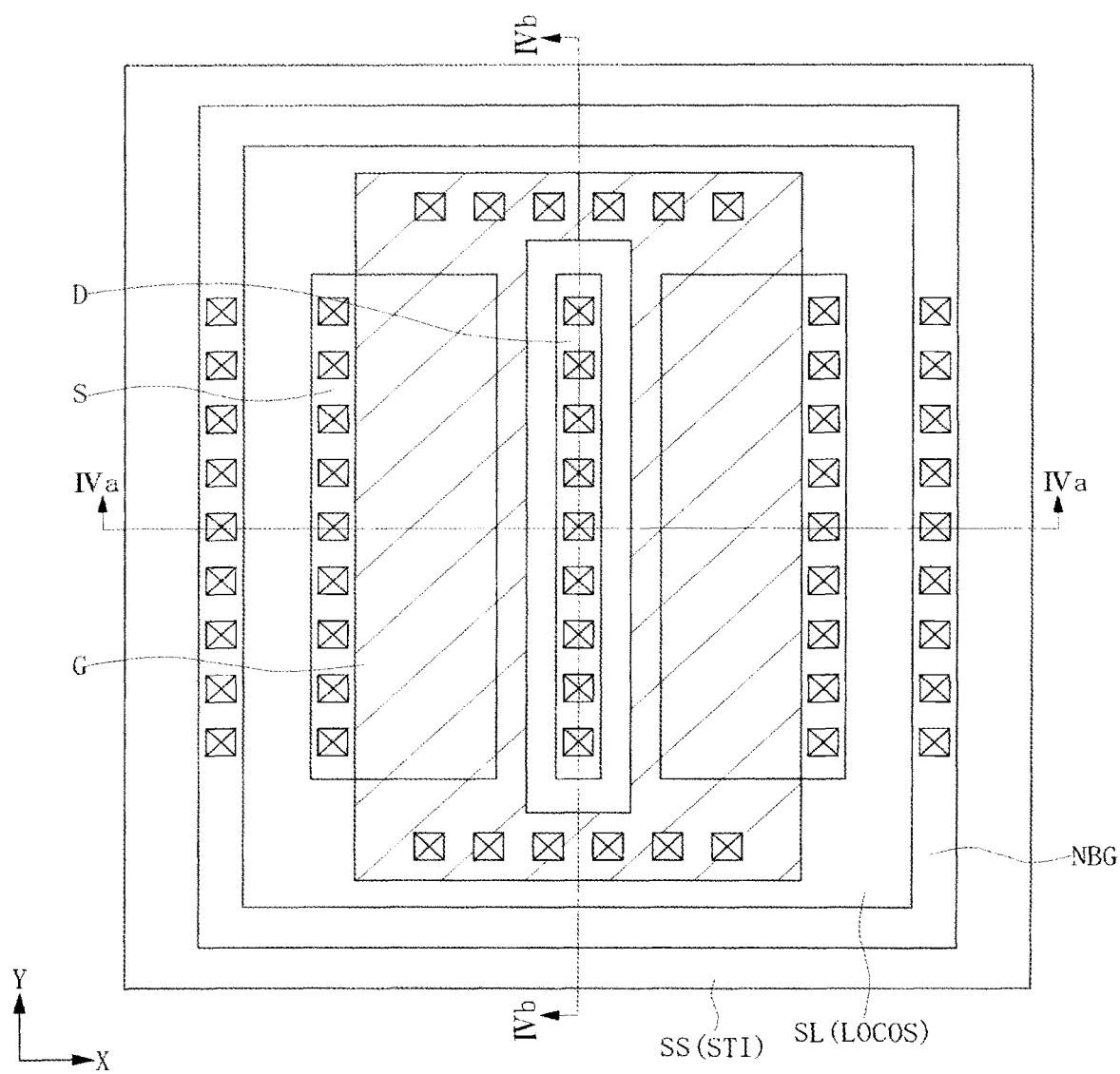
Figure 36:
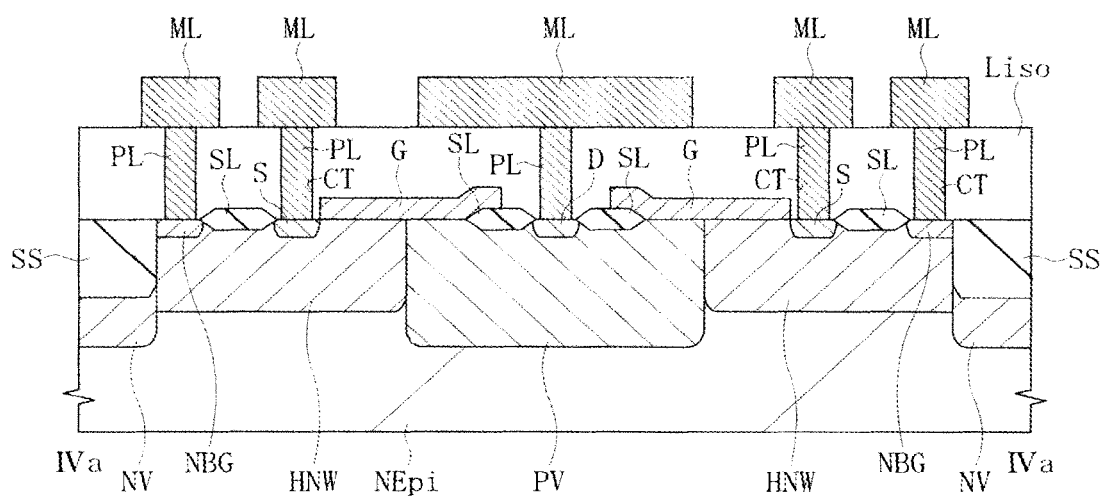
Figure 37:
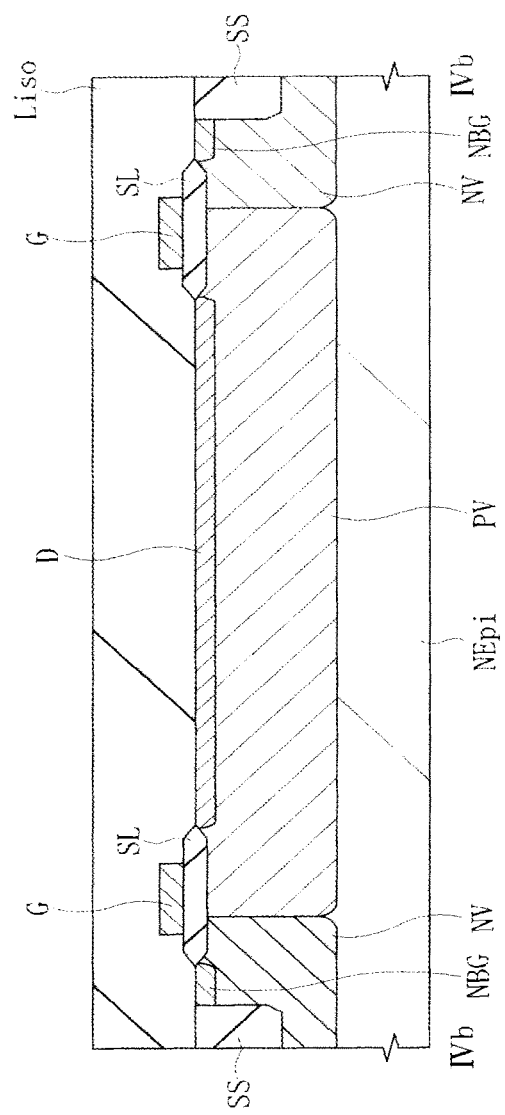
Figure 38:
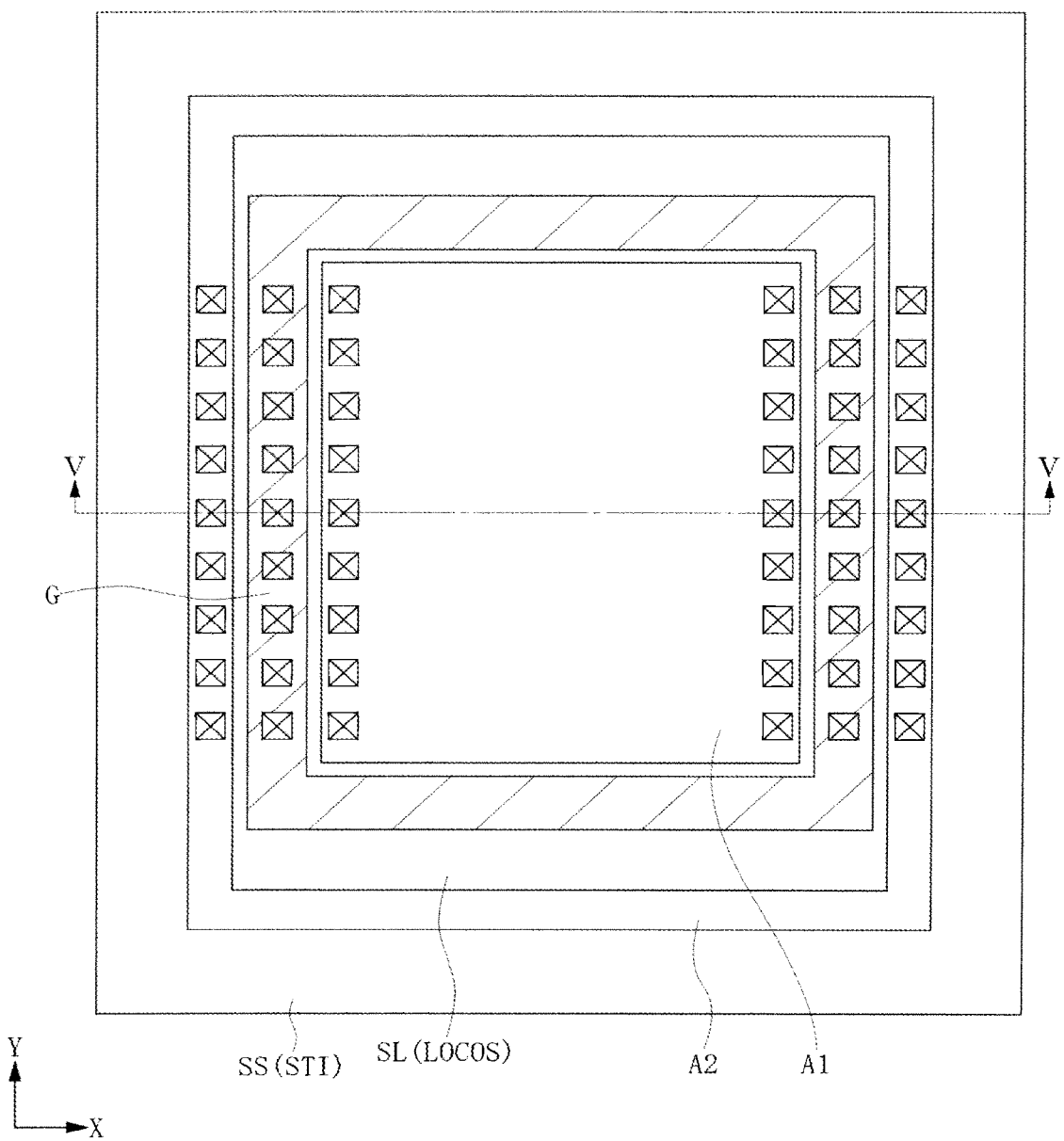
Figure 39:
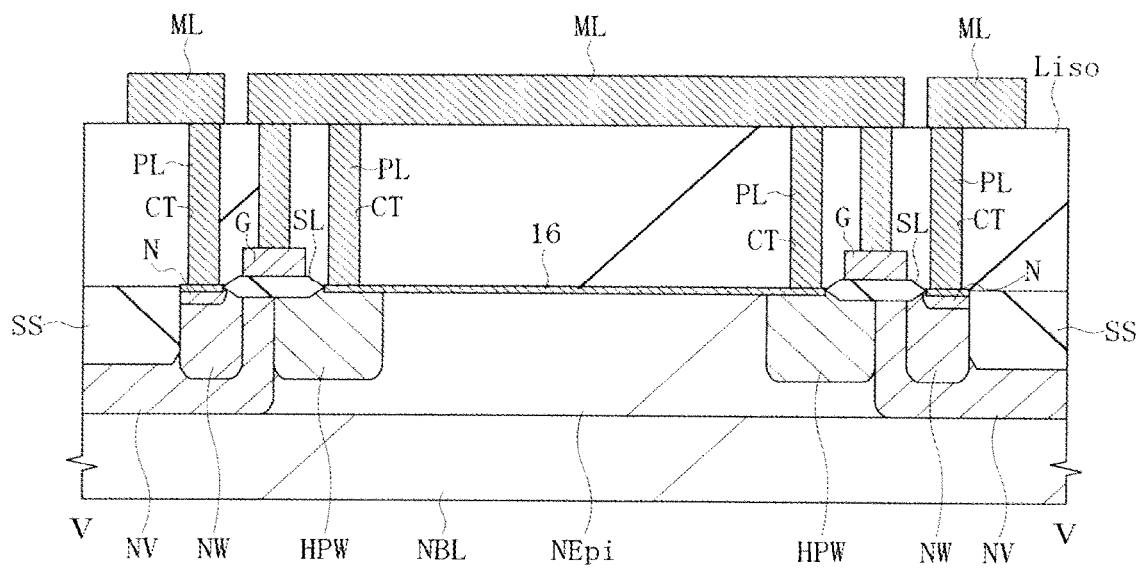
Figure 40:
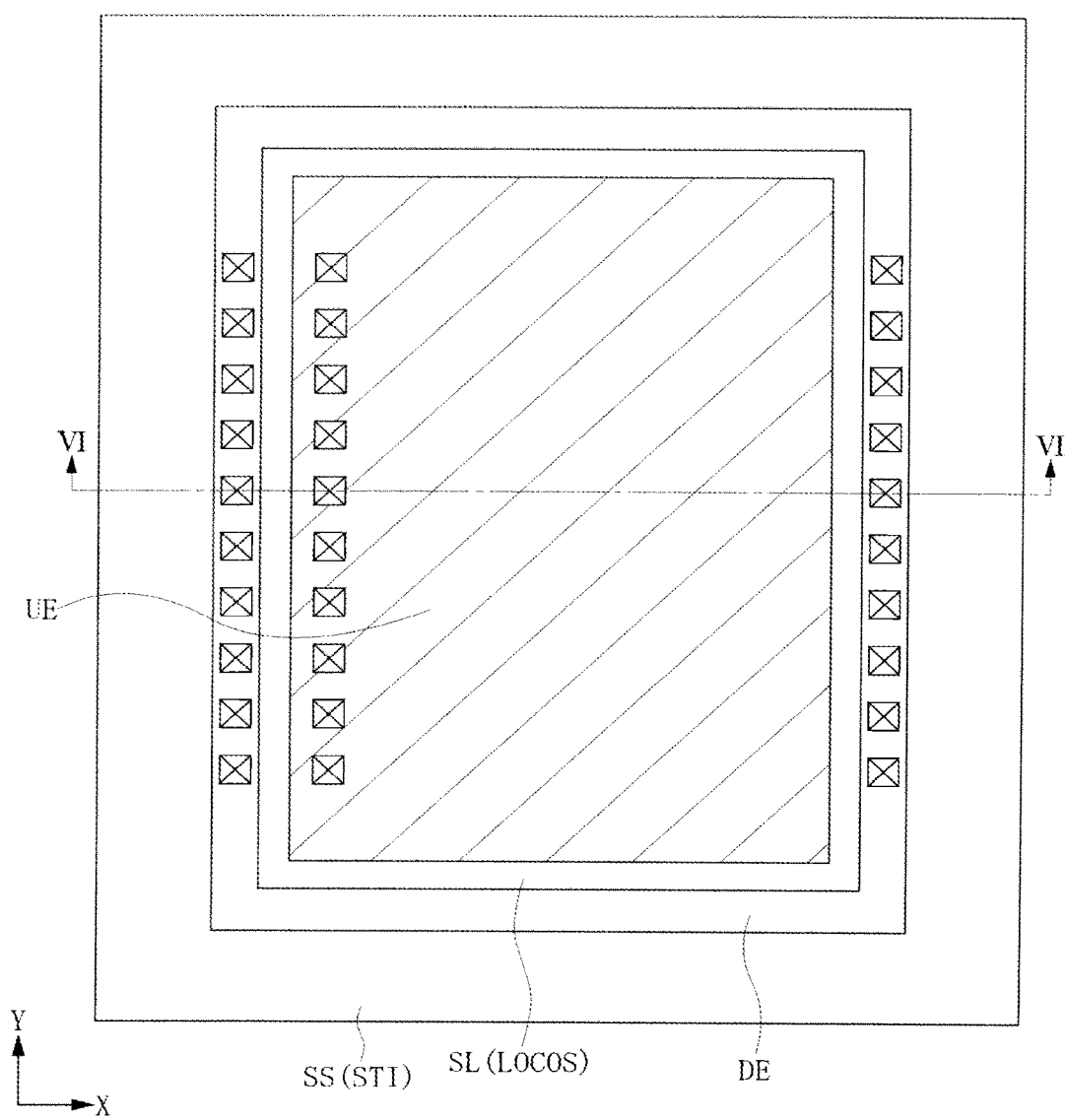
Figure 41:
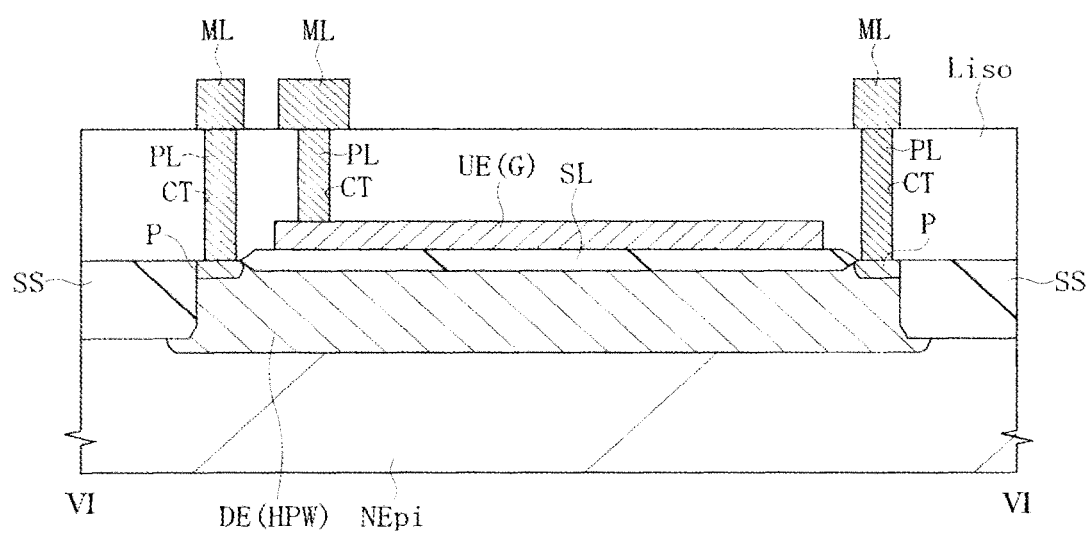
Figure 42:
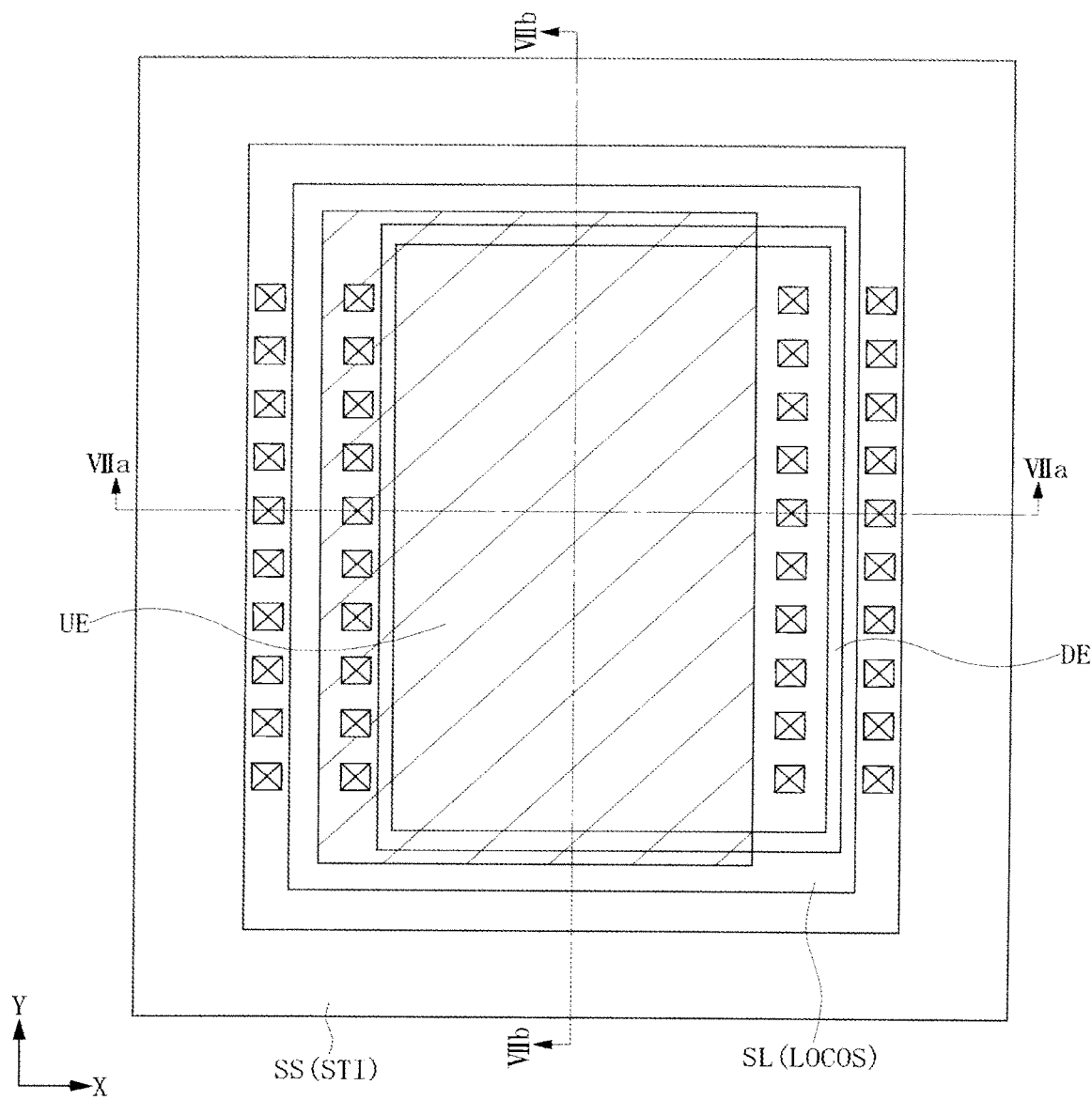
Figure 43:
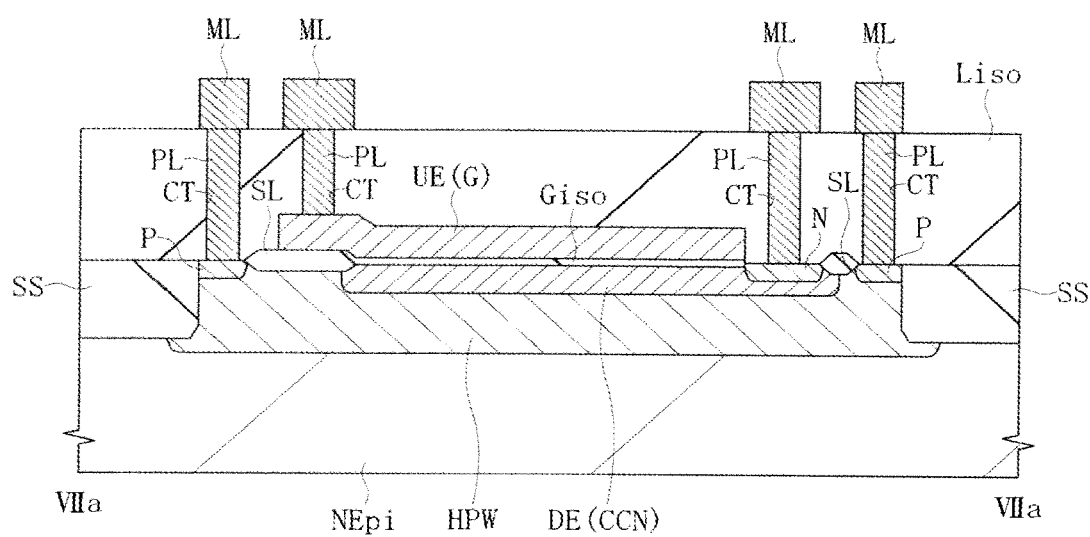
Figure 44:
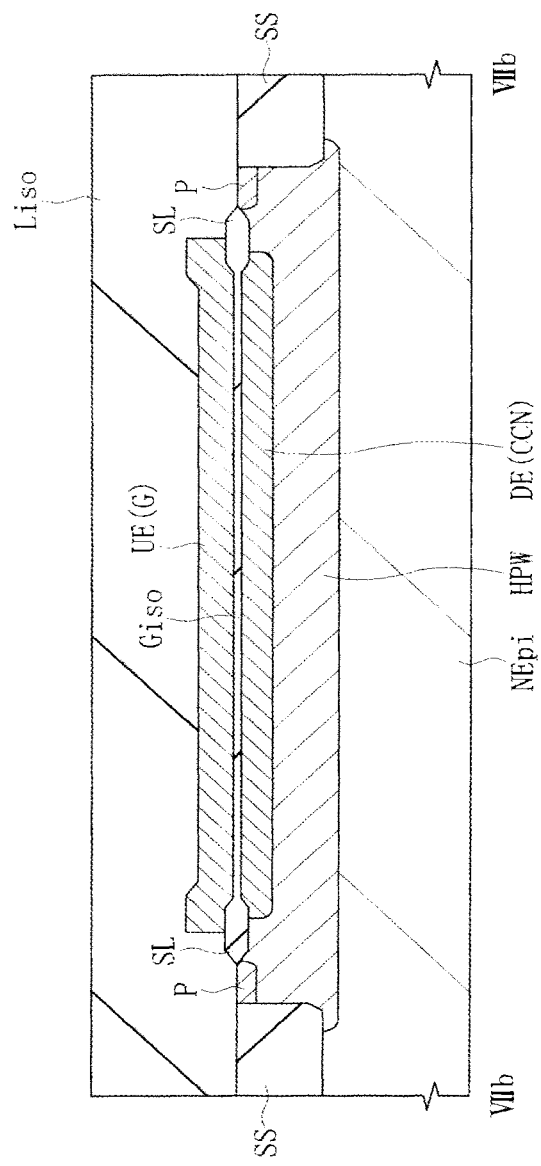
Figure 45:
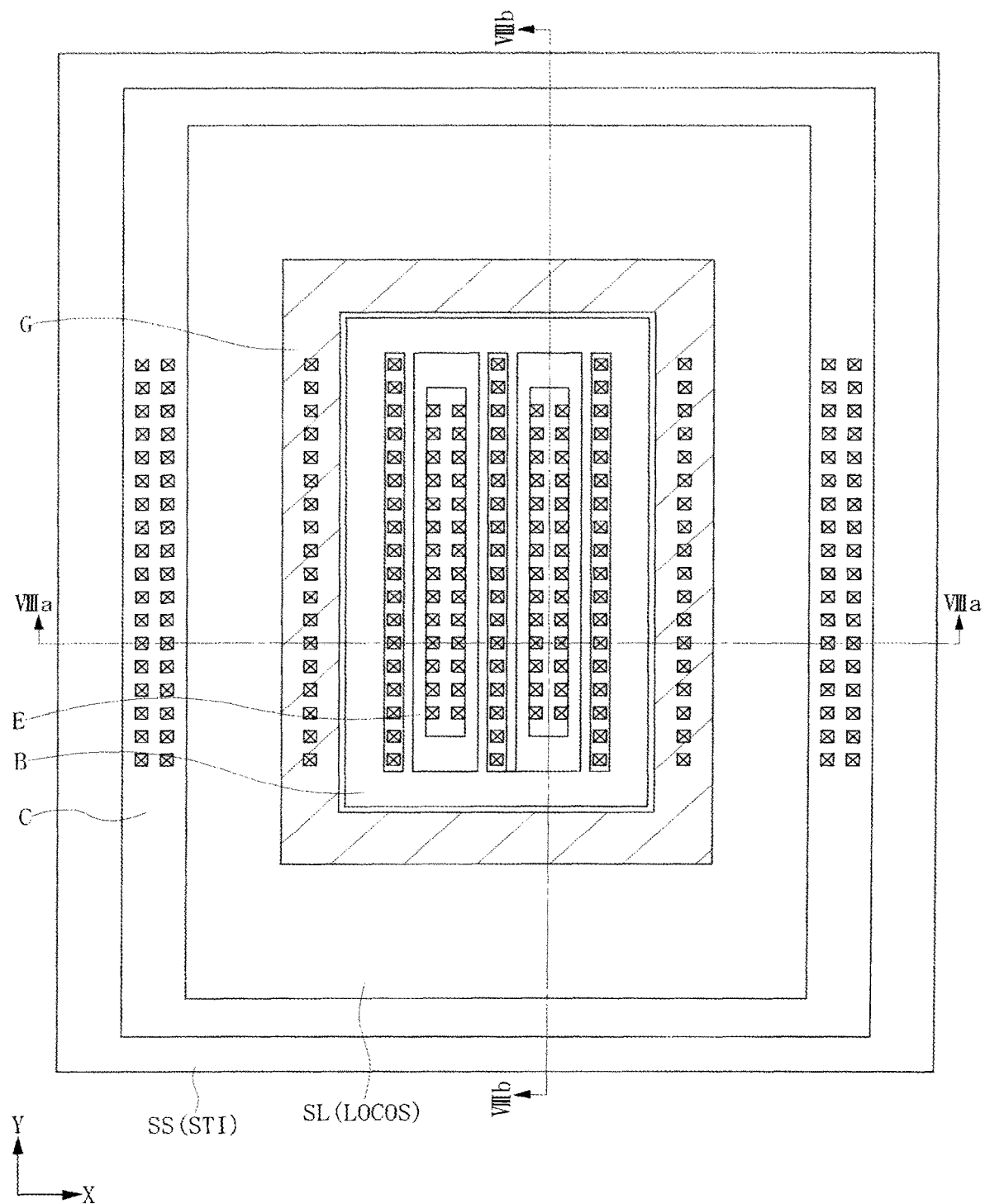
Figure 46:
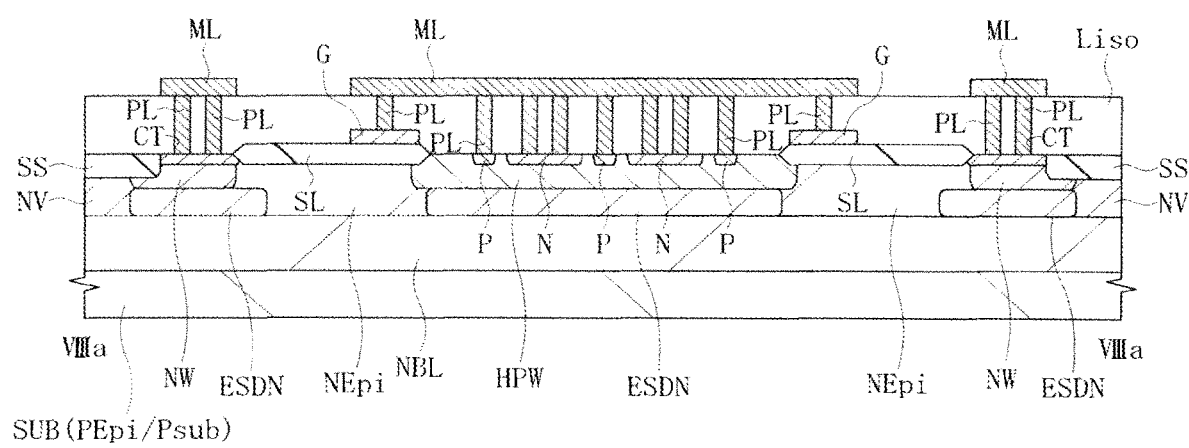
Figure 47:
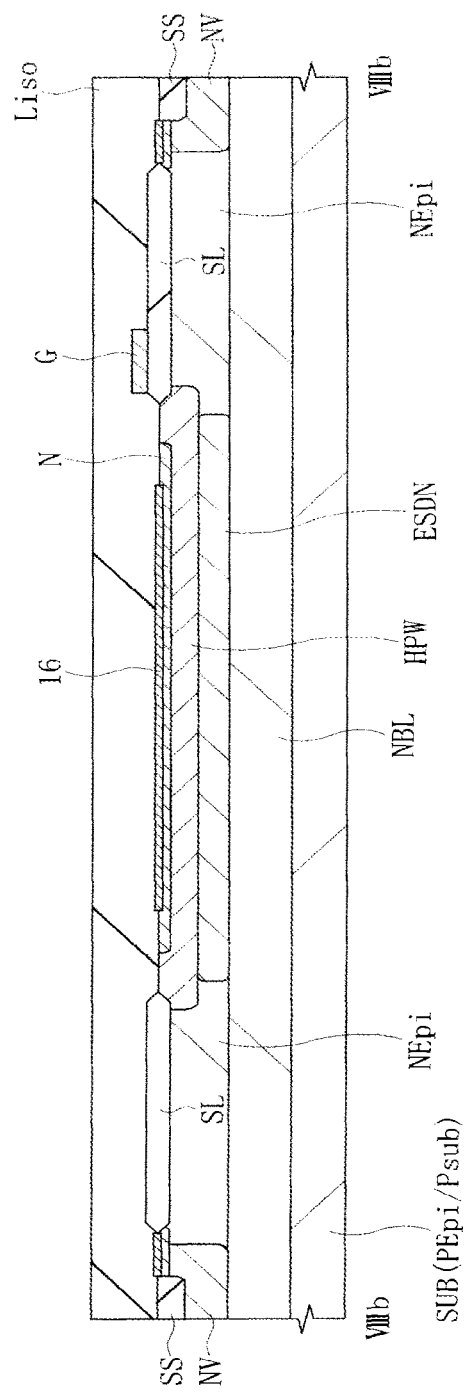
Figure 48:
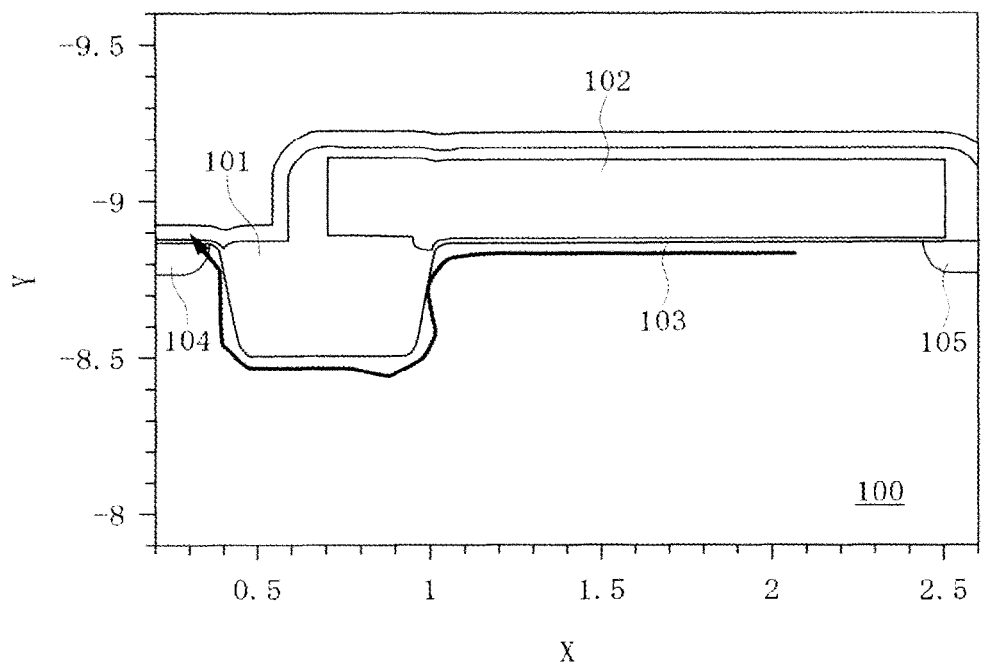
Figure 49:
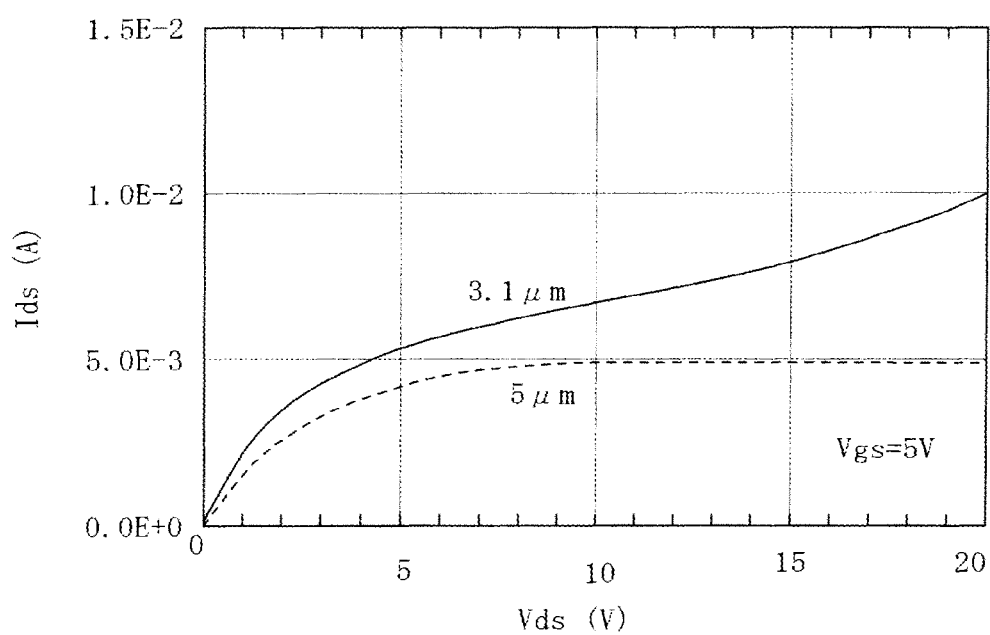
Figure 50:
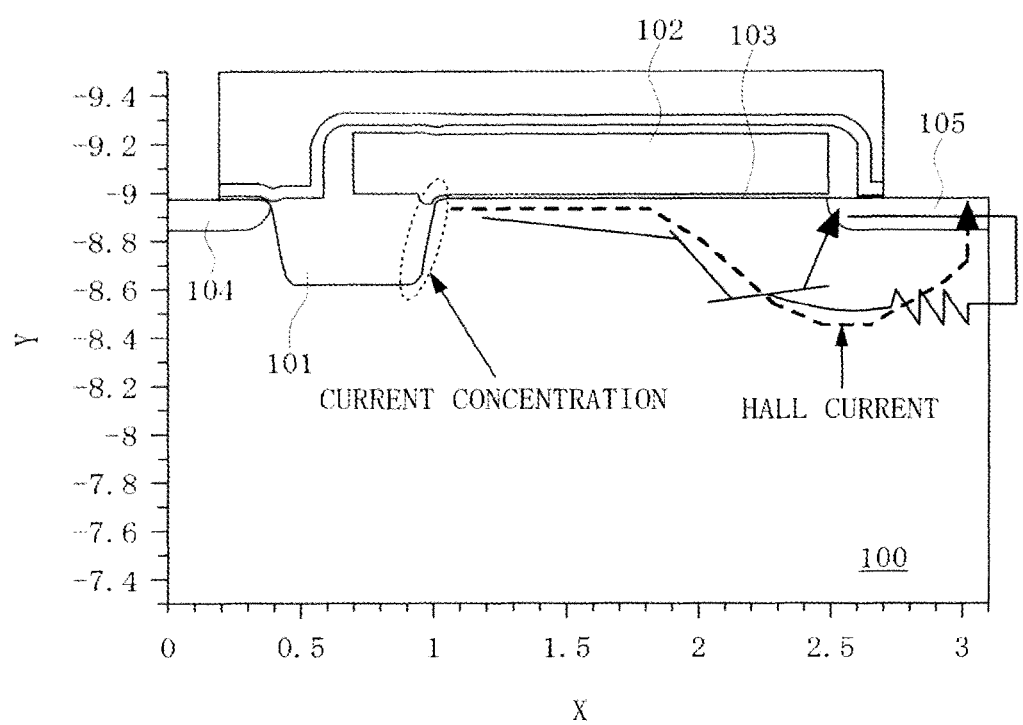
Figure 52:
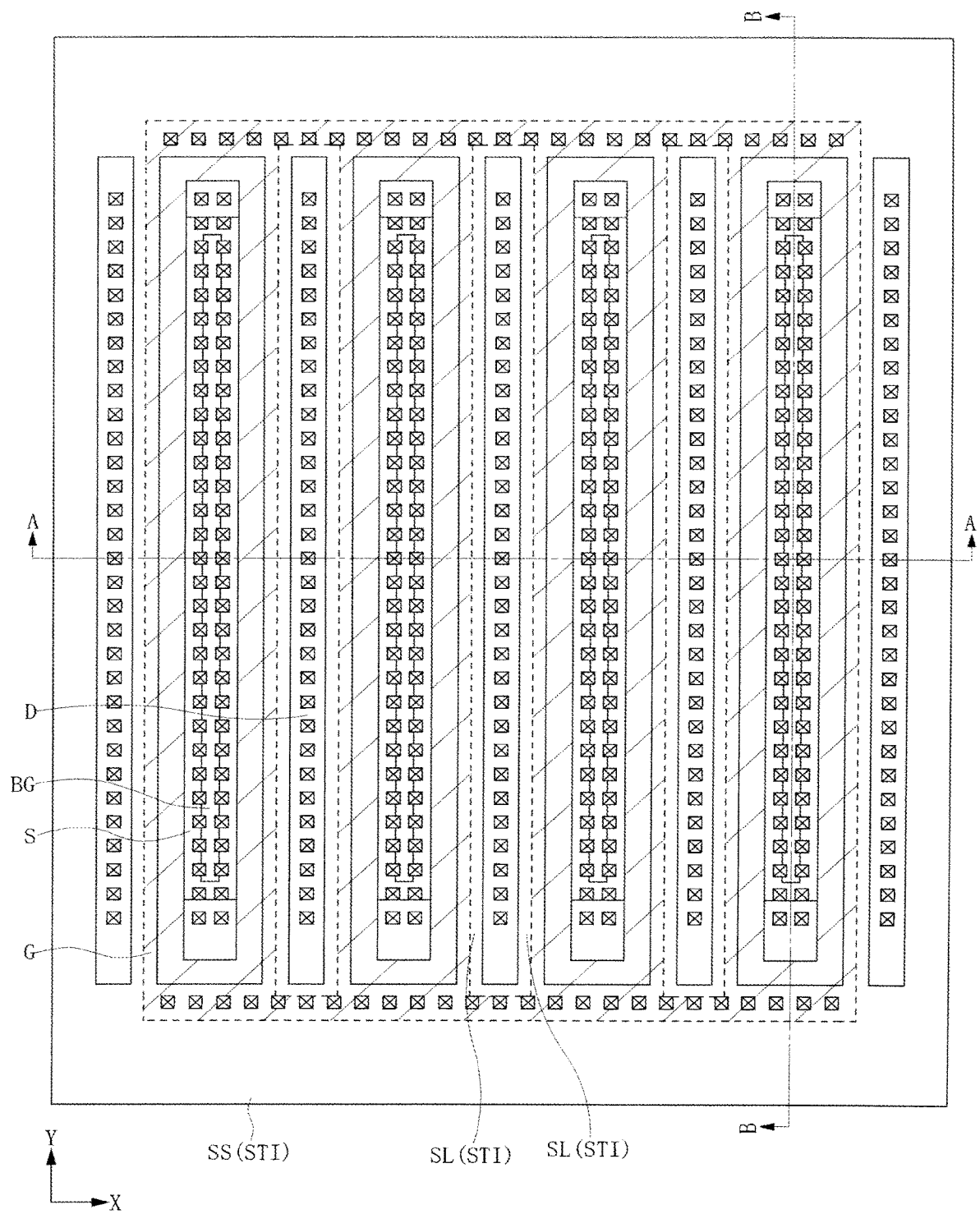
Figure 53:
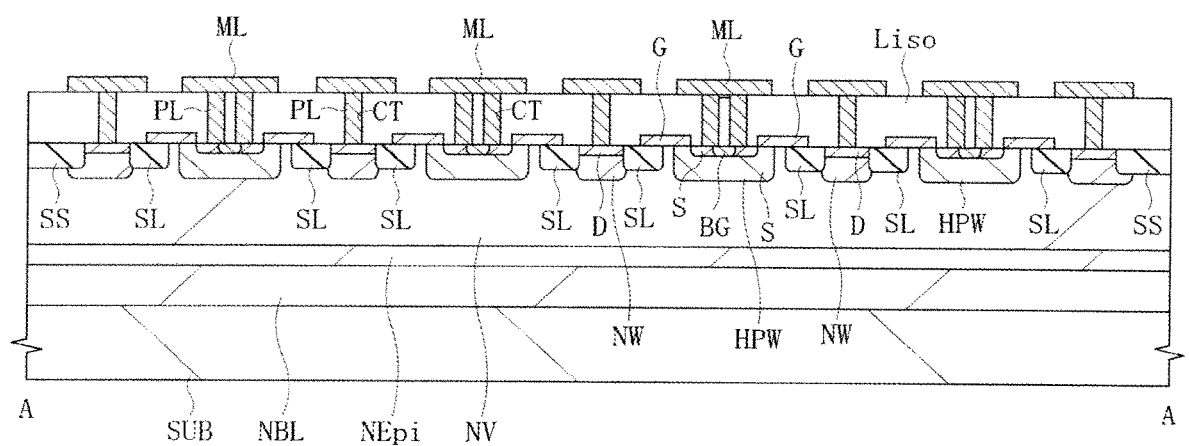
Figure 54:
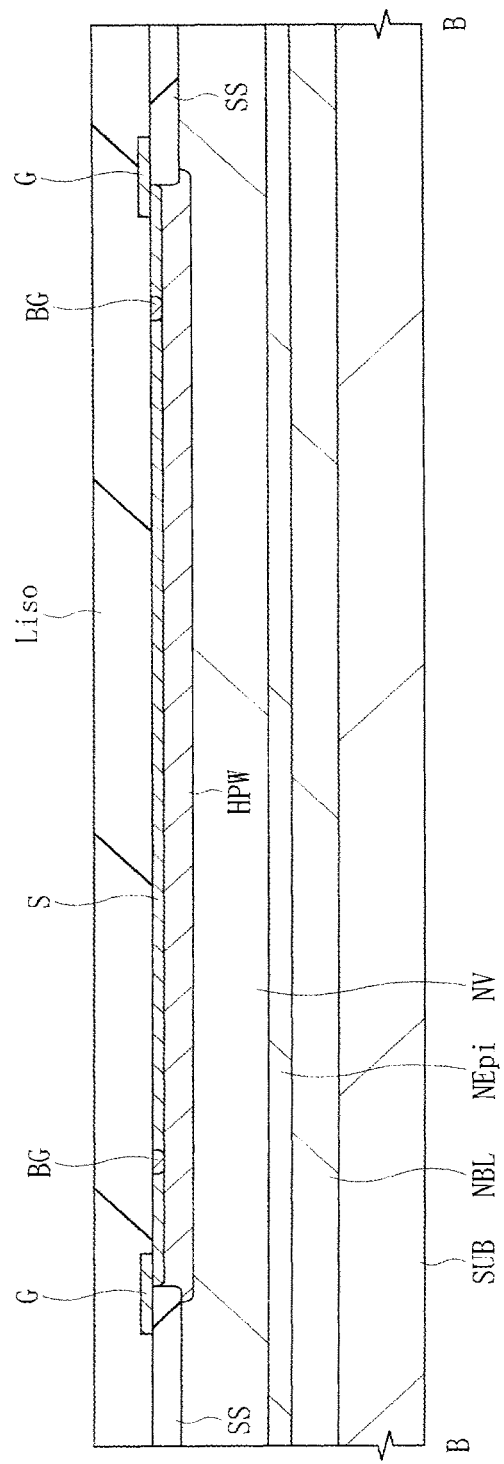

FIG. 5 illustrates an example of a simulation result of a static characteristic waveform (drain current (Ids)-drain voltage (Vds) characteristics) of the LDMOS device where LOCOS is adopted to a terrace insulating film according to the first embodiment of the present invention, where a solid line represents a static characteristic waveform of the LDMOS device having a terrace insulating film configured by LOCOS and a dotted line represents a static characteristic waveform of an LDMOS device having a terrace insulating film configured by STI;

FIGS. 6A and 6B illustrate enlarged cross-sectional views of main parts of the terrace insulating film according to the first embodiment of the present invention, FIG. 6A being a cross-sectional view of main parts of a terrace insulating film not in a recessed shape and FIG. 6B being a cross-sectional view of main parts of a terrace insulating film in a recessed shape;

FIG. 7 is a schematic plan view of main parts for describing a basic structure of the nLDMOS devices according to the first embodiment of the present invention;

FIG. 8 is a plan view of main parts of the nLDMOS devices according to the first embodiment of the present invention;

FIG. 9 is a cross-sectional view of main parts taken along a Ia-Ia line in FIG. 8;

FIGS. 10A, 10B, and 10C are cross-sectional views of main parts taken along a Ib-Ib line in FIG. 8;

FIG. 11 is a schematic plan view of main parts for describing a basic structure of a first modification example of the nLDMOS devices according to the first embodiment;

FIG. 12 is a schematic plan view of main parts for describing a basic structure of a second modification example of the nLDMOS devices according to the first embodiment;

FIG. 13 is a schematic plan view of main parts for describing the basic structure of a third modification example of the nLDMOS devices according to the first embodiment;

FIGS. 14A, 14B, and 14C are plan views of main parts for describing a terrace insulating film of a fourth modification example of the nLDMOS device according to the first embodiment;

FIG. 15 is a cross-sectional view of main parts of the semiconductor device, illustrating a process of manufacturing the semiconductor device according to the first embodiment of the present invention;

FIG. 16 is a cross-sectional view of main parts at the same position as that in FIG. 15 in the process of manufacturing the semiconductor device continued from FIG. 15;

FIG. 17 is a cross-sectional view of main parts at the same position as that in FIG. 15 in the process of manufacturing the semiconductor device continued from FIG. 16;

FIG. 18 is a cross-sectional view of main parts at the same position as that in FIG. 15 in the process of manufacturing the semiconductor device continued from FIG. 17;

FIG. 19 is a cross-sectional view of main parts at the same position as that in FIG. 15 in the process of manufacturing the semiconductor device continued from FIG. 18;

FIG. 20 is a cross-sectional view of main parts at the same position as that in FIG. 15 in the process of manufacturing the semiconductor device continued from FIG. 19;

FIG. 21 is a cross-sectional view of main parts at the same position as that in FIG. 15 in the process of manufacturing the semiconductor device continued from FIG. 20;

FIG. 22 is a cross-sectional view of main parts at the same position as that in FIG. 15 in the process of manufacturing the semiconductor device continued from FIG. 21;

FIG. 23 is a cross-sectional view of main parts at the same position as that in FIG. 15 in the process of manufacturing the semiconductor device continued from FIG. 22;

FIG. 24 is a cross-sectional view of main parts at the same position as that in FIG. 15 in the process of manufacturing the semiconductor device continued from FIG. 23;

FIG. 25 is a cross-sectional view of main parts at the same position as that in FIG. 15 in the process of manufacturing the semiconductor device continued from FIG. 24;

FIG. 26 is a schematic plan view of main parts for describing a basic structure of nLDMOS devices according to a second embodiment of the present invention;

FIG. 27 is a plan view of main parts of the nLDMOS devices according to the second embodiment of the present invention;

FIG. 28 is a cross-sectional view of main parts taken along a IIa-IIa line in FIG. 27;

FIGS. 29A and 29B are cross-sectional views of main parts taken along a IIb-IIb line in FIG. 27;

FIG. 30 is a schematic plan view of main parts for describing a basic structure of a first modification example of the nLDMOS devices according to the second embodiment of the present invention;

FIG. 31 is a plan view of main parts of completely-isolated nLDMOS devices according to a third embodiment of the present invention;

FIG. 32 is a cross-sectional view of main parts taken along a IIIa-IIIa line in FIG. 31;

FIG. 33 is a cross-sectional view of main parts taken along a IIIb-IIIb line in FIG. 31;

FIG. 34 is a schematic plan view of main parts for describing a basic structure of a high-withstand voltage pMIS according to a fourth embodiment of the present invention;

FIG. 35 is a plan view of main parts of the high-withstand voltage pMIS according to the fourth embodiment of the present invention;

FIG. 36 is a cross-sectional view of main parts taken along a IVa-IVa line in FIG. 35;

FIG. 37 is a cross-sectional view of main parts taken along a IVb-IVb line in FIG. 35;

FIG. 38 is a plan view of main parts of a high-withstand voltage Schottky barrier diode according to a fifth embodiment of the present invention;

FIG. 39 is a cross-sectional view of main parts taken along a V-V line in FIG. 38;

FIG. 40 is a plan view of main parts of a high-withstand voltage capacitor according to a sixth embodiment of the present invention;

FIG. 41 is a cross-sectional view of main parts taken along a VI-VI line in FIG. 40;

FIG. 42 is a plan view of main parts of a capacitor-doped capacitor according to a seventh embodiment of the present invention;

FIG. 43 is a cross-sectional view of main parts taken along a VIIa-VIIa line in FIG. 42;

FIG. 44 is a cross-sectional view of main parts taken along a VIIb-VIIb line in FIG. 42;

FIG. 45 is a plan view of main parts of an npn bipolar-type high-withstand voltage ESD (electrostatic breakdown) protective element according to an eighth embodiment of the present invention;

FIG. 46 is a cross-sectional view of main parts taken along a VIIIa-VIIIa line in FIG. 45;

FIG. 47 is a cross-sectional view of main parts taken along a VIIIb-VIIIb line in FIG. 45;

FIG. 48 illustrates an example of a simulation result of an electron current distribution in a linear operation region of an LDMOS device where STI studied by the inventors is applied to a terrace insulating film prior to the invention of the present application;

FIG. 49 illustrates an example of a simulation result of static characteristic waveforms (drain current (Ids)-drain voltage (Vds) characteristics) of LDMOS devices where STI studied by the inventors is applied to a terrace insulating film prior to the invention of the present application, where a solid line represents a static characteristic waveform of an LDMOS device having a cell pitch of 3.1 μm and a dotted line represents a static characteristic waveform of an LDMOS device having a cell pitch of 5 μm;

FIG. 50 illustrates another example of a simulation result of a current distribution in a saturated operating region (with a maximum rated voltage of a drain region being 20 V and an actual operating voltage of a gate electrode being 5 V) of the LDMOS device where STI studied by the inventors is applied to a terrace insulating film prior to the invention of the present application;

FIGS. 51A and 51B are schematic plan views of main parts for describing the basic structure of first and second nLDMOS devices, respectively, studied by the inventors prior to the invention of the present application;

FIG. 52 is a plan view of main parts of the first nLDMOS device studied by the inventors prior to the invention of the present application;

FIG. 53 is a cross-sectional view of main parts taken along an A-A line in FIG. 52; and FIG. 54 is a cross-sectional view of main parts taken along a B-B line in FIG. 52.

BEST MODE FOR CARRYING OUT THE INVENTION

In the embodiments described below, the invention will be described in a plurality of sections or embodiments when required as a matter of convenience; however, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in some drawings used in the embodiments, hatching is used even in a plan view so as to make the drawings easy to see. Further, in the following embodiments, a MIS- FET (Metal Insulator Semiconductor Field Effect Transistor) is abbreviated as MIS, a p-channel type MISFET is abbreviated as pMIS, and an n-type MISFET is abbreviated as nMIS. Moreover, an n-channel type LDMOS device is abbreviated as nLDMOS device.

Also, components having the same function are denoted by the same reference symbols throughout the drawings for describing the following embodiments, and the repetitive description thereof is omitted. Hereinafter, embodiments of the present invention will be described in detail with reference to the accompanying drawings.

First Embodiment

A functional block diagram of a semiconductor device according to a first embodiment is illustrated in FIG. 1.

The semiconductor device is a power IC (Integrated Circuit) for use in a hard disk drive, and is configured of, for example, a logic control circuit block, a power circuit block, an analog circuit block, a logic internal power source C5, and an analog internal power source C6, and others. Furthermore, examples of the logic control circuit block include a logic control circuit part C1 and an I/O buffer (Input/Output Buffer) circuit part C2. Also, examples of the power circuit block include a spindle driver C3a, a voice coil motor driver C3b, a power switch C3c, a preamplifier negative potential power source C3d, and a micro actuator driver C3e. Furthermore, examples of the analog circuit block include a booster pressurizing circuit C4a, a current sensor C4b, and a voltage monitor C4c.

In the logic control circuit part C1, for example, a CMOS (Complementary Metal Oxide Semiconductor) device operating at 1.5 V is formed.

In the I/O buffer circuit part C2, for example, a CMOS device operating at 6 V is formed.

In the spindle driver C3a, the voice coil motor driver C3b, and the power switch C3c mounted on the power circuit block, for example, an nLDMOS device or a Schottky barrier diode is formed. In the preamplifier negative potential power source C3d and the micro actuator driver C3e, for example, a full-isolation-type nLDMOS device is formed.

In the analog circuit block, for example, a CMOS device operating at 6 V, a high-withstand voltage pMIS, a capacitive element (a capacitive element having a terrace insulating film as a capacitance insulating film (hereinafter referred to as a high-withstand voltage capacitor) and a capacitive element having an insulating film of the same layer as that of the gate insulating film of the CMOS device as a capacitance insulating film (hereinafter referred to as a capacitor-doped capacitor)), resistor element, and a bipolar transistor are formed.

<Cross-Sectional Structure of Various Circuit Elements Configuring the Semiconductor Device>

Figure 2:
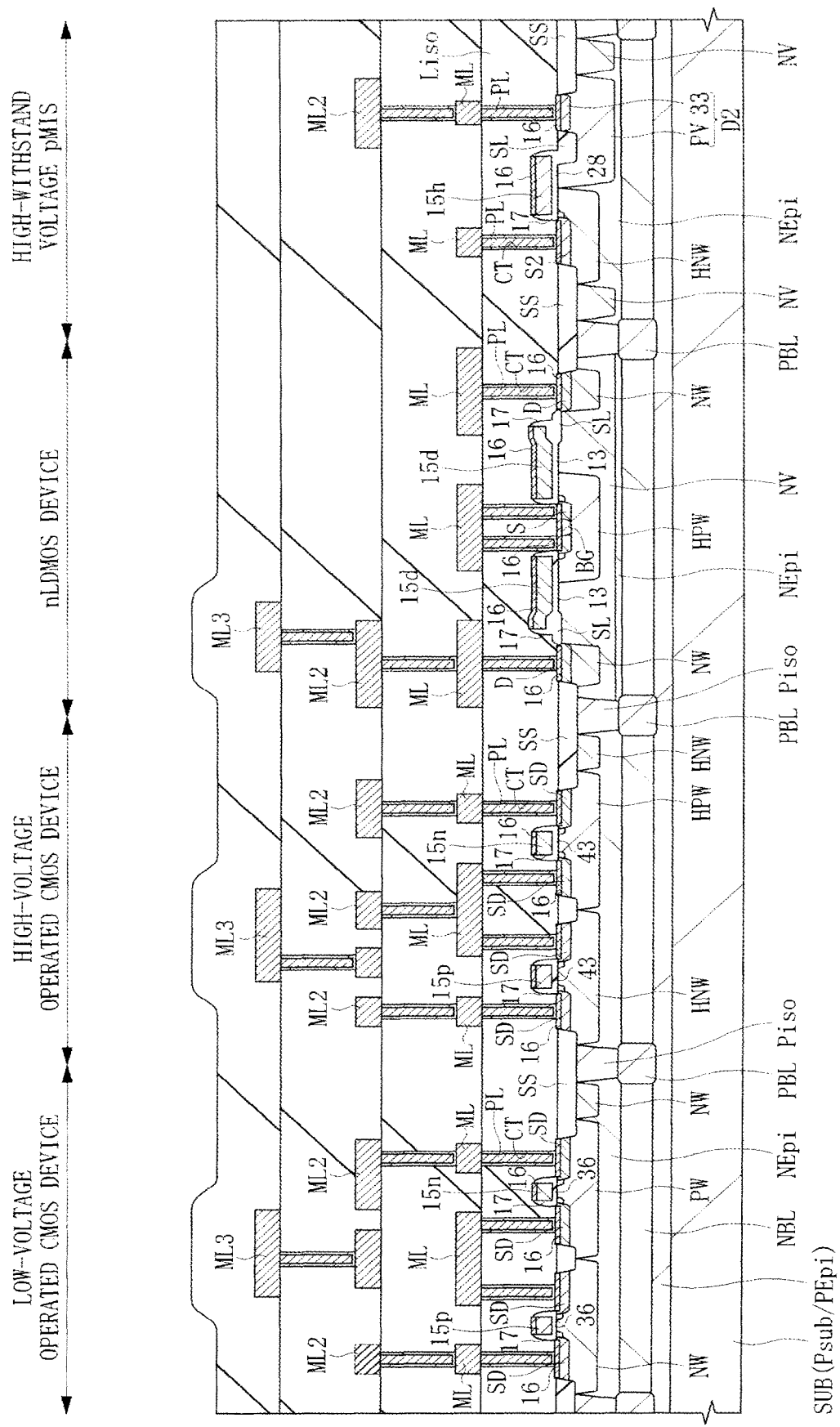
FIG. 2 is a cross-sectional view of main parts of semiconductor devices (an nLDMOS device, a high-withstand voltage pMIS, a low-voltage operation CMOS device, and a high-voltage operation CMOS device) according to the first embodiment of the present invention.
Figure 3A:
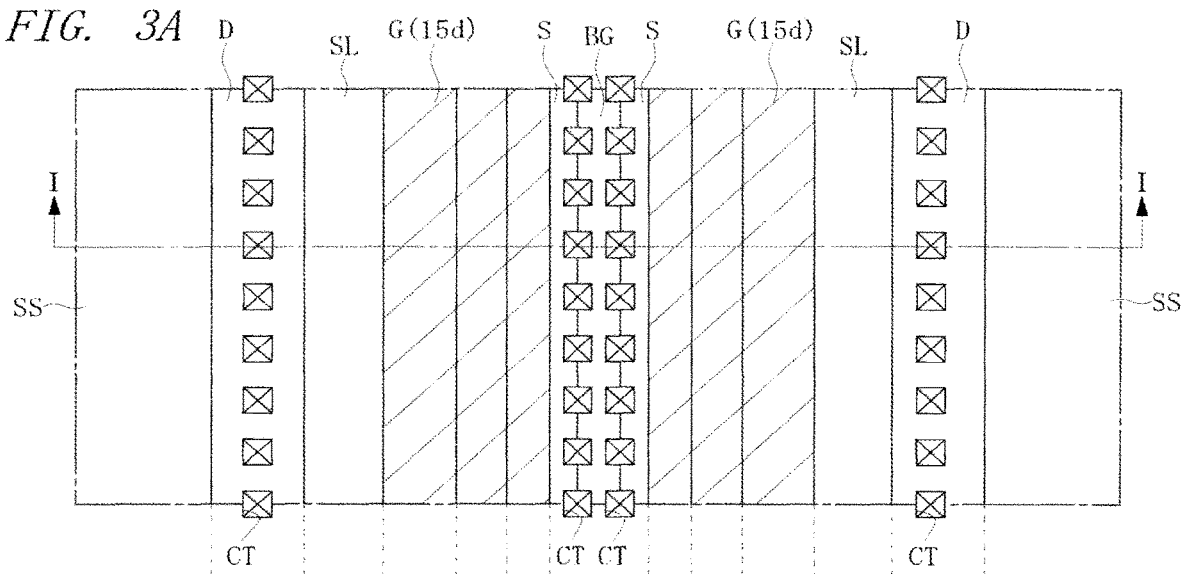
FIG. 3A is a plan view of main parts of the nLDMOS device according to the first embodiment of the present invention.
Figure 3B:
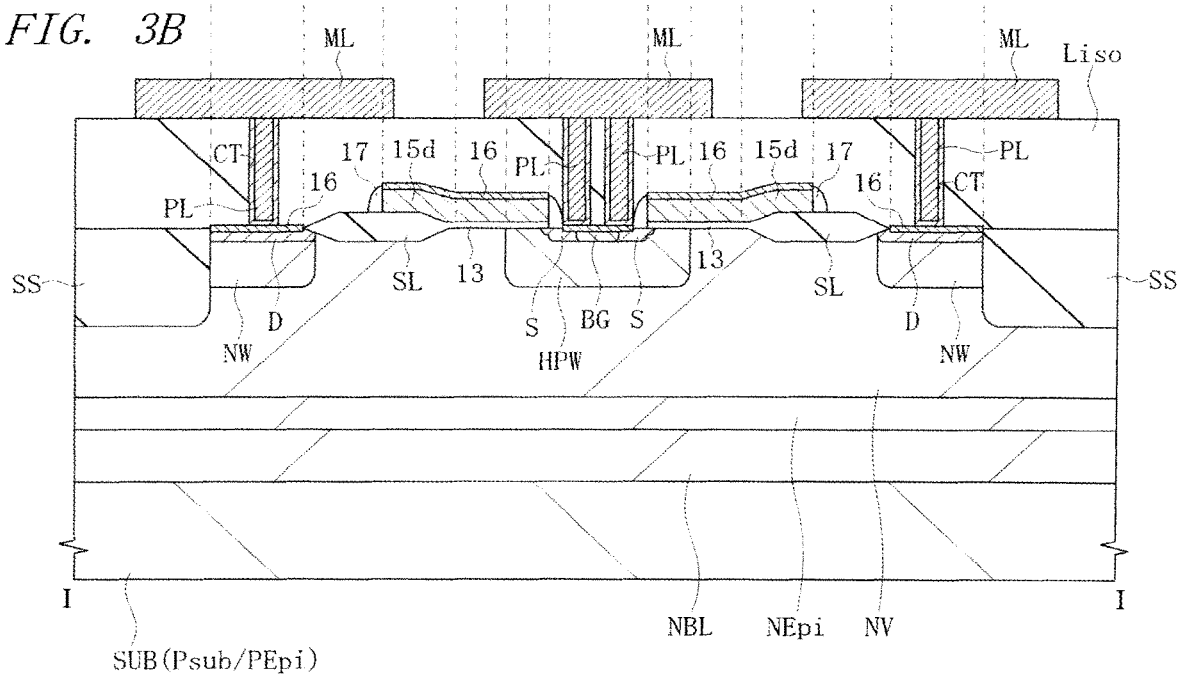
FIG. 3B is a cross-sectional view of main parts taken along an I-I line in FIG. 3A.

FIG. 2 illustrates a cross-sectional view of main parts of the semiconductor device according to the first embodiment, FIGS. 3A and 3B illustrate a plan view of main parts of the nLDMOS device formed in the power circuit block according to the first embodiment and a cross-sectional view of main parts taken along a I-I line of FIG. 3A. FIG. 2 only illustrates a CMOS device formed in the logic control circuit part C1 or the like and operating, for example, at 1.5 V (hereinafter, referred to as a low-voltage operating CMOS device), a CMOS device formed in the I/O buffer circuit part C2, the analog circuit block, and others and operating, for example, at 6 V (hereinafter, referred to as a high-voltage operating CMOS device), an nLDMOS device formed in the power circuit block, and a high-withstand voltage pMIS formed in the analog circuit block, and other elements are omitted. Also, FIG. 2 illustrates a cross-sectional view of main parts of the low-voltage operating CMOS device, the high-voltage operating CMOS device, the nLDMOS device, and the high-withstand voltage pMIS along a channel direction.

The plurality of circuit elements such as the low-voltage operating CMOS device, the high-voltage operating CMOS device, the nLDMOS device, and the high-withstand voltage pMIS are formed on a main surface of a same substrate SUB. The substrate SUB is configured of a semiconductor substrate Psub formed of p-type single crystal silicon and a p-type epitaxial layer (a p-type semiconductor layer) PEpi formed on the semiconductor substrate Psub. Furthermore, on the p-type epitaxial layer PEpi, an n-type epitaxial layer (an n-type semiconductor layer) NEpi is formed via an n-type buried layer NBL.

Each circuit element is formed on the n-type epitaxial layer NEpi. In a periphery of the n-type epitaxial layer NEpi (side portion and bottom portion) of a region where each circuit element is formed, a device isolation portion SS formed by STI on a main surface of the n-type epitaxial layer NEpi, a p-type junction isolating part Piso formed on the n-type epitaxial layer NEpi under the device isolation portion SS, a p-type buried layer PBL formed on the p-type epitaxial layer PEpi under the p-type junction isolating part Piso, and the n-type buried layer NBL are formed. That is, the region where each circuit element is formed is surrounded by the device isolation portion SS, the p-type junction isolating part Piso, the p-type buried layer PBL, and the n-type buried layer NBL to be electrically isolated from a region where adjacent other circuit elements are formed. The device isolation portion SS has a function of preventing interference between circuit elements formed on the n-type epitaxial layer NEpi, and is formed by an STI method of forming a groove in the n-type epitaxial layer NEpi and embedding an insulating film inside this groove. Note that the device isolation portion SS (STI) has a depth on the order of 250 nm to 350 nm.

First, the structure of the nLDMOS device is described in detail.

The nLDMOS device is, for example, a high-withstand voltage device for 20 V. As illustrated in FIGS. 2 and 3, an n-type well NV is formed on a main surface of the n-type epitaxial layer NEpi in the nLDMOS device formation region. To the n-type well NV, n-type impurities such as phosphorus (P) or arsenic (As) are introduced.

On the main surface of the n-type epitaxial layer NEpi where the n-type well NV is formed, a gate insulating film 13 is formed. This gate insulating film 13 is formed of, for example, silicon oxide, and has a thickness, for example, on the order of 13.5 nm. Also, on a drain region D side of the gate insulating film 13, the terrace insulating film SL is formed by LOCOS. This terrace insulating film SL is formed so as to be thinner than the device isolation portion SS formed by STI, and has a thickness of, for example, 70 to 200 nm, suitably on the order of 70 to 100 nm. On a source region S side of the gate insulating film 13, the terrace insulating film SL described above is not formed.

On the gate insulating film 13, a gate electrode 15d is formed. This gate electrode 15d is formed of, for example, polycrystalline silicon, and has a thickness, for example, on the order of 250 nm. Also, an end of the gate electrode 15d on the drain region D side overrides the terrace insulating film SL. As such, by making the structure in which the gate electrode 15d on the drain region D side is lifted by using the terrace insulating film SL, an electric field between the gate electrode 15*d* and the drain region D of the nLDMOS device can be mitigated. Furthermore, a silicide film 16 is formed on the gate electrode 15*d*. This silicide film 16 is, for example, a cobalt silicide film, a nickel silicide film, or a platinum silicide film.

Sidewalls 17 are formed on side walls on both sides of a stacked film of the gate electrode 15*d* and the gate insulating film 13.

The nLDMOS device has a source region S having an LDD (Lightly Doped Drain) structure configured of an n-type extension region and an n-type diffusion region. The n-type extension region is formed straight below the sidewall 17 on the source region S side, and the n-type diffusion region is formed outside this n-type extension region. To the n-type extension region and the n-type diffusion region, n-type impurities such as P or As are introduced. To the n-type diffusion region, n-type impurities are introduced with a higher concentration compared with the n-type extension region. With provision of the n-type extension region, fluctuations in threshold voltage of the nLDMOS device in high-temperature operation or high-temperature and high-voltage operation can be inhibited.

Also, the source region S is surrounded by a p-type well HPW. This p-type well HPW is diffused under the gate electrode 15*d* and is also formed on part of a region under the gate electrode 15*d*. In the nLDMOS device for 20 V, a breakdown voltage is determined at a junction part between the n-type well NV and the p-type well HPW. Therefore, the impurity concentration of the n-type well NV is set to be lower than the impurity concentration of the n-type extension region and the n-type diffusion region configuring the source region S.

Furthermore, a p-type back-gate layer BG is formed at a center part of the source region S. This p-type back-gate layer BG is in contact with the n-type diffusion region configuring part of the source region S. By providing the p-type back-gate layer BG, a voltage clamp of the p-type well HPW can be strengthened, and a lowering of on-state breakdown voltage due to a parasitic npn (n-type well NV-p-type well HPW-source region S (n-type diffusion region)) operation can be prevented.

On a surface of the source region S and the p-type back-gate layer BG, the silicide film 16 is formed in the same process as that of the silicide film 16 formed on the gate electrode 15*d*.

The nLDMOS device has the drain region D configured of an n-type diffusion region. To the n-type diffusion region, n-type impurities such as P or As are introduced, and the n-type diffusion region can be formed in the same process as that of the n-type diffusion region configuring part of the source region S.

Also, the drain region D is surrounded by the n-type well NW. The n-type well NV is formed straight below the terrace insulating film SL overridden by an end of the gate electrode 15*d* on the drain region D side. When a junction is directly made between the n-type well NV and the drain region D, in a high-current and high-voltage operation, a current and an electric filed concentrate on a junction part between the n-type well NV and the drain region D to form a hot spot, and therefore the nLDMOS device is prone to breakage. To address this, as a mitigating layer for preventing this, the n-type well NW is formed between the n-type well NV.

On a surface of the drain region D, the silicide film 16 is formed in the same process as that of the silicide film 16 formed on the gate electrode 15*d*.

Also, the nLDMOS device is covered with an interlayer insulating film Liso. In this interlayer insulating film Liso, a plurality of contact holes CT reaching, for example, the source region S, the p-type back-gate layer BG, and the drain region D, are formed. Furthermore, via plugs PL formed of a conductive material and buried inside the plurality of contact holes CT, a wiring layer ML electrically connecting to, for example, the source region S, the p-type back-gate layer BG, and the drain region D, is formed.

Next, the structure of the high-withstand voltage pMIS is described in detail.

The high-withstand voltage pMIS is, for example, a high-withstand voltage device for 20 V. As illustrated in FIG. 2, a gate insulating film 28 is formed on a main surface of an n-type epitaxial layer NEpi in the high-withstand voltage pMIS formation region. This gate insulating film 28 is formed of, for example, silicon oxide, and has a thickness, for example, on the order of 13.5 nm. Also, on a drain region D2 side of the gate insulating film 28, the terrace insulating film SL is formed by STI. On a source region S2 side of the gate insulating film 28, the terrace insulating film SL described above is not formed.

On the gate insulating film 28, a gate electrode 15*h* is formed. This gate electrode 15*h* is formed of, for example, polycrystalline silicon, and has a thickness, for example, on the order of 250 nm. Also, an end of the gate electrode 15*h* on the drain region D2 side overrides the terrace insulating film SL. As such, by making the structure in which the gate electrode 15*h* on the drain region D2 side is lifted by using the terrace insulating film SL, an electric field between the gate electrode 15*h* and the drain region D2 of the high-withstand voltage pMIS can be mitigated. Furthermore, a silicide film 16 is formed on the gate electrode 15*h*. This silicide film 16 is, for example, a cobalt silicide film, a nickel silicide film, or a platinum silicide film.

Sidewalls 17 are formed on side walls on both sides of a stacked film of the gate electrode 15*h* and the gate insulating film 28.

The high-withstand voltage pMIS has a source region S2 configured of a p-type extension region and a p-type diffusion region. The p-type extension region is formed straight below the sidewall 17 on the source region S2 side, and the p-type diffusion region is formed outside the p-type extension region. To the p-type extension region and the p-type diffusion region, p-type impurities such as boron (B) are introduced. Also, the p-type extension region and the p-type diffusion region configuring the source region S2 are surrounded by an n-type well HNW. This n-type well HNW is diffused under the gate electrode 15*h* and is also formed on part of a region under the gate electrode 15*h*. The impurity concentration of the n-type well HNW is set to be lower than the impurity concentration of the p-type diffusion region configuring the source region S2.

On a surface of the source region S2, the silicide film 16 is formed in the same process as that of the silicide film 16 formed on the gate electrode 15*h*.

Also, the high-withstand voltage pMIS has a drain region D2 configured of a p-type diffusion region PV and a p-type diffusion region 33. The p-type diffusion region PV is formed so as to surround the circumference (side portion and bottom portion) of the terrace insulating film SL. Furthermore, the p-type diffusion region 33 is formed on an opposite side of the gate electrode 15*h* via the terrace insulating film SL, and the circumference (side portion and bottom portion) of this p-type diffusion region 33 is surrounded by the p-type diffusion region PV. To the p-type diffusion region PV and the p-type diffusion region 33, p-type impurities such as B are introduced, and the impurity concentration of the p-type diffusion region 33 is identical to the impurity concentration of the p-type diffusion region configuring part of the source region S2, but the impurity concentration of the p-type diffusion region PV is set to be lower than the impurity concentration of the p-type diffusion region configuring the source region S2.

On a surface of the p-type diffusion region 33 configuring part of the drain region D2, the silicide film 16 is formed in the same process as that of the silicide film 16 formed on the gate electrode 15h.

The high-withstand voltage pMIS is covered with an interlayer insulating film Liso. In this interlayer insulating film Liso, a plurality of contact holes CT reaching, for example, the source region S2 and the p-type diffusion region 33 configuring part of the drain region D2, are formed. Furthermore, via plugs PL configured of a conductive material and buried inside the plurality of contact holes CT, a wiring layer ML electrically connecting to, for example, the source region S2 and the p-type diffusion region 33 configuring part of the drain region D2, is formed.

Next, the structure of the low-voltage operation CMOS device is described in detail.

The low-voltage operation CMOS device is configured of, as illustrated in FIG. 2, a low-voltage nMIS and a low-voltage pMIS formed on an n-type epitaxial layer NEpi. A p-type well PW is formed on a main surface of an n-type epitaxial layer NEpi in the low-voltage nMIS formation region, and an n-type well NW is formed on the main surface of the n-type epitaxial layer NEpi in the low-voltage pMIS formation region. To the p-type well PW, p-type impurities such as B are introduced. To the n-type well NW, n-type impurities such as P or As are introduced.

Then, the structure of the low-voltage nMIS is described.

A gate insulating film 36 is formed on the p-type well PW formed on the main surface of the n-type epitaxial layer NEpi in the low-voltage nMIS formation region. This gate insulating film 36 is formed of, for example, silicon oxide, and has a thickness, for example, on the order of 3.7 nm. On the gate insulating film 36, a gate electrode 15n is formed. This gate electrode 15n is formed of, for example, polycrystalline silicon, and has a thickness, for example, on the order of 250 nm. Furthermore, a silicide film 16 is formed on the gate electrode 15n. This silicide film 16 is, for example, a cobalt silicide film, a nickel silicide film, or a platinum silicide film.

Sidewalls 17 are formed on side walls on both sides of a stacked film of the gate electrode 15n and the gate insulating film 36. In the p-type well PW straight below these sidewalls 17, an n-type extension region is formed. Outside this n-type extension region, an n-type diffusion region is formed. To the n-type extension region and the n-type diffusion region, n-type impurities such as P or As are introduced, and the n-type impurities at a higher concentration are introduced to the n-type diffusion region compared with the n-type extension region. By the n-type extension region and the n-type diffusion region, source/drain regions SD of the low-voltage nMIS having an LDD structure are formed. Although not illustrated, in the p-type well PW straight below the gate electrode 15n, a channel region to which impurities for adjusting a threshold of the low-voltage nMIS are introduced is formed.

On a surface of the source/drain region SD, the silicide film 16 is formed in the same process as that of the silicide film 16 formed on the gate electrode 15n.

Then, the structure of the low-voltage pMIS is described.

A gate insulating film 36 is formed on the n-type well NW formed on the main surface of the n-type epitaxial layer NEpi in the low-voltage pMIS formation region. This gate insulating film 36 is formed of, for example, silicon oxide, and has a thickness, for example, on the order of 3.7 nm. On the gate insulating film 36, a gate electrode 15p is formed. This gate electrode 15p is formed of, for example, polycrystalline silicon, and has a thickness, for example, on the order of 250 nm. Furthermore, the silicide film 16 is formed on the gate electrode 15p. This silicide film 16 has the same structure as that of the silicide film 16 of the low-voltage nMIS described above.

Sidewalls 17 are formed on side walls on both sides of a stacked film of the gate electrode 15p and the gate insulating film 36. In the n-type well NW straight below these sidewalls 17, p-type extension regions, which are semiconductor regions, are formed. Outside this p-type extension region, a p-type diffusion region is formed. To the p-type extension region and the p-type diffusion region, p-type impurities such as B are introduced, and the p-type impurities with higher concentration are introduced to the p-type diffusion region compared with the p-type extension region. With the p-type extension region and the p-type diffusion region, a source/drain region SD of the low-voltage pMIS having an LDD structure is formed. Although not illustrated, in the n-type well NW straight below the gate electrode 15p, a channel region to which impurities for adjusting a threshold of the low-voltage pMIS are introduced is formed.

On a surface of the source/drain region SD, the silicide film 16 is formed in the same process as that of the silicide film 16 formed on the gate electrode 15p.

The low-voltage operation CMOS device is covered with an interlayer insulating film Liso. In this interlayer insulating film Liso, a plurality of contact holes CT reaching the source/drain regions SD of the low-voltage nMIS, the source/drain regions SD of the low-voltage pMIS, and others are formed. Furthermore, via plugs PL configured of a conductive material and buried inside the plurality of contact holes CT, the wiring layer ML electrically connecting to, for example, the source/drain regions SD of the low-voltage nMIS and the source/drain regions SD of the low-voltage pMIS, is formed.

Next, the structure of the high-voltage operation CMOS device is described in detail.

The high-voltage operation CMOS device is configured of, as illustrated in FIG. 2, a high-voltage nMIS and a high-voltage pMIS formed on the n-type epitaxial layer NEpi. A p-type well HPW is formed on the main surface of the n-type epitaxial layer NEpi in the high-voltage nMIS formation region, and an n-type well HNW is formed on the main surface of the n-type epitaxial layer NEpi in the high-voltage pMIS formation region. To the p-type well HPW, p-type impurities such as B are introduced. To the n-type well HNW, n-type impurities such as P or As are introduced.

The structure of the high-voltage nMIS is similar to the structure of the low-voltage nMIS described above, but a gate insulating film 43 of the high-voltage nMIS has a thickness larger than the thickness of the gate insulating film 36 of the low-voltage nMIS. The thickness of the gate insulating film 43 is, for example, on the order of 13.5 nm. Also, an n-type extension region of the high-voltage nMIS is formed so as to have an impurity concentration lower than the impurity concentration of the n-type extension region of the low-voltage nMIS.

The structure of the high-voltage pMIS is similar to the structure of the low-voltage pMIS described above, but a gate insulating film 43 of the high-voltage pMIS has a thickness larger than the thickness of the gate insulating film 36 of the low-voltage pMIS. The thickness of the gate insulating film 43 is, for example, on the order of 13.5 nm. Also, a p-type extension region of the high-voltage pMIS is formed so as to have an impurity concentration lower than the impurity concentration of the p-type extension region of the low-voltage pMIS.

Also, the high-voltage operation CMOS device is covered with the interlayer insulating film Liso. In this interlayer insulating film Liso, a plurality of contact holes CT reaching the source/drain region SD of the high-voltage nMIS, the source/drain region SD of the high-voltage pMIS, and others are formed. Furthermore, via plugs PL configured of a conductive material and buried inside the plurality of contact holes CT, the wiring layer ML electrically connecting to, for example, the source/drain regions SD of the high-voltage nMIS and the source/drain regions SD of the high-voltage pMIS, is formed. On an upper layer of the wiring layer ML formed in the nLDMOS device, the high-withstand voltage pMIS, the low-voltage operation CMOS device, and the high-voltage operation CMOS device, wiring layers ML2 and ML3 are further formed via interlayer insulating films.

<Basic Structure of nLDMOS Device>

Next, the structure and characteristic of the nLDMOS device where LOCOS is adopted to a terrace insulating film according to the first embodiment are described in detail below.

1. Regarding On-Resistance of the nLDMOS Device

Figure 4:
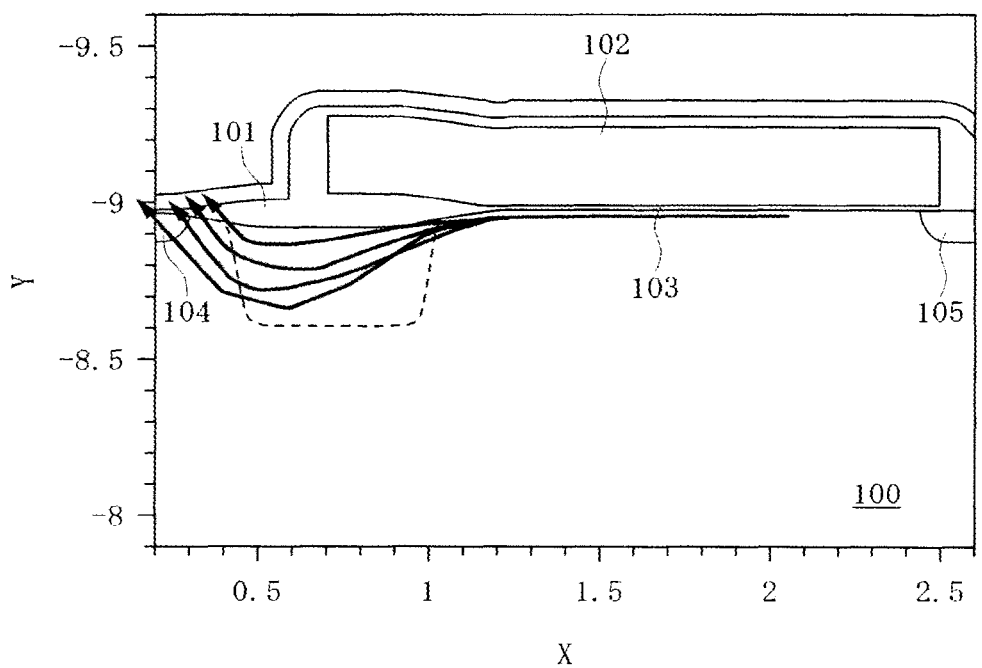
FIG. 4 illustrates an example of a simulation result of an electron current distribution in a linear operation region of an LDMOS device where LOCOS is adopted to a terrace insulating film according to the first embodiment of the present invention.

FIG. 4 illustrates an example of a simulation result of an electron current distribution in a linear operation region of the nLDMOS device where LOCOS is applied to a terrace insulating film according to the first embodiment. In the drawing, a reference numeral 100 denotes a silicon (Si) substrate, a reference numeral 101 denotes a terrace insulating film, a reference numeral 102 denotes a gate electrode, a reference numeral 103 denotes a gate insulating film, a reference numeral 104 denotes a drain region, and a reference numeral 105 denotes a source region. The cell pitch (the distance between a center part of the source region and a center part of the drain region) is 3.1 µm.

As illustrated in FIG. 4, when LOCOS is used for a terrace insulating film, it can be found that the region where the current flows is widened and the current route is widened, compared with the case of using STI for a terrace insulating film (refer to FIG. 48 described above). As the current route widened, the on-resistance can be reduced. From the simulation result illustrated in FIG. 4, an on-resistance of 12 mΩ·mm² was obtained.

As such, by making the terrace insulating film being configured by LOCOS, Problem 1 (increase in on-resistance) explained above can be solved.

Note that the terrace insulating film SL (LOCOS) has a thickness smaller than a depth of the groove in which the device isolation portion SS (STI) is formed.

2. Regarding On-State Breakdown Voltage of the nLDMOS Device

FIG. 5 illustrates an example of a simulation result of a static characteristic waveform (drain current (Ids)-drain voltage (Vds) characteristics) of the nLDMOS device where LOCOS is applied to a terrace insulating film according to the first embodiment. The cell pitch (the distance between a center part of the source region and a center part of the drain region) is 3.1 µm.

As illustrated in FIG. 5, in the nLDMOS device using LOCOS for a terrace insulating film, a channel conductance (g), which is a gradient of the linear region, is large, compared with the nLDMOS device using STI for a terrace insulating film, and the on-resistance is reduced as described above. Also, the quasi-saturation characteristic is resolved, and a transition from the linear region to a saturated region is clear. Furthermore, lifting of the drain current in the drain high-voltage region is smaller than that of the nLDMOS device using STI for a terrace insulating film. The reason for all of these results can be considered such that, with the terrace insulating film configured by LOCOS, current concentration is mitigated to inhibit impact ionization and, as a result, to reduce an avalanche current. Therefore, by using LOCOS for the terrace insulating film, a desired on-state breakdown voltage can be obtained and a degradation in switching performance can be prevented even in an nLDMOS device having a cell pitch shorter than 5 µm.

As such, by making the terrace insulating film being configured by LOCOS, Problem 2 (lowering of on-state breakdown voltage) explained above can be solved.

3. Regarding Off-State Breakdown Voltage of the nLDMOS Device (Sectional Structure of the Terrace Insulating Film)

FIGS. 6A and 6B illustrate enlarged cross-sectional views of main parts of the terrace insulating film according to the first embodiment. FIG. 6A is a cross-sectional view of main parts of a terrace insulating film not in a recessed shape, and FIG. 6B is a cross-sectional view of main parts of a terrace insulating film in a recessed shape.

It has been found that the on-resistance and on-state breakdown voltage of the nLDMOS device are improved by configuring the terrace insulating film by LOCOS as described above. However, if the thickness of the terrace insulating film is set to be excessively thin, the off-state breakdown voltage between the drain region and the source region of the nLDMOS device (the gate electrode and the source region are short-circuited) is decreased. Thus, the thickness of the terrace insulating film is required to be determined according to the withstand voltage required. According to studies by the inventors, an off-state breakdown voltage larger than or equal to 25 V was obtained when the thickness of the terrace insulating film exceeded 70 nm. From this, it can be found that the thickness of the terrace insulating film can be set on the order of 100 nm in the nLDMOS device for 20 V, for example. That is, the thickness of the terrace insulating film SL (LOCOS) according to the first embodiment is on the order of 70 to 200 nm, suitably on the order of 70 to 100 nm.

However, as illustrated in FIG. 6B, when a part of the terrace insulating film SL has a recessed shape in which the main surface of the terrace insulating film SL falls from the main surface of the n-type epitaxial layer NEpi, the electric field is significantly intensified in the n-type epitaxial layer NEpi near the end of the terrace insulating film SL, thereby increasing impact ions. As a result, the off-state breakdown voltage of the nLDMOS device is lowered.

Thus, in the nLDMOS device according to the first embodiment, as illustrated in FIG. 6A, the terrace insulating film SL formed by LOCOS and not in a recessed shape is used. In this manner, a lowering of off-state breakdown voltage can be prevented.

4. Regarding the Planar Layout of Entire nLDMOS Devices

The structure of the LDMOS device according to the first embodiment is described by using FIGS. 7 to 10. FIG. 7 is a schematic plan view of main parts for describing the basic structure of the nLDMOS devices, FIG. 8 is a plan view of main parts of the nLDMOS devices, FIG. 9 is a cross-sectional view of main parts taken along a Ia-Ia line in FIG. 8, and FIGS. 10A, 10B, and 10C are cross-sectional views of main parts taken along a Ib-Ib line in FIG. 8.

As illustrated in FIG. 7, a plurality of nLDMOS devices are formed in an active region surrounded by a device isolation portion SS. Each nLDMOS device is configured of a source region S formed along a first direction (a Y direction in the drawing: a channel-width direction), a terrace insulating film SL formed in a periphery of the source region S with a predetermined distance (a channel length) away from the source region S, drain regions D formed on both sides of the source region S via the terrace insulating film SL in the periphery of the terrace insulating film SL, and a gate electrode G (indicated by a dotted line in FIG. 7) formed between the source region S and the drain region D so as to partially override the terrace insulating film SL.

Furthermore, the terrace insulating film SL formed on the nLDMOS device has a closed-loop structure surrounding the periphery of the source region S, and STI is not formed in the active region where the plurality of nLDMOS devices are formed, and the terrace insulating film SL and the device isolation portion SS are isolated from each other. Also, the terrace insulating film SL is formed by LOCOS, the device isolation portion is formed by STI, and their structures are thus different from each other.

Still further, the drain regions D are formed in the outermost periphery of the active region where the plurality of nLDMOS devices are formed, and these drain regions D function as a guard ring. The plurality of drain regions D formed between adjacent source regions S and the drain region D formed in the outermost periphery of the active region to function as a guard ring are connected. Therefore, all drain regions D formed in the active region are connected in a planar view. Also, a device isolation portion SS is formed in the periphery of the drain regions D formed in the outermost periphery of the active region and functioning as a guard ring. That is, the device isolation portion SS is formed by STI via the guard ring in the periphery of the active region in both of the first direction and a second direction orthogonal to the first direction (an X direction in the drawing: channel length direction).

Note that, while FIG. 7 exemplarily illustrates three nLDMOS devices sharing the drain regions D, this is not meant to be restrictive.

FIG. 8, FIG. 9, and FIG. 10A each illustrate a detailed structure of the nLDMOS devices illustrated in FIG. 7.

The nLDMOS devices are formed on an n-type epitaxial layer NEpi formed via an n-type buried layer NBL on a main surface of a substrate SUB. Also, the nLDMOS devices are formed in the active region surrounded by the device isolation portion SS formed by STI, and an n-type well NV is formed in the n-type epitaxial layer NEpi in the active region.

On a main surface of the n-type epitaxial layer NEpi, a gate electrode G is formed via a gate insulating film (illustration omitted). The gate electrode G is formed of, for example, polycrystalline silicon. The terrace insulating film SL is formed by LOCOS on a drain region D side of the gate electrode G, and an end of the gate electrode G on the drain region D side overrides the terrace insulating film SL. The terrace insulating film SL is not formed on a source region S side of the gate electrode G.

The source region S formed of an n-type semiconductor region on the n-type epitaxial layer NEpi is surrounded by a p-type well HPW. This p-type well HPW is diffused under the gate electrode G and is also formed on part of the n-type epitaxial layer NEpi under the gate electrode G. An impurity concentration of the n-type well NV is set to be lower than an impurity concentration of the semiconductor region configuring the source region S. Furthermore, a p-type back-gate layer BG is formed at a center part of the source region S.

The drain region D formed of an n-type semiconductor region on the n-type epitaxial layer NEpi is surrounded by the n-type well NW.

In the outermost periphery of the active region where the plurality of nLDMOS devices are formed, the drain region D functioning as a guard ring is formed. The plurality of drain regions D formed between adjacent source regions S and the drain region D formed in the outermost periphery of the active region to function as a guard ring are connected in a planar view. Furthermore, in the periphery of the drain region D formed in the outermost periphery of the active region to function as a guard ring, the device isolation portion SS is formed by STI, but STI is not formed in the active region.

The plurality of nLDMOS devices are covered with an interlayer insulating film Liso. In this interlayer insulating film Liso, a plurality of contact holes CT are formed. Via plugs PL buried in the plurality of contact holes CT, a wiring layer ML is electrically connected to the gate electrode G, the source regions S, the drain regions D, the p-type back-gate layer BG, and others.

Note that, while FIG. 8, FIG. 9, and FIG. 10A exemplarily illustrate four nLDMOS devices sharing the drain regions D, this is not meant to be restrictive.

Also, while an end of the p-type well HPW at an end in the first direction goes also under the terrace insulating film SL in FIG. 10A, the p-type well HPW is not necessarily required to have this structure. For example, as illustrated in FIG. 10B, the p-type well HPW may be formed so that the end of the p-type well HPW is positioned in the active region under the gate electrode G. Alternatively, as illustrated in FIG. 10C, the p-type well HPW may be formed so that the end of the p-type well HPW is positioned in the active region under the gate electrode G and the p-type diffusion region PV may be formed on the n-type epitaxial layer NEpi between the end of the p-type well HPW and the terrace insulating film SL.

As illustrated in FIG. 51 described above, the terrace insulating film SL has been formed by STI and connected to the device isolation portion SS formed by STI. Therefore, in addition to Problem 1 (increase in on-resistance) and Problem 2 (lowering of on-state breakdown voltage) described above, a decrease in degree of reliability of the nLDMOS devices due to a crystal defect caused by the structure of STI may occur.

However, in the first embodiment, since the terrace insulating film SL is configured by LOCOS and the device isolation portion SS is configured by STI, the problems of an increase in on-resistance and a lowering of on-state breakdown voltage described above can be prevented.

Furthermore, the terrace insulating film SL and the device isolation portion SS are not connected but are completely isolated from each other. In particular, as illustrated in FIG. 8 and FIGS. 10A to 10C, the terrace insulating film SL and the device isolation portion SS are isolated from each other in a gate width direction (Y direction) of the nLDMOS devices. Therefore, since STI is not formed in the active region, the influence of a crystal defect occurring due to the structure of STI and affecting the degree of reliability of the nLDMOS devices can be reduced. Also, a guard ring having the same potential as that of the drain regions D is provided in the outermost periphery of the active region where the plurality of nLDMOS devices are formed and, via this guard ring, the device isolation portion SS is formed in the periphery of the active region. In this manner, a parasitic MOS operation occurring between the plurality of nLDMOS devices and the device isolation portion SS can be prevented.

That is, if the terrace insulating film SL and the device isolation portion SS are formed without being isolated from each other, a crystal defect may occur from an end of the device isolation portion SS due to a thermal oxidation process at the time of forming the terrace insulating film SL. For this reason, as in the first embodiment, the terrace insulating film SL and the device isolation portion SS are isolated from each other. Also, in the gate length direction (X direction) and the gate width direction (Y direction) of the nLDMOS devices, the channel region of each nLDMOS device is surrounded by the terrace insulating film SL. Thus, even if a crystal defect occurs from the device isolation portion SS, the defect does not arrive at the channel region. Therefore, the degree of reliability of the nLDMOS device can be improved.

As such, by forming the device isolation portion SS formed by STI via the guard ring having the same potential as that of the drain regions D in the outermost periphery of the active region where the plurality of nLDMOS devices are formed, Problem. 3 (decrease in degree of reliability of nLDMOS devices due to a crystal defect caused by the structure of STI) can be solved, and further, a parasitic MOS operation occurring between the plurality of nLDMOS devices and the device isolation portion SS can be prevented.

Also, as illustrated in FIG. 8, the plugs PL for the gate electrodes G of the nLDMOS devices are formed on the terrace insulating films SL in a planar view. As this effect, even if the plug PL is formed at a place out of the gate electrode G due to mask misalignment or the like, the plug PL can be prevented from short-circuiting the drain region D or the source region S as long as the plug PL is on the terrace insulating film SL.

<Modification Examples of Structure of nLDOMOS Devices>

A first modification example of the nLDMOS devices according to the first embodiment is illustrated in FIG. 11. FIG. 11 is a schematic plan view of main parts for describing the basic structure of the first modification example of the nLDMOS devices.

In the nLDMOS devices of the first modification example, all gate electrodes G formed in the active region are connected in a planar view, and all terrace insulating films SL formed in the active region are all connected in a planar view. In this manner, the drain regions D formed between adjacent source regions S and the drain regions D formed in the outermost periphery of the active region to function as a guard ring are not connected in the nLDMOS devices of the first modification example, while these drain regions D are connected in a planar view in the nLDMOS devices illustrated in FIG. 7 described above.

That is, as illustrated in FIG. 11, the nLDMOS devices of the first modification example are configured of the source regions S formed along the first direction, the terrace insulating films SL each formed in the periphery of each source region S with a predetermined distance (channel length) away from the source region S, the drain regions D formed along the first direction on both sides of the source region S in the second direction via the terrace insulating film SL, and the gate electrodes G (indicated by dotted lines in FIG. 11) each formed between the source region S and the drain region D so as to partially override the terrace insulating film SL.

Furthermore, in the nLDMOS devices of the first modification example, the terrace insulating films SL formed along the first direction and the terrace insulating films SL formed along the second direction are all connected in a planar view at each end in the first direction, STI is not formed in the active region where the plurality of nLDMOS devices are formed, and the terrace insulating films SL formed by LOCOS and the device isolation portions SS formed by STI are isolated from each other.

Still further, in the nLDMOS devices of the first modification example, the gate electrodes G are formed along the second direction at each end in the first direction, and the gate electrodes G formed along the first direction and the gate electrodes G formed along the second direction are all connected in a planar view.

Still further, the drain region D is formed in the outermost periphery of the active region where the plurality of nLDMOS devices are formed, and this drain region D functions as a guard ring. The device isolation portion SS is formed in the periphery of the drain region D formed in the outermost periphery of the active region. That is, the device isolation portion SS is formed by STI via the guard ring in the periphery of the active region in both of the first direction and the second direction.

Note that, while FIG. 11 exemplarily illustrates three nLDMOS devices sharing the drain regions D, this is not meant to be restrictive.

A second modification example of the nLDMOS devices according to the first embodiment is illustrated in FIG. 12. FIG. 12 is a schematic plan view of main parts for describing the basic structure of the second modification example of the nLDMOS devices.

In the nLDMOS devices of the second modification example, sections are inserted along the second direction at a plurality of positions in the source regions S and the drain regions D extending in the first direction. At the plurality of positions where these sections are inserted, the terrace insulating films SL formed by LOCOS and the gate electrodes G are formed.

That is, as illustrated in FIG. 12, the nLDMOS devices of the second modification example are configured of the source regions S formed as being sectioned into plural regions along the first direction, the terrace insulating films SL formed along the first direction with a predetermined distance (channel length) away from the source region S in the second direction, the drain regions D formed as being sectioned into plural regions along the first direction on both sides of the source region S in the second direction via the terrace insulating films SL, the terrace insulating film SL formed along the second direction in a region obtain by sectioning the source regions S and the drain regions D formed along the first direction, and the gate electrodes G (indicated by dotted lines in FIG. 12) formed between each source region S and each drain region D, between adjacent source regions S, and between adjacent drain regions D so as to partially override the terrace insulating film SL.

Furthermore, in the nLDMOS devices of the second modification example, the terrace insulating films SL extending in the second direction are also formed at each end in the first direction, and the terrace insulating films SL formed along the first direction and the terrace insulating films SL formed along the second direction are all connected in a planar view, STI is not formed in the active region where the plurality of nLDMOS devices are formed, and the terrace insulating films SL formed by LOCOS and the device isolation portion SS formed by STI are isolated from each other.

Still further, in the nLDMOS devices of the second modification example, the gate electrodes G extending in the second direction are formed also at each end in the first direction, and the gate electrodes formed along the first direction and the gate electrodes G formed along the second direction are all connected in a planar view.

Still further, the drain region D is formed in the outermost periphery of the active region where the plurality of nLDMOS devices are formed, and this drain region D functions as a guard ring. The device isolation portion SS is formed in the periphery of the drain region D formed in the outermost periphery of the active region. That is, the device isolation portion SS is formed by STI via the guard ring in the periphery of the active region in both of the first and second directions.

Note that, while FIG. 12 exemplarily illustrates three nLDMOS devices in the first direction and four nLDMOS devices in the second direction sharing the drain regions D, this is not meant to be restrictive.

A third modification example of the nLDMOS devices according to the first embodiment is illustrated in FIG. 13. FIG. 13 is a schematic plan view of main parts for describing a basic structure of the third modification example of the nLDMOS devices.

In the nLDMOS devices of the third modification example, the plurality of source regions S are formed in the first direction and the second direction, and the gate electrode G, the terrace insulating film SL, and the drain region D are formed in a periphery of each source region S. In this manner, a MOS operation can be made in both of the first direction and the second direction.

That is, as illustrated in FIG. 13, the nLDMOS devices of the third modification example are configured of the source regions S formed in a mesh form along the first direction and the second direction, the terrace insulating films SL each formed in the periphery of the source region S with a predetermined distance (channel length) away from the source region S in both of the first direction and the second direction, the gate electrodes G (indicated by dotted lines in FIG. 13) each formed in the periphery of the source region S so as to partially override the terrace insulating film SL, and the drain region D formed in the periphery of the source regions S via the terrace insulating films SL.

Furthermore, the terrace insulating films SL formed in the nLDMOS devices each have a closed loop structure surrounding the periphery of the source region S, STI is not formed in the active region where the plurality of nLDMOS devices are formed, and the terrace insulating films SL formed by LOCOS and the device isolation portion SS formed by STI are isolated from each other.

Still further, the drain region D is formed in the outermost periphery of the active region where the plurality of nLDMOS devices are formed, and this drain region D functions as a guard ring. The device isolation portion SS is formed in the periphery of the drain region D formed in the outermost periphery of the active region. That is, the device isolation portion SS is formed by STI via the guard ring in the periphery of the active region in both of the first and second directions.

Note that, while FIG. 13 exemplarily illustrates three nLDMOS devices in the first direction or the second direction sharing the drain regions D, this is not meant to be restrictive.

A fourth modification example of the nLDMOS device according to the first embodiment is illustrated in FIG. 14. FIGS. 14A, 14B, and 14C are plan views of main parts for describing a planar shape of a terrace insulating film.

For example, in FIG. 7 and FIG. 11 to FIG. 13 described above, the planar shape of the terrace insulating film SL formed in the periphery of the source region S is a rectangular frame as illustrated in FIG. 14A.

However, as illustrated in FIG. 14B, the planar shape of the terrace insulating film SL formed in the periphery of the source region S may be a rectangular frame having its four angles tilted by 45 degrees. That is, the shape may be an octagon. Also, the angle is not restricted to 45 degrees and may be another angle. Furthermore, the shape may be a polygon other than a rectangle and an octagon.

Alternatively, as illustrated in FIG. 14C, the planar shape of the terrace insulating film SL formed in the periphery of the source region S may be a rectangular frame with four corners rounded. That is, the shape may be an oval.

<Method of Manufacturing Various Circuit Elements Configuring Semiconductor Device>

Next, a method of manufacturing a semiconductor device according to the first embodiment is described in the order of processes using FIGS. 15 to 25. Here, of the circuit elements formed in a semiconductor device, a method of manufacturing the nLDMOS device, the high-withstand voltage pMIS, the low-voltage operation CMOS device (the low-voltage nMIS and the low-voltage pMIS), and the high-voltage operation CMOS device (the high-voltage nMIS and the high-voltage pMIS) illustrated in FIG. 2 described above is described. In FIGS. 15 to 25, a region where the nLDMOS device is to be formed is referred to as an nLDMOS formation region, a region where the high-withstand voltage pMIS is to be formed is referred to as a high-withstand voltage pMIS formation region, regions where the low-voltage nMIS and the low-voltage pMIS of the low-voltage operation CMOS device are to be formed are referred to as a low-voltage nMIS formation region and a low-voltage pMIS formation region, respectively, and regions where the high-voltage nMIS and the high-voltage pMIS of the high-voltage operation CMOS device are to be formed are referred to as a high-voltage nMIS formation region and a high-voltage pMIS formation region, respectively.

First, as illustrated in FIG. 15, a semiconductor substrate (at this stage, a thin plate of a semiconductor in an approximately circular shape in a planar view, which is called a semiconductor wafer) Psub with p-type impurities, for example, B, introduced to, for example, single crystal silicon is prepared. Subsequently, a p-type epitaxial layer (a p-type semiconductor layer) PEpi is formed on a main surface of the semiconductor substrate Psub. Furthermore, an n-type buried layer NBL and a p-type buried layer PBL are formed at each predetermined region of the p-type epitaxial layer PEpi. Subsequently, an n-type epitaxial layer (an n-type semiconductor layer) NEpi is formed on a main surface of the p-type epitaxial layer PEpi, and then a p-type junction isolating part Piso for electrically isolating regions where the nLDMOS device, the high-withstand voltage pMIS, the low-voltage operation CMOS device (the low-voltage nMIS and the low-voltage pMIS), and the high-voltage operation CMOS device (the high-voltage nMIS and the high-voltage pMIS) are to be formed is formed in the n-type epitaxial layer NEpi so as to reach the p-type buried layer PBL.

Next, a silicon oxide film 46 and a silicon nitride film 47 are sequentially formed on a main surface of the n-type epitaxial layer NEpi, and then a resist pattern covering a region as an active region is formed by using a photolithography method. Subsequently, portions of the silicon nitride film 47 and the silicon oxide film 46 exposed from this resist pattern are sequentially removed by using, for example, a dry etching method, and then the resist pattern is removed.

Next, as illustrated in FIG. 16, with using the silicon nitride film 47 and the silicon oxide film 46 as masks, the n-type epitaxial layer NEpi is removed by using, for example, a dry etching method to form grooves 48 in predetermined regions in the n-type epitaxial layer NEpi. Each groove 48 has a depth, for example, on the order of 250 to 350 nm.

Next, as illustrated in FIG. 17, after the inner wall of each of the grooves 48 is subjected to an oxidation process, an insulating film is formed on the main surface of the n-type epitaxial layer NEpi so as to fill the grooves 48. Examples of this insulating film include a TEOS film formed by using a plasma CVD method using TEOS and ozone as source gas or a silicon oxide film formed by using a high-density plasma CVD method. Subsequently, a surface of the oxide film is polished by using, for example, a CMP (Chemical Vapor Deposition) method, and the oxide film is embedded in the grooves 48. By the grooves (STI) 48 having the oxide film embedded therein, device isolation portions SS isolating a plurality of active regions are formed, and a terrace insulating film SL in the high-withstand voltage pMIS formation region is formed.

Next, an oxide film 49 is formed on the main surface of the n-type epitaxial layer NEpi by using, for example, a thermal oxidation method, and a silicon nitride film 50 is formed on the oxide film 49. Subsequently, by using a photolithography method, a resist pattern covering regions where none of the terrace insulating films SL of the nLDOMOS devices are formed is formed. Subsequently, portions of the silicon nitride film 50 exposed from this resist pattern are removed by using, for example, a dry etching method, and then the resist pattern is removed.

Next, as illustrated in FIG. 18, a terrace insulating film SL of the nLDMOS device is formed by using, for example, a thermal oxidation method. Then, the silicon nitride film 50 and the oxide film 49 are removed. The terrace insulating film SL has a thickness of, for example, 70 to 200 nm, suitably 70 to 100 nm. Subsequently, an oxide film 51 is formed by using, for example, a thermal oxidation method, on the main surface of the n-type epitaxial layer NEpi.

Next, as illustrated in FIG. 19, an n-type impurities are selectively introduced to the n-type epitaxial layer NEpi in the nLDMOS formation region and the high-withstand voltage pMIS formation region by using an ion implantation method, thereby forming an n-type well NV in the nLDMOS formation region and forming an n-type well NV straight below the device isolation portion SS formed in the high-withstand voltage pMIS formation region.

Next, p-type impurities are selectively introduced to the n-type epitaxial layer NEpi in the high-withstand voltage pMIS formation region by using an ion implantation method, thereby forming a p-type diffusion region PV in the high-withstand voltage pMIS formation region.

Next, n-type impurities are selectively introduced to the n-type epitaxial layer NEpi in the high-withstand voltage pMIS formation region and the high-voltage pMIS formation region by using an ion implantation method, thereby forming n-type wells HNW in the high-withstand voltage pMIS formation region and the high-voltage pMIS formation region. Similarly, p-type impurities are selectively introduced to the n-type epitaxial layer NEpi in the nLDMOS formation region and the high-voltage nMIS formation region by using an ion implantation method, thereby forming p wells HPW in the nLDMOS formation region and the high-voltage nMIS formation region.

Next, n-type impurities are selectively introduced to the n-type epitaxial layer NEpi in the nLDMOS formation region and the low-voltage pMIS formation region by using an ion implantation method, thereby forming n-type wells NW in the nLDMOS formation region and the low-voltage pMIS formation region. Similarly, p-type impurities are selectively introduced to the n-type epitaxial layer NEpi in the low-voltage nMIS formation region by using an ion implantation method, thereby forming a p well PW in the low-voltage nMIS formation region.

Next, as illustrated in FIG. 20, after the oxide film 51 is removed, a gate insulating film 13 is formed on the main surface of the n-type epitaxial layer NEpi in the nLDMOS formation region, a gate insulating film 28 is formed on the main surface of the n-type epitaxial layer NEpi in the high-withstand voltage pMIS formation region, and a gate insulating film 43 is formed on the main surface of the n-type epitaxial layer NEpi in the high-voltage nMIS formation region and the high-voltage pMIS formation region. These gate insulating films 13, 28, and 43 have a thickness, for example, on the order of 13.5 nm. Also, a gate insulating film 36 is formed on the main surface of the n-type epitaxial layer NEpi in the low-voltage nMIS formation region and the low-voltage pMIS formation region. The gate insulating film 36 has a thickness, for example, on the order of 3.7 nm.

Next, a polycrystalline silicon film 52 and an oxide film 53 are sequentially formed on the gate insulating films 13, 28, 36, and 43.

Next, as illustrated in FIG. 21, by using a photolithography method and a dry etching method, the silicon oxide film 53 and the polycrystalline silicon film 52 are sequentially processed. In this manner, gate electrodes of the respective circuit elements each formed of the polycrystalline silicon film 52 are formed. That is, a gate electrode 15d of the nLDMOS device is formed in the nLDMOS formation region, a gate electrode 15h of the high-withstand voltage pMIS is formed in the high-withstand voltage pMIS formation region, gate electrodes 15n are formed in the low-voltage nMIS formation region and the high-voltage nMIS formation region, and gate electrodes 15p are formed in the low-voltage pMIS formation region and the high-voltage pMIS formation region.

Next, as illustrated in FIG. 22, p-type impurities (for example, B) are selectively introduced to the n-type epitaxial layer NEpi in the high-withstand voltage pMIS formation region and the high-voltage pMIS formation region by using an ion implantation method, thereby forming a p-type extension region 29 in a self-aligned manner to the gate electrode 15h in the high-withstand voltage pMIS formation region and a p-type extension region 45 in a self-aligned manner to the gate electrode 15p in the high-voltage pMIS formation region. Similarly, n-type impurities (for example, P or As) are selectively introduced to the n-type epitaxial layer NEpi in the high-voltage nMIS formation region by using an ion implantation method, thereby forming an n-type extension region 44 in a self-aligned manner to the gate electrode 15n in the high-voltage nMIS formation region.

Next, p-type impurities (for example, B) are selectively introduced to the n-type epitaxial layer NEpi in the low-voltage pMIS formation region by using an ion implantation method, thereby forming a p-type extension region 39 in a self-aligned manner to the gate electrode 15p in the low-voltage pMIS formation region. Similarly, n-type impurities (for example, P or As) are selectively introduced to the n-type epitaxial layer NEpi in the nLDMOS formation region by using an ion implantation method, thereby forming an n-type extension region 18 in a self-aligned manner to the gate electrode 15d in the nLDMOS formation region. Similarly, n-type impurities (for example, P or As) are selectively introduced to the n-type epitaxial layer NEpi in the low-voltage nMIS formation region by using an ion implantation method, thereby forming an n-type extension region 37 in a self-aligned manner to the gate electrode 15n in the low-voltage nMIS formation region.

Next, as illustrated in FIG. 23, after an oxide film is deposited on the main surface of the n-type epitaxial layer NEpi, this oxide film is subjected to anisotropic etching by using a dry etching method. In this manner, sidewalls 17 are formed on side walls of the gate electrode 15d of the nLDMOS device, side walls of the gate electrode 15h of the high-withstand voltage pMIS, side walls of the gate electrodes 15n of the low-voltage nMIS and the high-voltage nMIS, and side walls of the gate electrodes 15p of the low-voltage pMIS and the high-voltage pMIS. The oxide film 53 on the gate electrodes 15d, 15h, 15n, and 15p are removed with this process.

Next, p-type impurities (for example, B) are selectively introduced to the n-type epitaxial layer NEpi in the nLDMOS formation region, the high-withstand voltage pMIS formation region, the low-voltage pMIS formation region, and the high-voltage pMIS formation region by using an ion implantation method, thereby forming a p-type back-gate layer BG in the nLDMOS formation region, p-type diffusion regions 30 and 33 in a self-aligned manner in the high-withstand voltage pMIS formation region, and p-type diffusion regions 40 in a self-aligned manner in the low-voltage pMIS formation region and the high-voltage pMIS formation region. Similarly, n-type impurities (for example, P or As) are selectively introduced to the n-type epitaxial layer NEpi in the nLDMOS formation region, the low-voltage nMIS formation region, and the high-voltage nMIS formation region by using an ion implantation method, thereby forming n-type diffusion regions 19 and 22 in a self-aligned manner in the nLDMOS region and n-type diffusion regions 38 in a self-aligned manner in the low-voltage nMIS formation region and the high-voltage nMIS formation region.

Subsequently, a heat treatment is performed. By this heat treatment, the n-type impurities and the p-type impurities introduced to the n-type epitaxial layer NEpi by ion implantation described above are activated.

With the processes illustrated in FIGS. 22 and 23, a source region S (the n-type extension region 18 and the n-type diffusion region 19) and a drain region D (the n-type diffusion region 22) of the nLDMOS device are formed, a source region S2 (the p-type extension region 29 and the p-type diffusion region 30) and a drain region D2 (the p-type diffusion regions PV and 33) of the high-withstand voltage pMIS are formed, and source/drain regions SD (the n-type extension region 37 and the n-type diffusion region 38) of the low-voltage nMIS is formed, source/drain regions SD (the p-type extension region 39 and the p-type diffusion region 40) of the low-voltage pMIS are formed, source/drain regions SD (the n-type extension region 44 and the n-type diffusion region 38) of the high-voltage nMIS are formed, and source/drain regions SD (the p-type extension region 45 and the p-type diffusion region 40) of the high-voltage pMIS are formed.

Next, as illustrated in FIG. 24, after a cobalt (Co) film is formed on the main surface of the n-type epitaxial layer NEpi, a heat treatment is performed at a temperature of, for example, 470° C. By this heat treatment, Si and Co composing the n-type epitaxial layer NEpi and polycrystalline silicon (Si) and Co composing the gate electrodes 15d, 15h, 15n, and 15p are reacted for solid phase reaction to form $CoSi_2$, and unreacted Co is removed by sequentially using a mixture solution of $NH_4OH$, $H_2O_2$, and $H_2O$ and a mixture solution of HCl, $H_2O_2$, and $H_2O$. In this manner, a silicide film 16 formed of cobalt silicide ($CoSi_2$) is formed on an upper surface of each of the gate electrode 15d, the p-type back-gate layer BG, the source region S, and the drain region D of the nLDMOS device, on an upper surface of each of the gate electrode 15h, the source region S2, and the drain region D2 of the high-voltage pMIS, on an upper surface of each of the gate electrode 15n and the source/drain regions SD of the low-voltage nMIS, on an upper surface of each of the gate electrode 15p and the source/drain regions SD of the low-voltage pMIS, on an upper surface of each of the gate electrode 15n and the source/drain regions SD of the high-voltage nMIS, and on an upper surface of each of the gate electrode 15p and the source/drain regions SD of the high-voltage pMIS. Note that, in place of the cobalt silicide film, for example, a nickel silicide film, platinum silicide, or the like can be used.

Next, as illustrated in FIG. 25, an interlayer insulating film Liso is formed on the main surface of the n-type epitaxial layer NEpi. The interlayer insulating film Liso is a TEOS film formed by using, for example, a plasma CVD method. Subsequently, after a surface of the interlayer insulating film Liso is planarized by using, for example, a CMP method, contact holes CT are formed in the interlayer insulating film Liso by using a photolithography method and a dry etching method. Subsequently, after plugs PL are formed inside the contact holes CT, a wiring layer ML connecting to the plugs PL is formed. Thereafter, while wiring of an upper layer is further formed, description thereof is omitted herein.

According to the manufacturing processes described above, the semiconductor device (the nLDMOS device, the high-withstand voltage pMIS, the low-voltage operation CMOS device, and the high-withstand voltage operation CMOS device) according to the first embodiment is roughly completed.

In this manner, according to the first embodiment, by configuring the terrace insulating film SL by LOCOS, in an nLDMOS device having a cell pitch (a distance between a center part of the source region and a center part of the drain region) smaller than 5 µm, an increase in on-resistance and a lowering of on-state breakdown voltage can be prevented.

Furthermore, a guard ring having the same potential as that of the drain regions D is provided in the outermost periphery of the active region where a plurality of nLDMOS devices are formed and, via this guard ring, the device isolation portion SS is formed by STI in the periphery of the active region. As such, the terrace insulating film SL and the device isolation portion SS are not connected but completely isolated from each other, and STI is not formed in the active region; thus, the influence of a crystal defect occurring due to the structure of STI and affecting a decrease in the degree of reliability of the nLDMOS devices can be reduced. Also, a parasitic MOS operation occurring between the plurality of nLDMOS devices formed in the active region and the device isolation portion SS formed in the periphery of the active region can be prevented.

Second Embodiment nLDMOS devices according to a second embodiment and the nLDMOS devices according to the first embodiment described above are different in that the layout of the source regions and the layout of the drain regions are reversed.

The structure of the nLDMOS devices according to the second embodiment is described using FIGS. 26 to 29B. FIG. 26 is a schematic plan view of main parts for describing a basic structure of nLDMOS devices, FIG. 27 is a plan view of main parts of the nLDMOS devices, FIG. 28 is a cross-sectional view of main parts taken along a IIa-IIa line in FIG. 27, FIGS. 29A and 29B are cross-sectional views of main parts taken along a IIb-IIb line in FIG. 27.

As illustrated in FIG. 26, the nLDMOS devices are configured of drain regions D formed along a first direction (a channel width direction), terrace insulating films SL each formed in a periphery of the drain region D, source regions S formed on both sides of the drain region D with a predetermined distance (channel length) away from the terrace insulating film SL, and gate electrodes G (indicated by dotted lines in FIG. 26) each formed between the drain region D and the source region S so as to partially override the terrace insulating film SL.

Furthermore, the terrace insulating films SL formed in the nLDMOS devices each have a closed loop structure surrounding the periphery of the drain region D, the device isolation portion SS is not formed in the active region where the plurality of nLDMOS devices are formed, and the terrace insulating films SL and the device isolation portion SS are isolated from each other. Also, the terrace insulating films SL are formed by LOCOS and the device isolation portion is formed by STI, and their structures are thus different. Still further, a source region S is formed in the outermost periphery of the active region where the plurality of nLDMOS devices are formed, and this drain region S functions as a guard ring. The plurality of source regions S formed in the active region and the source region S formed in the outermost periphery of the active region to function as a guard ring are connected. Therefore, all source regions S formed in the active region are connected in a planar view. Also, the device isolation portion SS is formed in the periphery of the source region S formed in the outermost periphery of the active region to function as a guard ring. That is, the device isolation portion SS is formed by STI via the guard ring in the periphery of the active region in both of the first and second directions.

Note that, while FIG. 26 exemplarily illustrates three nLDMOS devices sharing the source regions S, this is not meant to be restrictive.

FIGS. 27, 28 and 29A each illustrates a detailed structure of the nLDMOS devices illustrated in FIG. 26.

The nLDMOS devices are formed on an n-type epitaxial layer NEpi formed via an n-type buried layer NBL on a main surface of a substrate SUB. Also, the nLDMOS devices are formed in the active region surrounded by the device isolation portion SS formed by STI, and an n-type well NV is formed on the n-type epitaxial layer NEpi in the active region.

On a main surface of the n-type epitaxial layer NEpi, a gate electrode G is formed via a gate insulating film (illustration omitted). The gate electrode G is formed of, for example, polycrystalline silicon. The terrace insulating film SL is formed by LOCOS on a drain region D side of the gate electrode G, and an end of the gate electrode G on the drain region D side overrides the terrace insulating film SL. The terrace insulating film SL is not formed on a source region S side of the gate electrode G.

The source region S formed of an n-type semiconductor region on the n-type epitaxial layer NEpi is surrounded by a p-type well HPW. This p-type well HPW is diffused under the gate electrode G and thus also formed on part of the n-type epitaxial layer NEpi under the gate electrode G. The impurity concentration of the n-type well.

NV is set to be lower than the impurity concentration of the semiconductor region configuring the source region S. Furthermore, a p-type back-gate layer BG is formed at a center part of the source region S and part of the source region S formed in the outermost periphery of the active region.

The drain region D formed of an n-type semiconductor region on the n-type epitaxial layer NEpi is surrounded by an n-type well NW.

In the outermost periphery of the active region where the plurality of nLDMOS devices are formed, the source region S functioning as a guard ring is formed. The plurality of source regions S formed in the active region and the source region S formed in the outermost periphery of the active region to function as a guard ring are connected in a planar view. Furthermore, in the periphery of the source region S formed in the outermost periphery of the active region to function as a guard ring, the device isolation portion SS is formed by STI, but STI is not formed in the active region. That is, the device isolation portion SS (STI) and the terrace insulating films SL (LOCOS) are isolated from each other. The reason for this is similar to that of the first embodiment described above.

The plurality of nLDMOS devices are covered with an interlayer insulating film Liso. In this interlayer insulating film Liso, a plurality of contact holes CT are formed. Via plugs PL buried in the plurality of contact holes CT, a wiring layer ML is electrically connected to the gate electrode G, the source regions S, the drain regions D, the p-type back-gate layer BG, and others.

Note that, while FIGS. 27, 28, and 29A exemplarily illustrate four nLDMOS devices sharing the source regions S, this is not meant to be restrictive.

Also, while an end of the p-type well HPW at an end in the first direction goes also under the terrace insulating film SL in FIG. 29A, the p-type well HPW is not necessarily required to have this structure. For example, as illustrated in FIG. 29B, the p-type well HPW may be formed so that the end of the p-type well HPW is positioned in the active region under the gate electrode G.

A modification example of the nLDMOS devices according to the second embodiment is illustrated in FIG. 30. FIG. 30 is a schematic plan view of main parts for describing a basic structure of the LDMOS devices.

In the nLDMOS devices of the modification example, a plurality of drain regions D are formed along the first direction and the second direction, and a gate electrode G, a terrace insulating film SL, and a source region S are formed in a periphery of each of the drain regions D. In this manner, a MOS operation can be made in both of the first direction and the second direction.

That is, as illustrated in FIG. 30, the nLDMOS devices of the modification example are configured of the drain regions D formed in a mesh form along the first direction and the second direction, the terrace insulating films SL each formed in the periphery of the drain region D, the gate electrodes G (indicated by dotted lines in FIG. 30) each formed in the periphery of the drain region D so as to partially override the terrace insulating film SL, and the source regions S formed in the periphery of the drain regions D with a predetermined distance (channel length) away from the terrace insulating films SL in both of the first direction and the second direction.

Furthermore, the terrace insulating films SL formed in the nLDMOS devices each have a closed loop structure surrounding the periphery of the drain region D, STI is not formed in the active region where the plurality of nLDMOS devices are formed, and the terrace insulating films SL formed by LOCOS and the device isolation portion SS formed by STI are isolated from each other.

Still further, the source region S is formed in the outermost periphery of the active region where the plurality of nLDMOS devices are formed, and this source region S functions as a guard ring. The device isolation portion SS is formed in the periphery of the drain region D formed in the outermost periphery of the active region. That is, the device isolation portion SS is formed by STI via the guard ring in the periphery of the active region in both of the first and second directions.

Note that, while FIG. 30 exemplarily illustrates three nLDMOS devices in the first direction or the second direction sharing the source regions S, this is not meant to be restrictive.

As such, according to the second embodiment, the terrace insulating films SL are formed by LOCOS in the active region where the plurality of nLDMOS devices are formed, and the device isolation portion SS is formed by STI via the guard ring having the same potential as that of the source regions S in the periphery of this active region; thus, effects similar to those of the first embodiment described above can be obtained. For example, an increase in on-resistance (a lowering in driving performance) and a lowering of on-state breakdown voltage can be prevented. Furthermore, a decrease in degree of reliability of the nLDMOS devices due to a crystal defect caused by the structure of STI can be prevented, and a parasitic MOS operation occurring between the plurality of nLDMOS devices and the device isolation portion SS can be prevented.

Also, as illustrated in FIG. 27, the plugs PL for the gate electrodes G of the nLDMOS devices are formed on the terrace insulating films SL in a planar view. As an effect from this, even if the plug PL is formed at a place out of the gate electrode G due to mask misalignment or the like, the plug PL can be prevented from short-circuiting with the drain region D as long as the plug PL is on the terrace insulating film SL.

Third Embodiment

A structure of a completely-isolated nLDMOS device according to a third embodiment is described by using FIGS. 31 to 33. FIG. 31 is a plan view of main parts of completely-isolated nLDMOS devices, FIG. 32 is a cross-sectional view of main parts taken along a IIIa-IIIa line in FIG. 31, and FIG. 33 is a cross-sectional view of main parts taken along a IIIb-IIIb line in FIG. 31.

The completely-isolated nLDMOS device has a structure in which a drain region is completely isolated from a substrate, and is used in, for example, the preamplifier negative potential power source C3d and the micro actuator driver C3e of the power circuit block of the semiconductor device illustrated in FIG. 1 described above.

As illustrated in FIGS. 31 to 33, the completely-isolated nLDMOS devices are formed on an n-type epitaxial layer NEpi formed via an n-type buried layer NBL on a main surface of a substrate SUB. Also, the completely-isolated nLDMOS devices are formed in the active region surrounded by a device isolation portion SS1 formed by STI, and an n-type well NV is formed in the n-type epitaxial layer NEpi in the active region.

However, the active region (the n-type well NV) where the completely-isolated nLDMOS devices are formed are doubly shielded with a p-type ring of a source potential formed of the p-type buried layer PBL and a p-type junction isolating part Piso formed on the n-type epitaxial layer NEpi and an n-type ring at a high potential formed of the n-type buried layer NBL and the n-type well NV in the periphery of the p-type ring of this source potential. With this, the n-type well NV where the completely-isolated nLDMOS device are formed and the substrate SUB are completely isolated from each other.

On a main surface of the n-type epitaxial layer NEpi, a gate electrode G is formed. The gate electrode G is formed of, for example, polycrystalline silicon. The terrace insulating film SL is formed by LOCOS on a drain region D side of the gate electrode G, and an end of the gate electrode G on the drain region D side overrides the terrace insulating film SL. The terrace insulating film SL is not formed on a source region S side of the gate electrode G.

The source region S formed of an n-type semiconductor region is surrounded by a p-type well HPW. This p-type well HPW is diffused under the gate electrode G and thus also formed in a partial region under the gate electrode G. The impurity concentration of the n-type well NV is set to be lower than the impurity concentration of the semiconductor region configuring the source region S. Furthermore, a p-type back-gate layer BG is formed at a center part of the source region S. Furthermore, a p-type junction isolating part Piso reaching the p-type buried layer PBL is formed so as to surround this p-type back-gate layer BG.

The drain region D formed of an n-type semiconductor region is surrounded by the n-type well NW. In the outermost periphery of the active region where the plurality of completely-isolated nLDMOS devices are formed, the drain region D functioning as a guard ring is formed. The drain regions D formed in the active region and the drain region D formed in the outermost periphery of the active region to function as a guard ring are connected in a planar view. Furthermore, in a periphery of the drain region D formed in the outermost periphery of the active region to function as a guard ring, a device isolation portion SS1 is formed by STI, but STI is not formed in the active region.

Also, the device isolation portion SS1 (STI) and the terrace insulating film SL (LOCOS) are isolated from each other. The reason for this is similar to that of the first embodiment described above.

Furthermore, in a periphery of the device isolation portion SS1, a p-type junction isolating part Piso configuring the p-type ring described above is formed. This p-type junction isolating part Piso is connected to the p-type buried layer PBL. Furthermore, in the periphery (a side surface) of the p-type junction isolating part Piso, an n-type well NV is formed via a device isolation portion SS2, and is connected to the n-type buried layer NBL formed in a region deeper than the p-type junction isolating part Piso. Still further, a device isolation portion SS3 is formed in the periphery of the n-type well NV.

The plurality of nLDMOS devices are covered with an interlayer insulating film Liso. In this interlayer insulating film Liso, a plurality of contact holes CT are formed; and, via plugs PL buried in the plurality of contact holes CT, a wiring layer ML is electrically connected to the gate electrode G, the source regions S, the drain regions D, the p-type back-gate layer BG, and others.

As such, also in the completely-isolated nLDMOS devices of the third embodiment, the terrace insulating film SL is formed by LOCOS; and furthermore, a guard ring having the same potential as that of the drain region D is provided in the periphery of the active region where the completely-isolated nLDMOS devices are formed and, via this guard ring, the device isolation portion SS1 formed by STI is formed in the periphery of the active region; thus, effects similar to those of the first embodiment described above can be obtained. For example, an increase in on-resistance (a decrease in driving performance) and a lowering of on-state breakdown voltage can be prevented. Furthermore, a decrease in degree of reliability of the completely-isolated nLDMOS devices due to a crystal defect caused by the structure of STI can be prevented, and a parasitic MOS operation occurring between the completely-isolated nLDMOS devices and the device isolation portion SS can be prevented.

Also, as illustrated in FIG. 31, the plugs PL for the gate electrodes G of the nLDMOS devices are formed on the terrace insulating films SL in a planar view. As an effect from this, even if the plug PL is formed at a place out of the gate electrode G due to mask misalignment or the like, the plug PL can be prevented from short-circuiting with the source region S as long as the plug PL is on the terrace insulating film SL.

Fourth Embodiment

A structure of a high-withstand voltage pMIS having a withstand voltage on the order of 20 V to 40 V according to a fourth embodiment is described by using FIGS. 34 to 37. FIG. 34 is a schematic plan view of main parts for describing a basic structure of the high-withstand voltage pMIS, FIG. 35 is a plan view of main parts of the high-withstand voltage pMIS, FIG. 36 is a cross-sectional view of main parts taken along a IVa-IVa line in FIG. 35, and FIG. 37 is a cross-sectional view of main parts taken along a IVb-IVb line in FIG. 35.

The high-withstand voltage pMIS has a p-type diffusion region having a low concentration (for example, $3 \times 10^{16}$ cm$^{-3}$) and a deep junction depth, and is used in, for example, the booster pressurizing circuit C4a of the analog circuit block of the semiconductor device illustrated in FIG. 1 described above and another analog circuit block.

As illustrated in FIG. 34, the high-withstand voltage pMIS is configured of a drain region D formed along the first direction (channel width direction), a terrace insulating film (a first terrace insulating film) SL formed by LOCOS along the first direction adjacently to the drain region D, source regions S formed along the first direction with a predetermined distance (a channel length) away from the terrace insulating film SL in the second direction (channel length direction), gate electrodes G (indicated by dotted lines in FIG. 34) formed between the drain region D and the source regions S so as to partially override the terrace insulating film SL, a terrace insulating film (a second terrace insulating film) SL formed by LOCOS formed on the periphery of the drain region D and the source regions S, and an n-type back-gate layer NBG, which is a power feeding part of an n-type well HNW. The terrace insulating films (the first and second insulating films) SL formed in an active region where the high-withstand voltage pMIS is formed are all connected in a planar view, and has a function of mitigating an electric field between the gate electrodes G and the drain region D.

Also, in the periphery of the n-type back-gate layer NBG, a device isolation portion SS is formed by STI. STI is not formed in the active region where the high-withstand voltage pMIS is formed, and the terrace insulating film SL and the device isolation portion SS are isolated from each other. The reason for this is similar to that of the first embodiment described above.

FIGS. 35 to 37 each illustrate a detailed structure of the high-withstand voltage pMIS illustrated in FIG. 34.

The high-withstand voltage pMIS is formed on an n-type epitaxial layer NEpi formed on a main surface of a substrate SUB. On the n-type epitaxial layer NEpi, the gate electrodes G are formed via a gate insulating film (illustration omitted). The gate electrodes G are formed of, for example, polycrystalline silicon. On a drain region D side of each gate electrode G, a terrace insulating film SL extending in the first direction is formed by LOCOS, having an end on the drain region D side of this gate electrode G overriding the terrace insulating film SL and extending along the first direction. Furthermore, the gate electrodes G are connected at each end in the first direction. On a source region S side of each gate electrode G, the terrace insulating film SL described above is not formed.

The source region S formed of a p-type semiconductor region is formed so as to extend along the first direction, and a periphery (side portion and bottom portion) of this source region S is surrounded by the n-type well HNW. This n-type well HNW is diffused under the gate electrodes G and thus also formed in a part of the gate electrodes G. The impurity concentration of the n-type well HNW is set to be lower than the impurity concentration of the semiconductor region configuring the source region S. Furthermore, the terrace insulating film SL is formed on a side of the source region S opposite to the gate electrodes G and at ends of the source region S and the drain region D in the first direction, and the terrace insulating film SL has a closed loop structure. Furthermore, in the periphery of this terrace insulating film SL having a closed loop structure, the n-type back-gate layer NBG is formed. These terrace insulating film SL having a closed loop structure and the terrace insulating film SL formed between the source region S and the drain region D are connected in a planar view.

The perimeter (side surfaces and the bottom surface) of the drain region D formed of a p-type semiconductor region is surrounded by a p-type diffusion region PV. This p-type diffusion region PV is also formed on the n-type epitaxial layer NEpi under the terrace insulating film SL and the gate electrode G on the drain region D side, and has a junction with the n-type well HNW under the gate electrode G.

The n-type back-gate layer NBG formed in the outermost periphery of the active region where the high-withstand voltage pMIS is formed is a power feeding part of the n-type well HNW. Furthermore, in the periphery of the n-type back-gate layer NBG formed in the outermost periphery of the active region to function as a guard ring, the device isolation portion SS is formed by STI.

The high-withstand voltage pMIS is covered with an interlayer insulating film Liso. In this interlayer insulating film Liso, a plurality of contact holes CT are formed. Via plugs PL buried in the plurality of contact holes CT, a wiring layer ML is electrically connected to the gate electrode G, the source regions S, the drain regions D, the n-type back-gate layer NBG, and others.

As such, also in the high-withstand voltage pMIS according to the fourth embodiment, the terrace insulating film SL is formed by LOCOS; furthermore, the n-type back-gate layer NBG, which is a power feeding part, is provided in a periphery of the active region where the high-withstand voltage pMIS is formed and, via this n-type back-gate layer NBG, the device isolation portion SS is formed by STI in the periphery of the active region, thereby obtaining effects similar to those of the first embodiment described above. For example, an increase in on-resistance (a lowering in driving performance) and a lowering of on-state breakdown voltage can be prevented. Furthermore, a decrease in degree of reliability of the high-withstand voltage pMIS due to a crystal defect caused by the structure of STI can be prevented, and a parasitic MOS operation occurring between the high-withstand voltage pMIS and the device isolation portion SS can be prevented.

Also, as illustrated in FIG. 35, the plugs PL for the gate electrodes G of the high-withstand voltage pMIS are formed on the terrace insulating film SL in a planar view. As an effect from this, even if the plug PL is formed at a place out of the gate electrode G due to mask misalignment or the like, the plug PL can be prevented from short-circuiting with the drain region D or the source region S as long as the plug PL is on the terrace insulating film SL.

Fifth Embodiment

The structure of a high-withstand voltage Schottky barrier diode having a withstand voltage on the order of 40 V according to a fifth embodiment is described using FIGS. 38 and 39. FIG. 38 is a plan view of main parts of the high-withstand voltage Schottky barrier diode, and FIG. 39 is a cross-sectional view of main parts taken along a V-V line in FIG. 38.

The high-withstand voltage Schottky barrier diode is a Schottky diode configured with a contact between a silicide film (for example, CoSi (cobalt silicide)) and an n-type silicon layer with a low concentration (for example, on the order of $2 \times 10^{15}$ cm$^{-3}$). The high-withstand voltage Schottky barrier diode is used as, for example, a rectifier diode in the spindle driver C3$a$, the voice coil motor driver C3$b$, and the power switch C3$c$ of the power circuit block of the semiconductor device illustrated in FIG. 1 described above.

As illustrated in FIGS. 38 and 39, the high-withstand voltage Schottky barrier diode is formed on an n-type epitaxial layer NEpi formed on a main surface of a substrate SUB. An anode region A1 is placed at a center part, and a cathode region A2 is placed on its periphery part. A silicide film 16 is formed on the main surface of the n-type epitaxial layer NEpi in the anode region A1 at the center part, and a p-type well HPW is formed in the outermost periphery of the anode region A1.

The n-type epitaxial layer NEpi in the cathode region A2 in the periphery part is configured of an n-type diffusion region N, an n-type well NW formed so as to surround the perimeter (side portion and bottom portion) of the n-type diffusion region N, and further an n-type well NV formed so as to surround the perimeter (side portion and bottom portion) of the n-type well NW. Their impurity concentrations are set so that the n-type diffusion region N has the highest impurity concentration, and the impurity concentration is gradually decreased in the order of the n-type well NW and then the n-type well NV.

A terrace insulating film SL is formed by LOCOS between the silicide film 16 formed on the n-type epitaxial layer NEpi of the anode region A1 and the n-type diffusion region N, and a junction surface between the p-type well HPW and the n-type well NV is covered with that terrace insulating film SL.

Also, a gate electrode G short-circuited with the anode region A1 is formed on the terrace insulating film SL. This gate electrode G has a function of mitigating an electric field at a junction part between the p-type well HPW and the n-type well NV when a high voltage is applied to a cathode region A2 side. That is, with provision of the gate electrode G short-circuited with the anode region A1, the electric field loaded to the entire junction part between the p-type well HPW and the n-type well NV can be distributed between a curvature portion of the junction part and the junction surface part mitigated by the gate electrode G, thereby mitigating the electric field at the junction part. When a terrace insulating film formed by STI is provided in place of the terrace insulating film SL formed by LOCOS, the electric field loaded to the entire junction part between the p-type well HPW and the n-type well NV concentrates on the curvature portion of the junction part, thereby lowering junction breakdown voltage of the junction part.

In an outer periphery of the active region (a cathode region A2) where the high-withstand voltage Schottky barrier diode is formed, a device isolation portion SS is formed by STI, which does not connect to the terrace insulating film SL for isolating the anode region A1 and the cathode region A2. The reason for this is similar to that of the first embodiment described above.

The high-withstand voltage Schottky barrier diode is covered with an interlayer insulating film Liso. In this interlayer insulating film Liso, a plurality of contact holes CT are formed; and a wiring layer ML is electrically connected to the p-type well HPW (the silicide film 16), the n-type diffusion region N, and others via plugs PL buried in the plurality of contact holes CT.

As such, in the high-withstand voltage Schottky barrier diode according to the fifth embodiment, by configuring the terrace insulating film SL isolating the anode region A1 and the cathode region A2 by LOCOS, the breakdown voltage of the junction part between the anode region A1 and the cathode region A2 can be improved as compared with the case in which the terrace insulating film SL is configured by STI. Furthermore, by forming the device isolation portion SS by STI on the outer periphery of the active region where the high-withstand voltage Schottky barrier diode is formed (outside the cathode region A2) to isolate the terrace insulating film SL and the device isolation portion SS, a decrease in degree of reliability of the high-withstand voltage Schottky barrier diode due to a crystal defect caused by the structure of STI can be prevented.

Sixth Embodiment

A structure of a high-withstand voltage capacitor according to a sixth embodiment is described using FIGS. 40 and 41. FIG. 40 is a plan view of main parts of a high-withstand voltage capacitor, and FIG. 41 is a cross-sectional view of main parts taken along a VI-VI line in FIG. 40.

The high-withstand voltage capacitor is formed of a capacitance insulating film formed of a terrace insulating film, an upper electrode formed of a gate electrode, and a lower electrode formed of a p-type well. The terrace insulating film has a thickness on the order of 100 nm, which is considerably thick, and therefore can be used as a high-withstand voltage capacitative element. The high-withstand voltage capacitor is used in, for example, the analog circuit block of the semiconductor device illustrated in FIG. 1 described above.

As illustrated in FIGS. 40 and 41, the high-withstand voltage capacitor is formed in an active region of an n-type epitaxial layer NEpi surrounded by a device isolation portion SS formed by STI. A terrace insulating film SL is formed by LOCOS at a center part of a main surface of the n-type epitaxial layer NEpi, and a p-type diffusion region P is formed in a periphery of the terrace insulating film SL. Furthermore, on the n-type epitaxial layer NEpi, a p-type well HPW having a impurity concentration lower than that of the p-type diffusion region P is formed so as to surround a lower part of the terrace insulating film SL and a periphery (side portion and bottom portion) of the p-type diffusion region P. The terrace insulating film SL serves as a capacitance insulating film, and the p-type well HPW serves as a lower electrode DE. Also, a gate electrode G is formed of polycrystalline silicon on the terrace insulating film SL, and this gate electrode G serves as an upper electrode UE.

In a periphery of an active region (the p-type diffusion region P) where the high-withstand voltage capacitor is formed, a device isolation portion SS is formed by STI, and is not connected to the terrace insulating film SL functioning as a capacitance insulating film.

The high-withstand voltage capacitor is covered with an interlayer insulating film Liso. In this interlayer insulating film Liso, a plurality of contact holes CT are formed. Via plugs PL buried in the plurality of contact holes CT, a wiring layer ML is electrically connected to the gate electrode G (the upper electrode UE), the p-type diffusion region P, and others.

As such, in the high-withstand voltage capacitor according to the sixth embodiment, by using the terrace insulating film SL formed by LOCOS as a capacitance insulating film, a high-withstand voltage capacitative element can be formed. Also, since the thickness of the device isolation portion SS is too thick for use as a capacitative element, the thin terrace insulating film SL is used so that, without adding a manufacturing process, it is possible to obtain a desired capacitative element.

Furthermore, the device isolation portion SS is formed by STI via the p-type well HPW (the p-type diffusion region P) in the periphery of the terrace insulating film SL to isolate the terrace insulating film SL functioning as a capacitance insulating film and the device isolation portion SS; thus, a decrease in degree of reliability of the high-withstand voltage capacitor due to a crystal defect caused by the structure of STI can be prevented.

Seventh Embodiment

A structure of a capacitor-doped capacitor according to a seventh embodiment is described using FIGS. 42 to 44. FIG. 42 is a plan view of main parts of a high-withstand voltage pMIS, FIG. 43 is a cross-sectional view of main parts taken along a VIIa-VIIa line in FIG. 42, and FIG. 44 is a cross-sectional view of main parts taken along a VIIb-VIIb line in FIG. 42.

The capacitor-doped capacitor is configured of a capacitance insulating film formed of a gate insulating film, an upper electrode formed of a gate electrode, and a lower electrode formed of a capacitor-doped region (a semiconductor region) with a relatively high concentration (for example, on the order of $3 \times 10^{19}$ cm$^{-3}$) formed on the n-type epitaxial layer. Since the lower electrode is configured of the capacitor-doped region with a high concentration formed near a main surface of the n-type epitaxial layer, even if a voltage is applied to the gate electrode configuring the upper electrode in both of positive and negative directions, an inversion layer is less prone to be formed. In this manner, small voltage dependency of a capacitance value can be advantageously obtained. The capacitor-doped capacitor is used in, for example, the analog circuit block of the semiconductor device illustrated in FIG. 1 described above.

As illustrated in FIGS. 42 to 44, the capacitor-doped capacitor is formed in an active region of an n-type epitaxial layer NEpi surrounded by a device isolation portion SS formed by STI. A gate insulating film Giso serving as a capacitance insulating film is formed at a center part of the main surface of the n-type epitaxial layer NEpi. On the n-type epitaxial layer NEpi under this gate insulating film Giso, a capacitor-doped region CCN serving as a lower electrode DE is formed. On this gate insulating film Giso, a gate electrode G serving as the upper electrode UE is formed. Also, a periphery (side portion and bottom portion) of the capacitor-doped region CCN is surrounded by a p-type well HPW formed in the active region of the n-type epitaxial layer NEpi.

An n-type diffusion region N is formed at one end of the capacitor-doped region CCN. This n-type diffusion region N is used as a connection part to a wiring layer ML. Also, a terrace insulating film SL is formed by LOCOS in the periphery of the capacitor-doped region CCN, and one end of the gate electrode G overrides the terrace insulating film SL. The gate electrode G overriding the terrace insulating film SL is used as a connection part to the wiring layer ML. Furthermore, a p-type diffusion region P is formed in a periphery of the terrace insulating film SL. This p-type diffusion region P is used as a connection part to the wiring layer ML.

Although it is possible to provide the terrace insulating film SL formed by STI in place of the terrace insulating film SL formed by LOCOS, if the terrace insulating film SL formed by STI is used, the gate insulating film Giso becomes thin (Thinning) at a boundary portion between the terrace insulating film SL and the capacitor-doped region CCN, thereby disadvantageously degrading capacitance breakdown voltage. For this reason, the terrace insulating film SL overridden by the gate electrode G is configured by LOCOS. Also, in the case of a recessed shape in which part of LOCOS, an upper surface (a surface) of LOCOS, falls from the main surface of the n-type epitaxial layer NEpi, the electric field is intensified in the n-type epitaxial layer NEpi near the end of LOCOS. Therefore, the terrace insulating film SL not in a recessed shape and formed by LOCOS is used.

In the periphery of the active region (the p-type diffusion region P) where the capacitor-doped capacitor is formed, a device isolation portion SS is formed by STI, and is not connected to the terrace insulating film SL formed in the active region.

The capacitor-doped capacitor is covered with an interlayer insulating film Liso. In this interlayer insulating film Liso, a plurality of contact holes CT are formed. Via plugs PL buried in the plurality of contact holes CT, a wiring layer ML is electrically connected to the gate electrode G (the upper electrode UE), the n-type diffusion region N, the p-type diffusion region P, and others.

As such, by configuring the terrace insulating film SL to be formed in the active region by LOCOS in the capacitor-doped capacitor according to the seventh embodiment, a lowering in capacitance breakdown voltage can be prevented. Furthermore, by forming the device isolation portion SS by STI via the p-type diffusion region P in the periphery of the active region where the capacitor-doped capacitor is formed (outside the p-type diffusion region P) to isolate the terrace insulating film SL and the device isolation portion SS from each other, a decrease in degree of reliability of the capacitor-doped capacitor due to a crystal defect caused by the structure of STI can be prevented.

Eighth Embodiment

The structure of an npn bipolar-type high-withstand voltage ESD (electrostatic breakdown) protective element according to an eighth embodiment is described using FIGS.

45 to 47. FIG. 45 is a plan view of main parts of the npn bipolar-type high-withstand voltage ESD (electrostatic breakdown) protective element, FIG. 46 is a cross-sectional view of main parts taken along a VIIIa-VIIIa line in FIG. 45, and FIG. 47 is a cross-sectional view of main parts taken along a VIIIb-VIIIb line in FIG. 45.

The npn bipolar-type high-withstand voltage ESD (electrostatic breakdown) protective element has a structure in which an n-type diffusion region with a high concentration formed on a main surface of an n-type epitaxial layer is taken as an emitter and a p-type well surrounding a periphery (side portion and bottom portion) of this n-type diffusion region is taken as a base.

As illustrated in FIGS. 45 to 47, the npn bipolar-type high-withstand voltage ESD (electrostatic breakdown) protective element is formed on an n-type epitaxial layer NEpi formed via an n-type buried layer NBL on a main surface of a substrate SUB. A n-type diffusion region N configuring an emitter E is placed at a center part, and a p-type well HPW configuring a base B is formed so as to surround a periphery (side portion and bottom portion) of this n-type diffusion region N. On the p-type well HPW, a p-type diffusion region P having a concentration higher than that of the p-type well HPW is formed. This p-type diffusion region P is used as a connection part to a wiring layer ML.

On the n-type epitaxial layer NEpi between the p-type well HPW and the n-type buried layer NBL, an n-type diffusion region ESDN having a concentration higher than that of the n-type epitaxial layer NEpi is partially formed. This n-type diffusion region ESDN is provided to adjust a trigger voltage of the protective element to be higher than or equal to a rated voltage of an output pin and lower than or equal to a breakdown voltage of an inner element.

On a main surface of the n-type epitaxial layer NEpi in a periphery of the p-type well HPW, a terrace insulating film SL is formed by LOCOS.

Furthermore, in a periphery of the terrace insulating film SL, an n-type well NW configuring a collector C is formed. On the n-type well NW, the n-type diffusion region N having a concentration higher than that of the n-type well NW is formed. This n-type diffusion region N is used as a connection part to the wiring layer ML. Also, on the n-type epitaxial layer NEpi between the n-type well NW and the n-type buried layer NBL, the n-type diffusion region ESDN is partially formed. This n-type diffusion region ESDN is provided to decrease a resistance of a collector lifting part.

Still further, a gate electrode G is formed on the terrace insulating film SL, making a diode-type connection with the emitter E, the base B and the gate electrode G being short-circuited as an anode electrode and the collector being taken as a cathode electrode. This gate electrode G has a function of mitigating an electric field at a junction part between the p-type well HPW and the n-type epitaxial layer NEpi when a high voltage is applied to the cathode region side. That is, with provision of the gate electrode G short-circuiting an anode region (the emitter and the base), the electric field loaded to the entire junction part between the p-type well HPW and the n-type epitaxial layer NEpi can be distributed between a curvature portion of the junction part and the junction surface part mitigated by the gate electrode G, thereby mitigating the electric field at the junction part. When the terrace insulating film SL formed by STI is provided in place of the terrace insulating film SL formed by LOCOS, the electric field loaded to the entire junction part between the p-type well HPW and the n-type epitaxial layer NEpi concentrates on the curvature portion of the junction part, thereby decreasing a junction breakdown voltage of the junction part.

As such, by configuring the terrace insulating film SL isolating the anode region (the emitter E and the base B) and the cathode region (the collector C) by LOCOS, as compared with the case in which the terrace insulating film SL is configured by STI in the npn bipolar-type high-withstand voltage ESD (electrostatic breakdown) protective element according to the eighth embodiment, the breakdown voltage of the junction part between the anode region and the cathode region can be improved. Furthermore, by forming the device isolation portion SS by STI in the periphery of the active region where the npn bipolar-type high-withstand voltage ESD (electrostatic breakdown) protective element is formed (outside the cathode region) to isolate the terrace insulating film SL and the device isolation portion SS from each other, a decrease in degree of reliability of the npn bipolar-type high-withstand voltage ESD (electrostatic breakdown) protective element due to a crystal defect caused by the structure of STI can be prevented.

While the invention made by the inventors of the present invention has been concretely described based on the embodiments in the foregoing, it is needless to say that the present invention is not limited to the foregoing embodiments and various modifications and alterations can be made within the scope of the present invention.

INDUSTRIAL APPLICABILITY

The present invention can be applied to a semiconductor device having a field effect transistor (in particular, a field effect transistor of a lateral structure (an LDMOS device)), capacitative element, diode, or the like.

The invention claimed is:

1. A semiconductor device comprising:
   a semiconductor substrate;
   a semiconductor layer formed on the semiconductor substrate and including an active region, the active region including:
      a source region; and
      a drain region formed away from the source region with a channel length;
   a first device isolation portion formed in the semiconductor layer, the first device isolation portion surrounding the active region of the semiconductor layer in a plan view;
   a first terrace insulating film formed between the source region and the drain region, the first terrace insulating film being formed on the semiconductor layer;
   a gate insulating film formed on the semiconductor layer;
   a gate electrode formed on the gate insulating film, the gate electrode being partially formed on the first terrace insulating film;
   a first buried layer of a second conductivity type different from a first conductivity type of the semiconductor substrate, the first buried layer formed in the semiconductor layer; and
   a second buried layer of the first conductivity type formed on the first buried layer; and
   a junction isolating part of the first conductivity type surrounding the first device isolation portion in the plan view, the junction isolating part reaching the second buried layer,
   wherein a thickness of the first terrace insulating film is smaller than a thickness of the first device isolation portion, wherein a cell pitch which is a distance between a center part of the source region and a center part of the drain region is shorter than 5 μm in a channel length direction, wherein, in the plan view, the source region, the drain region, the first device isolation portion, the gate electrode and the junction isolating part overlap with the first buried layer, and wherein, in the plan view, the source region, the drain region, the first device isolation portion, and the gate electrode overlap with the second buried region.

2. The semiconductor device according to claim 1, comprising:
a second device isolation portion surrounding the junction isolating part in the plan view; and
a well of the second conductivity type surrounding the second device isolation portion in the plan view, the well reaching the first buried layer.

3. The semiconductor device according to claim 1, wherein the thickness of the first terrace insulating film is 70 nm or more and 200 nm or less.

4. The semiconductor device according to claim 1, wherein the thickness of the first terrace insulating film is 70 nm or more and 200 nm or less.

5. The semiconductor device according to claim 3, wherein the thickness of the first terrace insulating film is 70 nm or more and 100 nm or less.

6. The semiconductor device according to claim 4, wherein the thickness of the first terrace insulating film is 70 nm or more and 100 nm or less.

7. The semiconductor device according to claim 3, wherein a planar shape of the first terrace insulating film is a rectangle.

8. The semiconductor device according to claim 4, wherein a planar shape of the first terrace insulating film is a rectangle.

9. The semiconductor device according to claim 3, wherein a planar shape of the first terrace insulating film is an octagon.

10. The semiconductor device according to claim 4, wherein a planar shape of the first terrace insulating film is an octagon.

11. The semiconductor device according to claim 3, comprising
an interlayer insulating film formed on the semiconductor layer so as to cover the gate electrode;
a first plug formed in the interlayer insulating film and formed on a first portion of the source region; and
a second plug formed in the interlayer insulating film and formed on a second portion of the source region,
wherein the active region includes a back-gate region surrounded by the source region in the plan view,
wherein a silicide film is formed on an upper surface of each of the back-gate region and the source region, and
wherein the first plug and the second plug are electrically connected to the back-gate region and the source region through the silicide film.

12. The semiconductor device according to claim 11, wherein the first plug overlaps with the first portion of the source region and a third portion of the back-gate region in the plan view, and
wherein the second plug overlaps with the second portion of the source region and a fourth portion of the back-gate region in the plan view.

13. The semiconductor device according to claim 11, wherein the back-gate region is located between the first portion of the source region and the second portion of the source region in the channel length direction.

14. The semiconductor device according to claim 12, wherein the back-gate region is located between the first portion of the source region and the second portion of the source region in the channel length direction.

15. The semiconductor device according to claim 1, wherein the cell pitch which is substantially 3.1 μm in the channel length direction.

16. The semiconductor device according to claim 1, comprising:
a first semiconductor region configuring an emitter, the first semiconductor region having a second conductivity type different from a first conductivity type of the semiconductor substrate;
a second semiconductor region configuring a base, the second semiconductor region surrounding the first semiconductor region, the second semiconductor region having the first conductivity type;
a third semiconductor region configuring a collector, the third semiconductor region formed away from the second semiconductor region,
a second terrace insulating film formed between the second semiconductor region and the third second semiconductor region, the second terrace insulating film formed on the semiconductor layer; and
a second device isolation portion formed in the semiconductor layer, the second device isolation portion surrounding the third semiconductor region in the plan view,
wherein a thickness of the second terrace insulating film is smaller than a thickness of the second device isolation portion.

17. A semiconductor device comprising:
a semiconductor substrate of a first conductivity type;
a semiconductor layer formed on the semiconductor substrate and including an active region, the active region including:
a back-gate region;
a source region surrounding the back-gate region in a plan view; and
a drain region surrounding the source region in the plan view,
a first device isolation portion formed in the semiconductor layer, the first device isolation portion surrounding the active region of the semiconductor layer in the plan view;
a first terrace insulating film formed between the source region and the drain region, the first terrace insulating film formed on the semiconductor layer;
a gate insulating film formed on the semiconductor layer;
a gate electrode formed on the gate insulating film, the gate electrode being partially formed on the first terrace insulating film;
an interlayer insulating film formed on the semiconductor layer so as to cover the gate electrode;
a first plug formed in the interlayer insulating film and formed on a first portion of the source region;
a second plug formed in the interlayer insulating film and formed on a second portion of the source region;
a first buried layer of a second conductivity type different from a first conductivity type of the semiconductor substrate, the first buried layer being formed in the semiconductor layer;

a second buried layer of the first conductivity type formed on the first buried layer; and a junction isolating part of the first conductivity type surrounding the first device isolation portion in the plan view, the junction isolating part reaching the second buried layer, wherein a thickness of the first terrace insulating film is smaller than a thickness of the first device isolation portion, wherein a cell pitch which is a distance between a center part of the source region and a center part of the drain region is shorter than 5 µm in a channel length direction, wherein, in the plan view, the back-gate region, the source region, the drain region, the first device isolation portion, the gate electrode and the junction isolating part overlap with the first buried layer, and wherein, in the plan view, the back-gate region, the source region, the drain region, the first device isolation portion, and the gate electrode overlap with the second buried region.

18. The semiconductor device according to claim 17, comprising:

a second device isolation portion surrounding the junction isolating part in the plan view; and a well of the second conductivity type surrounding the second device isolation portion in the plan view, the well reaching the first buried layer.

19. The semiconductor device according to claim 17, wherein the thickness of the first terrace insulating film is 70 nm or more and 200 nm or less.

20. The semiconductor device according to claim 19, wherein the thickness of the first terrace insulating film is 70 nm or more and 100 nm or less.

21. The semiconductor device according to claim 19, wherein a planar shape of the first terrace insulating film is a rectangle.

22. The semiconductor device according to claim 19, wherein a planar shape of the first terrace insulating film is an octagon.

23. The semiconductor device according to claim 17, comprising a silicide film formed on an upper surface of each of the back-gate region and the source region, wherein the first plug and the second plug are electrically connected to the back-gate region and the source region through the silicide film.

24. The semiconductor device according to claim 17, wherein the first plug overlaps with the first portion of the source region and a third portion of the back-gate region in the plan view, and wherein the second plug overlaps with the second portion of the source region and a fourth portion of the back-gate region in the plan view.

25. The semiconductor device according to claim 17, wherein the back-gate region is located between the first portion of the source region and the second portion of the source region in the channel length direction.

26. The semiconductor device according to claim 17, wherein the cell pitch is substantially 3.1 µm in the channel length direction.

27. The semiconductor device according to claim 17, comprising:

a first semiconductor region configuring an emitter, the first semiconductor region having a second conductivity type different from a first conductivity type of the semiconductor substrate;

a second semiconductor region configuring a base, the second semiconductor region surrounding the first semiconductor region, the second semiconductor region having the first conductivity type;

a third semiconductor region configuring a collector, the third semiconductor region formed away from the second semiconductor region, a second terrace insulating film formed between the second semiconductor region and the third second semiconductor region, the second terrace insulating film formed on the semiconductor layer; and a second device isolation portion formed in the semiconductor layer, the second device isolation portion surrounding the third semiconductor region in the plan view, wherein a thickness of the second terrace insulating film is smaller than a thickness of the second device isolation portion.

* * * * *